United States Patent [19]
Kirchner et al.

[11] Patent Number: 5,811,820
[45] Date of Patent: Sep. 22, 1998

[54] PARALLEL ION OPTICS AND APPARATUS FOR HIGH CURRENT LOW ENERGY ION BEAMS

[75] Inventors: Nicholas J. Kirchner; Felix G. Gutman, both of San Jose; Oleg V. Alexandrov, Walnut Creek; Efim A. Dynin, Fremont, all of Calif.

[73] Assignee: Massively Parallel Instruments, Inc., San Jose, Calif.

[21] Appl. No.: 662,336

[22] Filed: Jun. 12, 1996

Related U.S. Application Data

[60] Provisional application No. 60/000,860 Jun. 13, 1995.
[51] Int. Cl.⁶ .......................... G01N 21/01; H01J 27/00; B01D 59/44; C23C 14/00
[52] U.S. Cl. ................................ 250/432 R; 250/423 R; 250/492.21; 250/281; 250/283; 427/523; 118/723 FI
[58] Field of Search .................................... 250/281, 283, 250/492.21, 423 R; 427/523; 118/723 FI

[56] References Cited

U.S. PATENT DOCUMENTS

| | | | |
|---|---|---|---|
| 3,847,115 | 11/1974 | Tashbar | 118/49.1 |
| 4,901,667 | 2/1990 | Suzuki et al. | 118/719 |
| 5,284,544 | 2/1994 | Mizutani et al. | 156/345 |
| 5,423,936 | 6/1995 | Tomita et al. | 156/345 |
| 5,496,410 | 3/1996 | Fukuda et al. | 118/723 |
| 5,518,572 | 5/1996 | Kinoshita et al. | 156/345 |

*Primary Examiner*—Susan A. Loring
*Attorney, Agent, or Firm*—Townsend and Townsend and Crew LLP

[57] ABSTRACT

A device for the parallel processing of ions is provided. The device may be utilized for thin film deposition or ion implantation and may include the following: an ion source, ion capture and storage ion optics, mass selection ion optics, neutral trapping elements, extraction ion optics, beam neutralization mechanisms, and a substrate on which deposition and thin film growth occurs is provided. Ions are captured and stored within a closely packed array of parallel ion conducting channels. The ion conducting channels transport high current low energy ions from the ion source to irradiate the substrate target. During transport, ion species can be mass selected, merged with ions from multiple sources, and undergo gas phase charge exchange ion molecule reactions. Additionally, neutrals from the ion source, ion-molecule reaction reagent gases, residual background gas, or neutralization of ions may be eliminated from the processing stream by turbo pumping, cryo pumping, and cryocondensation on some of the ion optic elements. Different types of ion optic elements, including elements which are parallel or perpendicular to the ion path, and neutral trapping elements may be combined in different ways to achieve thin film ion deposition over a large homogenous substrate surface.

64 Claims, 38 Drawing Sheets

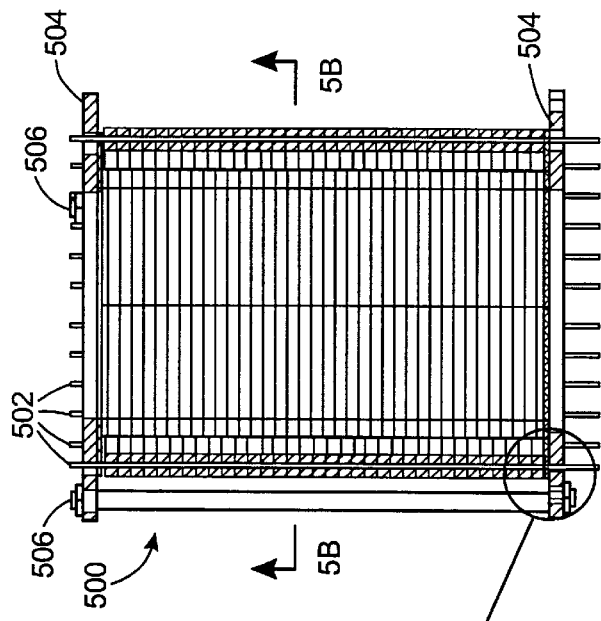
FIG. 5A
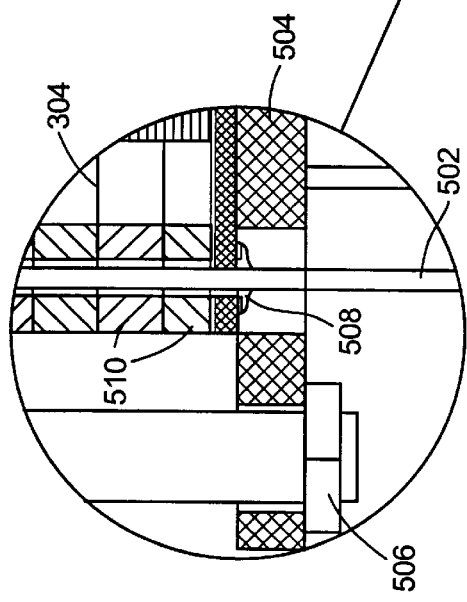
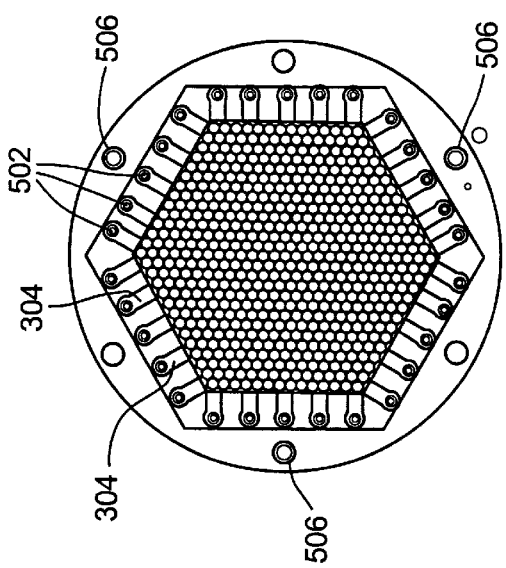
FIG. 5B

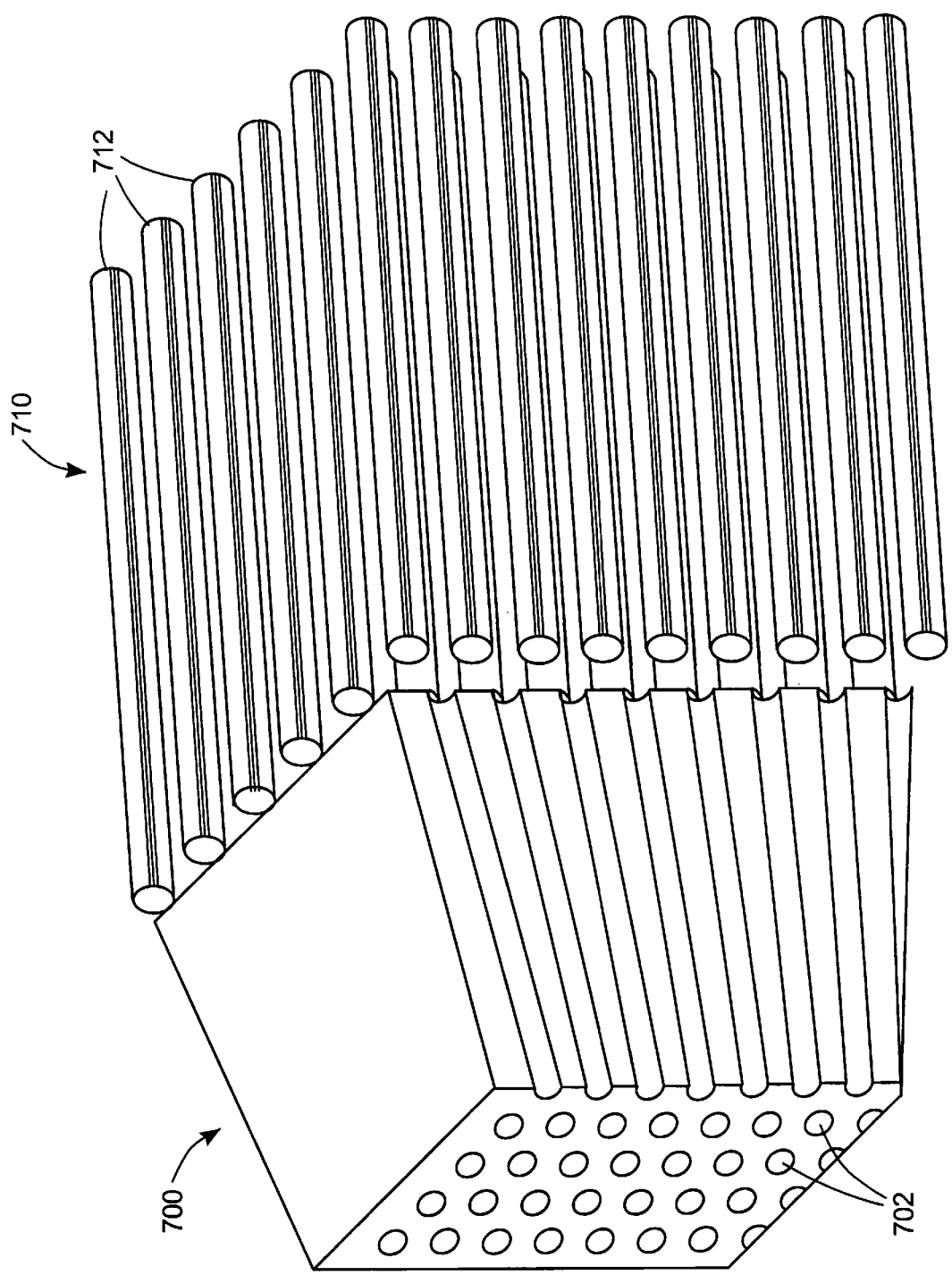

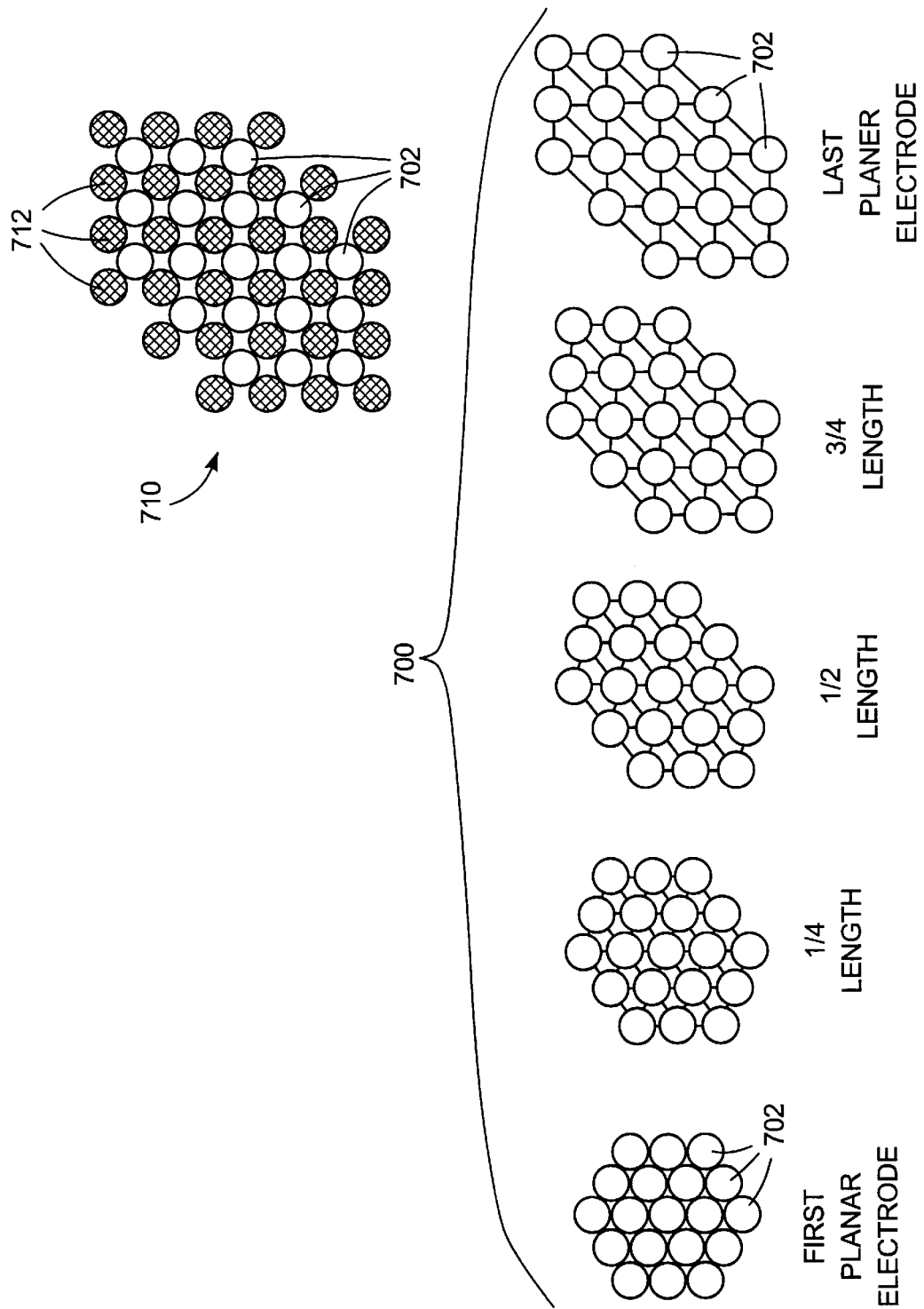

QUADRUPOLE

QUADRUPOLE ARRAY

He⁺ + CO ---> C⁺(2Pu) + O(4S) + He

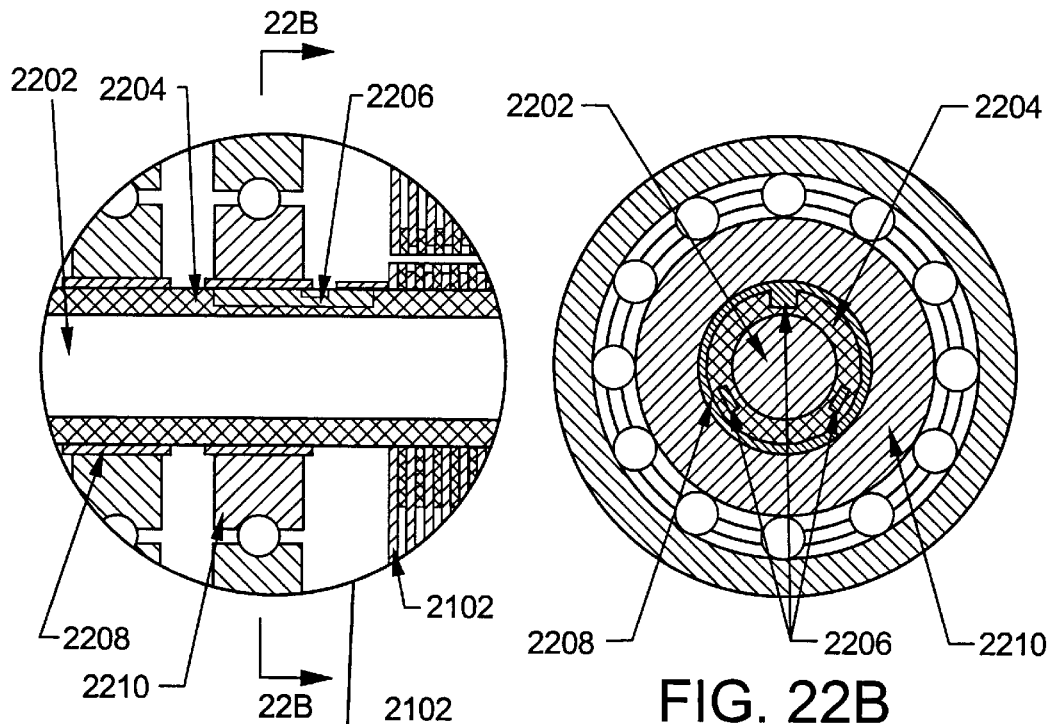
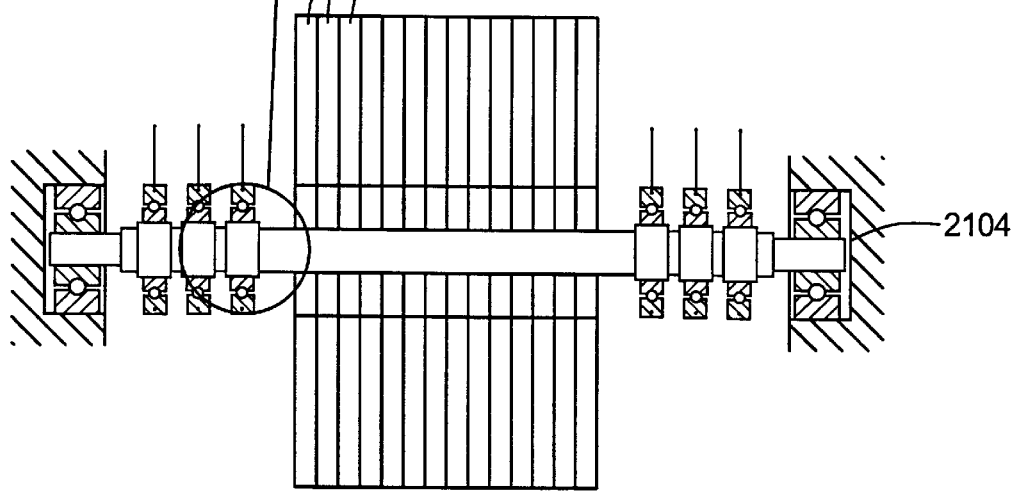
FIG. 22A

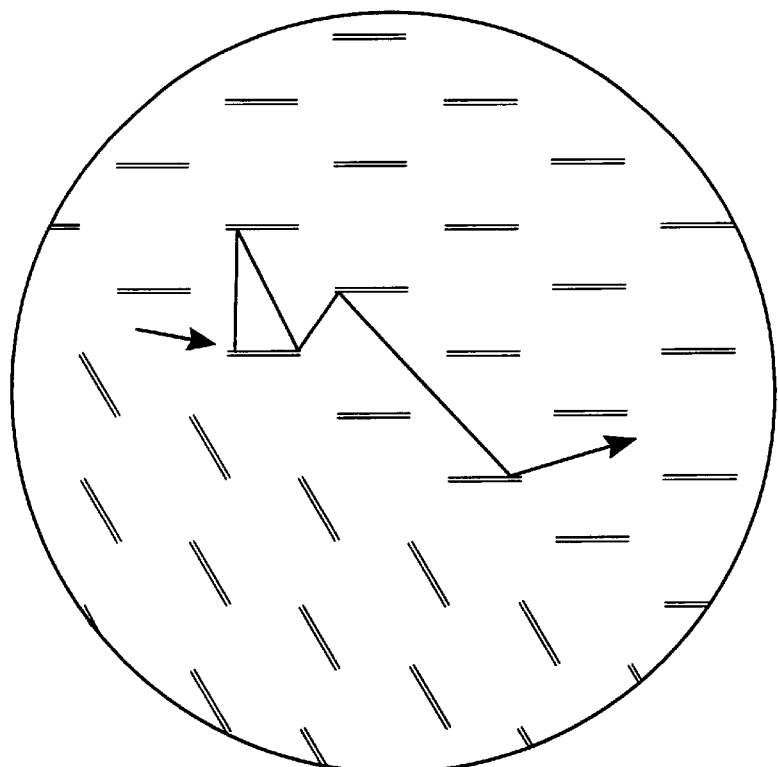
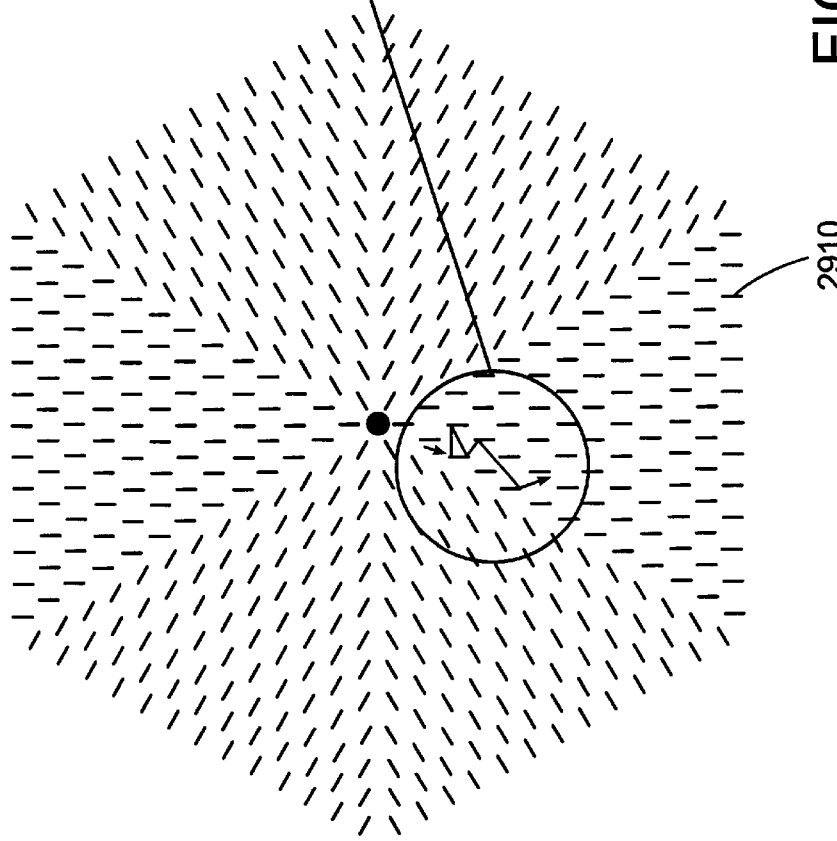
FIG. 25B

PARALLEL ION OPTICS AND APPARATUS FOR HIGH CURRENT LOW ENERGY ION BEAMS

This application claims benefit under USC Provisional application Ser. No. 60/000,860, filed Jun. 13, 1995.

BACKGROUND OF THE INVENTION

The present invention relates generally to the field of parallel ion optics and, more particularly, to parallel ion processing systems for ion beam deposition and implantation on very large area surfaces.

Ion assisted surface processing of electronic materials plays a substantial role in the modern semiconductor manufacturing infrastructure. Ions are used to selectively etch and clean large area surfaces, change electrical conductivity, and as an energy carriers to initiate reactions between a surface and adsorbed neutrals. Additionally, ions themselves can be the reactive species, either alone or with other neutral deposited species.

Ion beam deposition typically involves the process of manipulation of source ions such that the ions have relevant energy to be deposited on a substrate. The technical significance of ion beam deposition is that it allows energy to be transferred to the surface in a more controllable manner than other methods, such as thermal or photon irradiation. By controlling the translational energy (also referred to as kinetic energy) of the ions, very fine control is attained over the amount of energy available to a number of important processes occurring at the surface of the substrate. Ultimately, this energy goes into making or breaking chemical bonds at the surface without necessarily destroying the existing chemical structure of the underlying material.

For more than 20 years, low energy ion beams have been used to fabricate unique and novel thin film materials with remarkable and innovative properties (see, e.g., S. Aisenberg et al., Materials Science Forum, 52 & 53 1 (1989)). Very recent work on the ion beam deposition has produced such materials as diamond films, metastable compounds of nitrogen (carbon and boron nitrides) and the ultra thin aluminum/silicon (Al/Si) multilayers, just to name a few. The application of these and similar thin films are huge, including semiconductive diamond-based electronics, hard optical coatings, insulators, conductors, abrasives and lubricants. In fact, thin films have become an industry in themselves.

Many techniques are known for the fabrication of thin films. These techniques represent a spectrum ranging from relatively popular and crude plasma techniques (e.g., CVD, PVD and laser ablation), to ion assisted and filtered ion beam methods, and finally to the precise mass selected ion beam methods. As enumerated, these methods represent a continuum over which the degree of control goes from poor to good, while at the same time present applicability to large scale manufacture goes from good to poor.

In plasma techniques, low energy ions continually bombard the surface. The plasma is driven by electric fields and are confined by the surfaces in contact with the field. The parameters of ion species, ion flux and ion energy are poorly controlled, but in many cases plasma processing currently offers the only accessible method to high-volume fabrication of large-area substrates.

In ion assisted processes generally, a non-mass selected beam from a specific ion source is either directed to a surface or merged with a gas to process the surface by etching, cleaning, sputtering or deposition. In ion filtered beam methods specifically, charged species are separated from neutral particles which commonly emanate from the source of ions. For example, carbon ions may be magnetically dispersed from a carbon arc source or from a laser ablation source.

Mass selected ion beam methods represent a high degree of refinement, particularly where a high degree of control over the growing substrate must be exercised in terms of energy, atomic species, and relative ratios. Ion beams can be created with narrow energy distributions and mass specificity, all in the absence of extraneous contaminating species, whether charged, neutral and with varying degrees of internal energy. Beam parameters such as intensity, ion mass, ion kinetic energy, ion internal energy, and also arrival rate and angle at the surface can be controlled independently over a wide range of conditions. In stark contrast, plasma technique bombardment conditions are not well defined, with control being exerted only indirectly through multiple parameters of plasma power, gas pressure, gas composition, flow rates and system geometry. In addition, because of the high pressure (>1 torr) of plasma techniques, the quality of the film is governed by a dynamic competition between contaminants and growth species.

The critical mechanism by which mass selected ion beam deposition achieves its superiority over other thin film deposition methods is that an ion beam is able to deliver high energy ions to a surface to produce a chemical reaction, diffusion, atomic surface mobility and/or crystallization. These reactions occur at a much lower bulk temperature than conventional thermal processes. For example, it has been shown that in the synthesis of diamond-like carbon films by C+ deposition (100 eV beam at 1 mA/cm$^2$), the effective power density pumped into the film is on the order of 1 million watts per cm$^3$ (see S. Aisenberg et al.).

At any given moment, the energy deposited by the impacting ion is highly localized at the surface, making that energy available for the breaking or formation of chemical bonds. The chemical bond breaking/making act is rapid and does not require energy to remain localized for long periods of time. Fortunately, excess energy is rapidly dissipated away from the localized site through the excitation of the underlying lattice. This rapid energy dissipation prevents destruction of the underlying surface structure. Thus, the energy of an impinging ion beam can cause reactions useful for film deposition without requiring excessive temperatures. By controlling the ion energy, direct control of the energy available for film growth is achievable.

In contrast, thermal excitation requires that the bulk be heated to a temperature which easily enables the driving of the surface chemistry. However, at these temperatures, both desirable and undesirable chemical reactions are usually in thermodynamic equilibrium. Special conditions must be found which permit the desirable reaction to dominate the undesirable one which reduces the formation of defects. In many commercial applications of thermal excitation, the competition between desirable and undesirable reactions presents a compromise. For many other potential applications, the commercial fabrication of a film is precluded because the extent of defects permitted by thermodynamic equilibrium is too great.

Nevertheless, CVD, PVD and laser ablation methods have found widespread application in industrial synthesis and have increased the speed by which thin films can be produced. Many commercially produced thin films have applications which are not sensitive to the level or type of contaminants present in higher pressure deposition methods. However, many of the thin films which can only be produced by ion beam methods are presently not being commercialized because of the lack of reliable manufacturing methods to rapidly and economically produce these thin films.

Therefore, what is needed are systems and methods for mass selected ion beam thin film deposition and ion implantation that provide the following:

1) Transport of high current beams at low energies from ion source to target without beam dispersion;
2) Preclusion of unwanted neutral particles from contacting the deposition region;
3) Control of the ion beam mass constituents by mass selection (either contiguous or non-contiguous);
4) Control of the relative ratios of mass selected ions;
5) Control of the ion energy, both kinetic and internal, of these ions;
6) Generation of a homogenous distribution of mass selected ions over surfaces areas greater than may be presently attained with mass selected ion beam techniques;
7) Generation of a uniform distribution of mass selected ions over commercially significant surfaces areas (e.g., 12" semiconductor wafers and more); and
8) Flexible methods for the practical synthesis of advanced materials.

SUMMARY OF THE INVENTION

The present invention provides systems and methods for parallel processing of mass selected ion beams which may be utilized for thin film deposition and ion implantation. The present invention utilizes an ion processing unit that provides multiple parallel ion conducting channels (or ion channels). The ion processing unit includes planar electrode sheets having holes therethrough which define the ion conducting channels. The electrode sheets are stacked or placed side-by-side with insulating spacers isolating adjacent electrode sheets. Varying Rf voltages may be applied to the electrode sheets to generate inhomogeneous RF fields for manipulating ions in the ion conducting channels.

In one embodiment, a method of irradiating a substrate surface with ions (e.g., for thin film or ion implantation) comprises the steps of: introducing a gas sample into an ion source, ionizing the gas to produce ions, directing the ions into ion conducting channels of an ion processing unit, removing undesirable ion species from the ions in the ion conducting channels, and directing the ions in the ion conducting channels to the substrate surface with sufficient energy to deposit the ions on the substrate. A mixture of different ion species or isotopes of one chemical element can be easily deposited by introducing a mixture of the materials containing desired elements into the ion source. This technique is useful for doping and depositing at doses unavailable by other methods of growing solids (e.g., deposition of n-type diamond).

The energy of the ion beams near the surface of the substrate should be high enough to create a coating, but low enough that it does not damage the deposited film or the substrate surface. However, ion beams with sufficiently high energy may be used for etching the surface of a substrate, smoothing or growing layer surfaces, and for the ion implantation of a target, substrate, or of the grown film. Additionally, the present invention allows films to be grown layer by layer into multi-layered structures which consist of films with different physical properties (e.g., different types of conductivity) and thicknesses.

An aspect of the present invention is to provide improved insulating spacers between electrode sheets in an ion processing unit. In one embodiment, the insulating spacers are individual perforated sheets which include openings corresponding to the ion conducting channels in the ion processing unit. In another embodiment, the insulating spacers are individual spacer elements or tabs that are clad to the electrode sheets between ion conducting channels in the ion processing unit.

Another aspect of the present invention is to make an ion processing unit that is blind to line of sight neutrals, scattered ions, photons and electrons. The ion conducting channels in the ion processing unit are curved which allows neutrals and other undesirable particles to be removed from the ion channels. Typically, many of the undesirable particles are removed by a pumping mechanism.

Yet another aspect of the present invention is to provide an ion processing unit that functions as an adapter between two different packing patterns. To accomplish this, the packing pattern of the electrode sheets at each end of the ion processing unit are different, with the internal electrode sheets providing a smooth transition between the two packing patterns. For example, the ion conducting unit may provide a transition from a hexagonal packing pattern to a rectangular packing pattern. Additionally, the ion processing unit may provide a transition from more densely packed ion conducting channels to less densely packed ion conducting channels.

Another aspect of the present invention is to provide gating or lensing of individual and groups of the N fold ion conducting channels in an ion processing unit. Gating or lensing is provided by an electrode sheet that includes plated through holes that correspond to ion conducting channels. When different electric voltages are applied to a plated through hole, the plated through hole may act as a gate to pass or block ions. Alternatively, the plated through hole may act as a lens to focus an ion beam. In one embodiment, the electrode sheet is composed of a mutltilayer printed circuit board where the multiple layers provide electrical connection to plated through holes in the board.

Yet another aspect of the present invention is to provide merging and splitting of ion conduction channels in the ion processing unit. Multiple holes in one electrode sheet may open into a single larger hole on an adjacent electrode sheet. Depending on which way the ions are travelling through the ion processing unit, the junction between the two adjacent electrode sheets will merge or split the ion beams in the ion conducting channels.

A further aspect of the present invention is to provide gas and photon optical manifolds for an ion processing unit. A gas manifold is capable of introducing gases into the ion conducting channels of the ion processing unit at a constant pressure. A photon optical manifold allows photons emitted by ion species in the ion conducting channels to exit the ion processing unit and be collected or measured.

An aspect of the present invention is to provide depletion of neutral species by utilizing angular momentum. An ion processing unit is rotated at a relatively high speed around an axis parallel to the ion conduction channels. Typically, the planar electrode sheets comprising the ion processing unit are mounted on a shaft which rotates. During a collision, angular momentum of the ion processing unit is transferred to tangential velocity of the neutral allowing for effective removal of neutral gas from the ion processing unit.

Another aspect of the present invention utilizes cryocondensation to remove undesirable particles. At least a portion of the ion processing unit is lowered to cryogenic temperatures (e.g., 20 K) by cryo heads. When undesirable particles impact the ion processing unit (e.g., wall of an ion conducting channel), the particles condense on the ion processing unit. Periodically, the ion processing unit may be thermally cycled to remove the build-up of condensed particles.

Other features and advantages of the present invention will become readily apparent upon a perusal of the following description and drawings.

BRIEF DESCRIPTION OF THE DRAWINGS

FIG. 5 shows an ion processing unit with stacked planar electrode sheets and insulting spacers;

FIG. 7A shows an ion processing unit having graduated packing patterns and FIG. 7B shows a cross-sectional view of the ion processing unit of FIG. 7A;

FIG. 22 illustrates a central shaft that supports the electrode sheets and allows application of electric voltages in the ion processing unit of FIG. 21A and 21B;

FIG. 25A shows an electrode sheet in a configuration to aid particle escape and FIG. 25B shows the trajectory of a particle as it exits the ion processing unit;

DESCRIPTION OF THE PREFERRED EMBODIMENT TABLE OF CONTENTS

Figure 1:
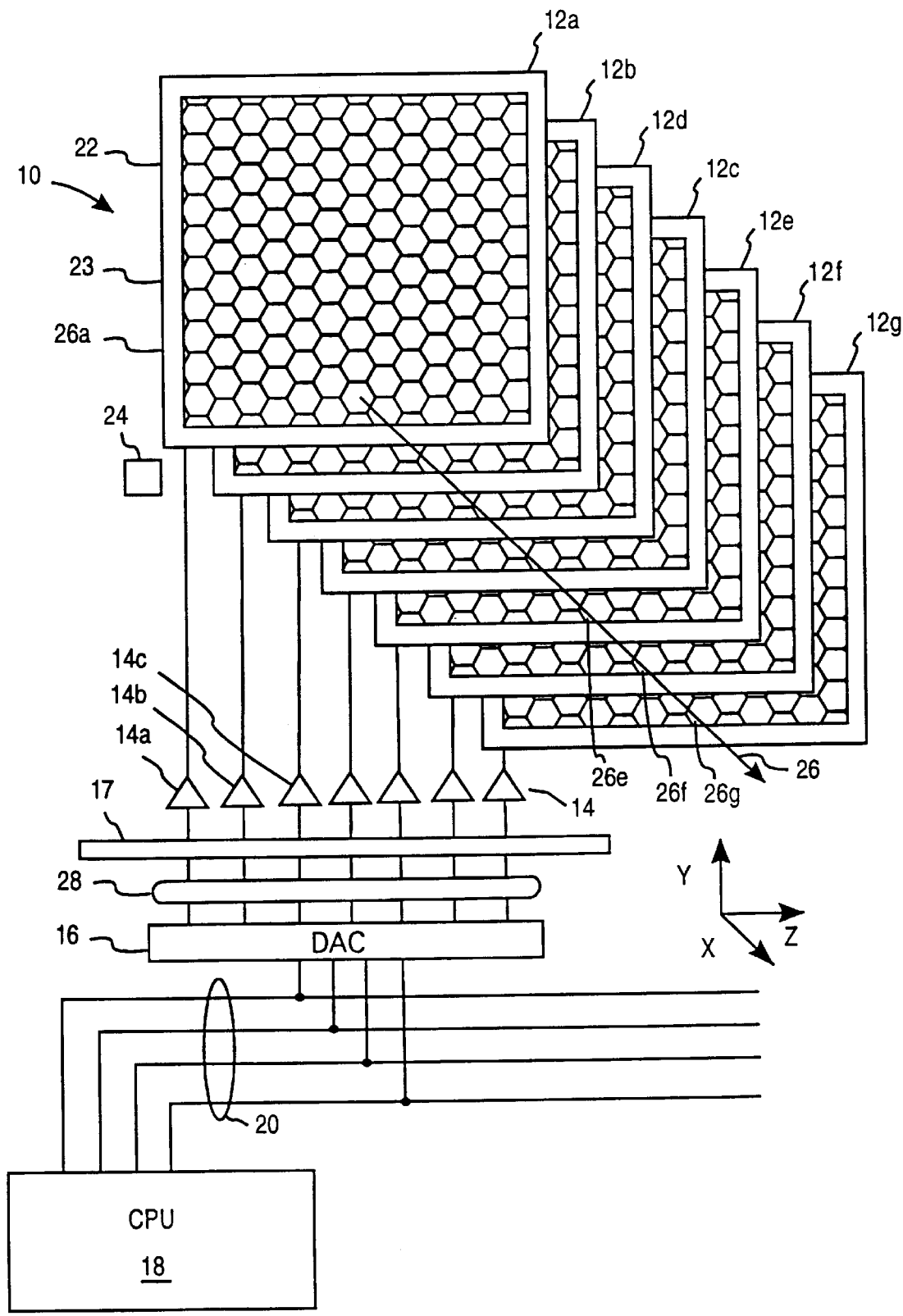
FIG. 1 shows an exploded view of a prior art ion processing unit.

I. Introduction
II. Ion Processing Components
  A. Electrode Sheets and Spacers
  B. Curved Channels
  C. Packing Patterns
  D. Gating and Lensing of Ion Conducting Channels
  E. Merging and Splitting of Channels
  F. Gas and Photon Optical Manifolds
  G. Quadrupole Array
  H. Rf Electronic Drive Components
III. Ion Sources
  A. External Ion Sources
  B. Integral Ion Sources
IV. Ion Processing
V. Neutral Gas Pumping and Trapping
  A. Angular Momentum Assisted Diffusion
  B. Cryocondensation
VI. Thin Film Ion Deposition and Ion Implantation I. Introduction FIG. 1 shows an exploded view of a prior art ion processing unit. An ion processing unit 10 includes a series of electrode sheets 12a–12g arranged longitudinally along the x-axis, separated by spacers 24. Each electrode sheet connects to high voltage amplifiers 14a, 14b, etc., which form an array 14 of independently operable amplifiers. A programmable digital-to-analog converter (or DAC) array 16 governs the operation of the amplifiers 14 and receives program signals from a central processing unit 18 along a data bus 20. Central processing unit 18 thereby has complete control over the applied voltages at each electrode plane, enabling rapid and accurate changes in the effective potential fields experienced by charged particles traveling through the ion processing unit.

Each planar electrode sheet comprises a mesh of thin metal, arranged in an array of hexagonally shaped holes 22. Hexagons are self-packing polygons having the greatest area-to-perimeter ratio. The electrode sheets are fixed taut in a supporting frame 23, while each electrode sheet is stacked on the next sheet, separated by small ceramic spacers 24. The planar electrode sheets are stacked such that successive holes in each sheet align with each other to form hexagonal processing channels 26. One such channel 26 is shown by the highlighted respective hexagonal holes 26a, etc. A vacuum enclosure surrounds the array with a base of the vacuum housing 17 serving as a heat sink for the array. The control signals for the amplifiers travel through a shielded bus 28 driven by DAC array 16, which in turn is driven from signal carried by dedicated bus 20 and generated by the central processing unit 18.

The ion processing unit shown in FIG. 1 is described in more detail in U.S. Pat. No. 5,206,506, issued Apr. 27, 1993 to Nicholas J. Kirchner, and is hereby incorporated by reference for all purposes. Although the ion processing unit provides properties including ion capture and transport, the present invention provides systems and methods for thin film deposition and ion implantation over relatively large areas utilizing an ion processing unit. Additionally, the present invention provides improved ion optics including line of sight particle elimination, change in packing patterns, ion conducting channel gates and lenses, channel merging and splitting, gas and photon optical manifolds, ion source elements, neutral pumping or trapping, and mass selection by interfacing with a multipole array.

In the description that follows, many of the features of the present invention will be described in reference to thin film deposition. Thin film deposition is an important practical application for the present technology. However, references to thin film deposition are for illustration and not limitation. Those skilled in the art will recognize that the present invention may be applied in various applications including mass spectrometry, ion implantation, and wafer cleaning by ion bombardment.

The present invention will be described using a building up principal—meaning individual components will be described and then these components will be shown within larger units. In addition to this being a logical way to describe the present invention, it will also illustrate that the individual components may be assembled in different ways to perform different complex functions. Thus, the individual components may be utilized alone or in combination with other components depending on the application.

II. Ion Processing Components

Figure 2:
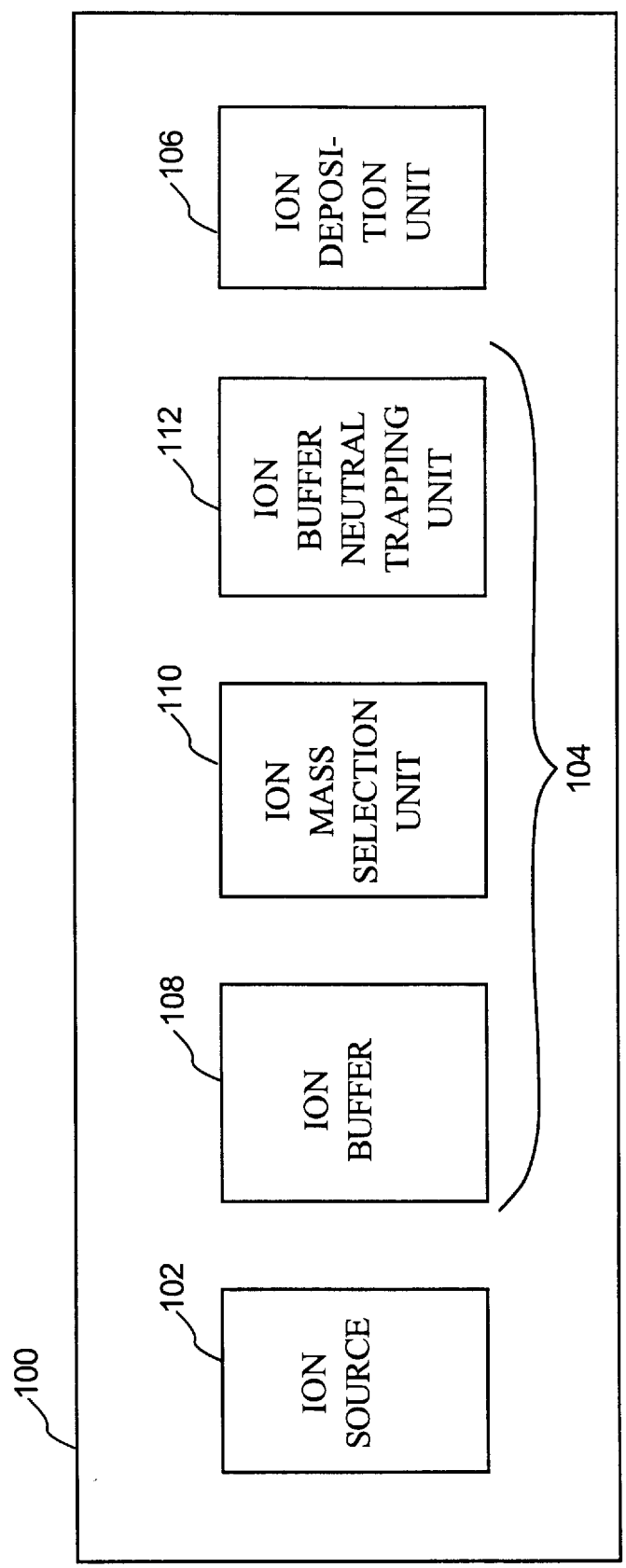
FIG. 2 shows the major components of a thin film ion deposition apparatus.

FIG. 2 shows the major components of a thin film ion deposition apparatus according to the present invention. A thin film deposition apparatus 100 includes an ion source 102, an ion beam processing unit 104, and an ion deposition unit 106. The ion beam processing unit includes an ion buffer 108, an ion mass selection unit 110, and an ion buffer neutral trapping unit 112. The thin film deposition apparatus is typically housed in a vacuum chamber which, depending on the configuration, is differentially pumped as aided by the pumping and trapping characteristics of ion optic elements in the ion beam processing unit.

Many different configurations for ion source 102 are possible. In one configuration, a conventional wide beam ion source is utilized from which the plasma or ions are captured by ion buffer 108. Examples of a wide beam ion source are described in the Proceedings of the 5th International Conference on Ion Sources, Rev. Sci. Instrum., Part II, 65 1039 to 1482 (1994) which is hereby incorporated by reference for all purposes. In another configuration, individual ion sources are aligned with each ion conducting channel in the ion processing unit.

Ions or charged particles, captured by or formed in the individual ion conducting channels of the ion processing unit are transported and simultaneously processed before extraction and deposition as a thin film on the target substrate. Processing in this sense means controllably changing the characteristics of the ion beam. For example, the mass composition of the ion beam may be changed as in the simultaneous mass selection of $C^+$ and $P^+$ ions from a beam of many ions.

The electrodes of the ion processing unit define individual ion conducting channels and are comprised of either planar electrode sheets perpendicular to the axis of the channels axis and/or of a multipole array with electrodes parallel to the axis of the channels. The electrodes are a part of ion optic elements which take on other functional properties necessary to achieve thin film deposition over large areas. For example, neutral atoms and molecules should be effectively removed from the ion beams in a relatively short distance. To achieve this, the ion optic elements should aid, both directly and indirectly, in the pumping and trapping of these species.

In some circumstances, the ion optics serve as distribution manifolds for gasses. Ion optic elements may also include ion gates or switches that allow for one ion channel to split into multiple channels, multiple ion channels to merge, or an ion channel to change overall dimensions. Therefore, the ion optic elements not only include electrodes that define the ion conducting channels in which ions are manipulated and processed, but also may change the relative spatial location of the ion channels as the ion channels proceed from the ion source to the deposition unit.

For thin film deposition, the ions exiting from the ion processing unit should be accelerated or decelerated to the desired kinetic energy, angle adjusted, and possibly neutralized. Preferably, the ion beams exiting the ion processing unit are as free as possible from background particles. The ion beams may deposit the energy at a controlled angle to the substrate before ion-ion repulsion excessively spreads the beam yet after some spreading has allowed beam mixing to occur to remove ion inhomogeneity arising from discrete channels. Ions may also be accelerated within the ion processing unit to KeV range for ion implantation.

A. Electrode Sheets and Spacers

Figure 3A:
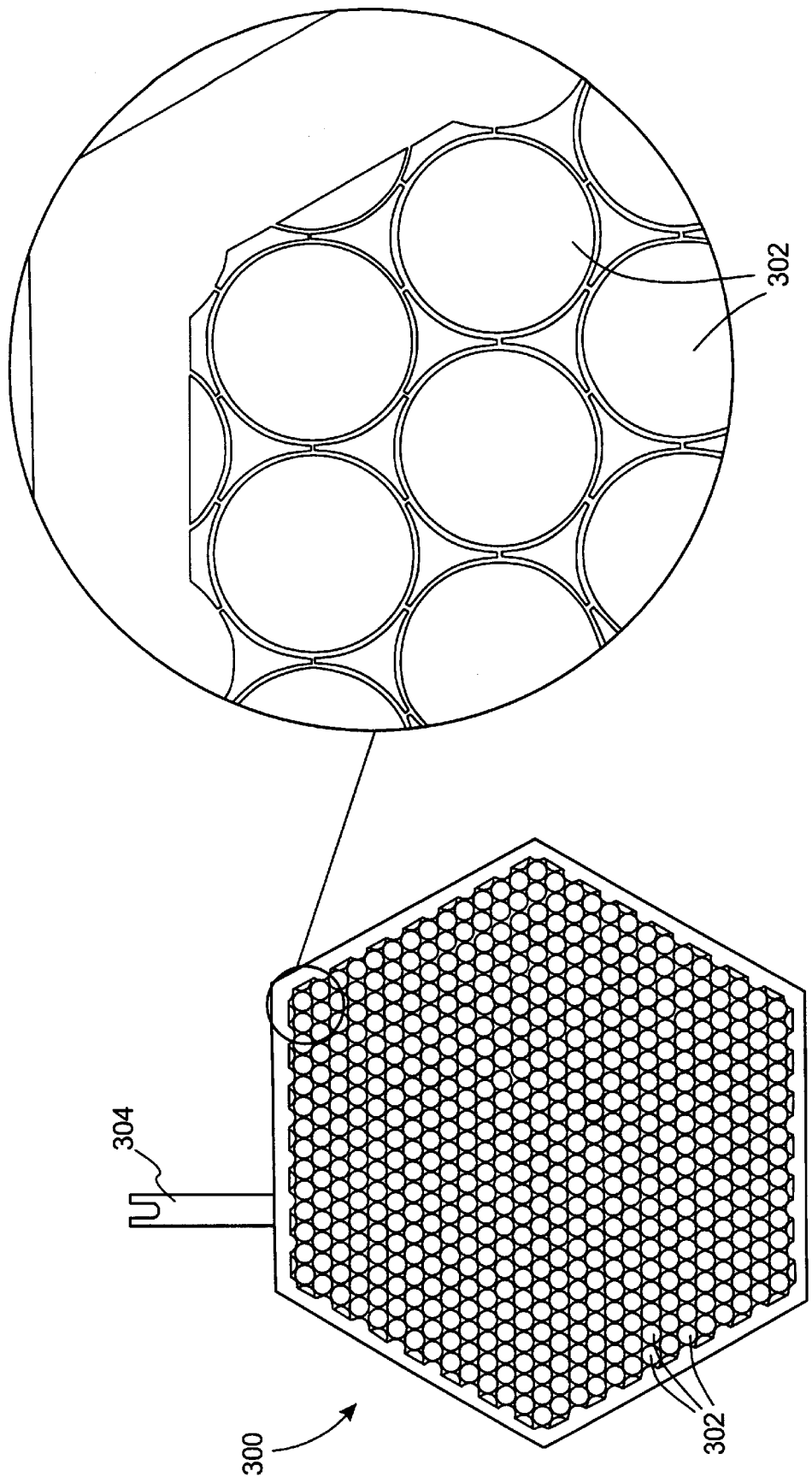
FIG. 3A shows an electrode sheet.
Figure 3B:
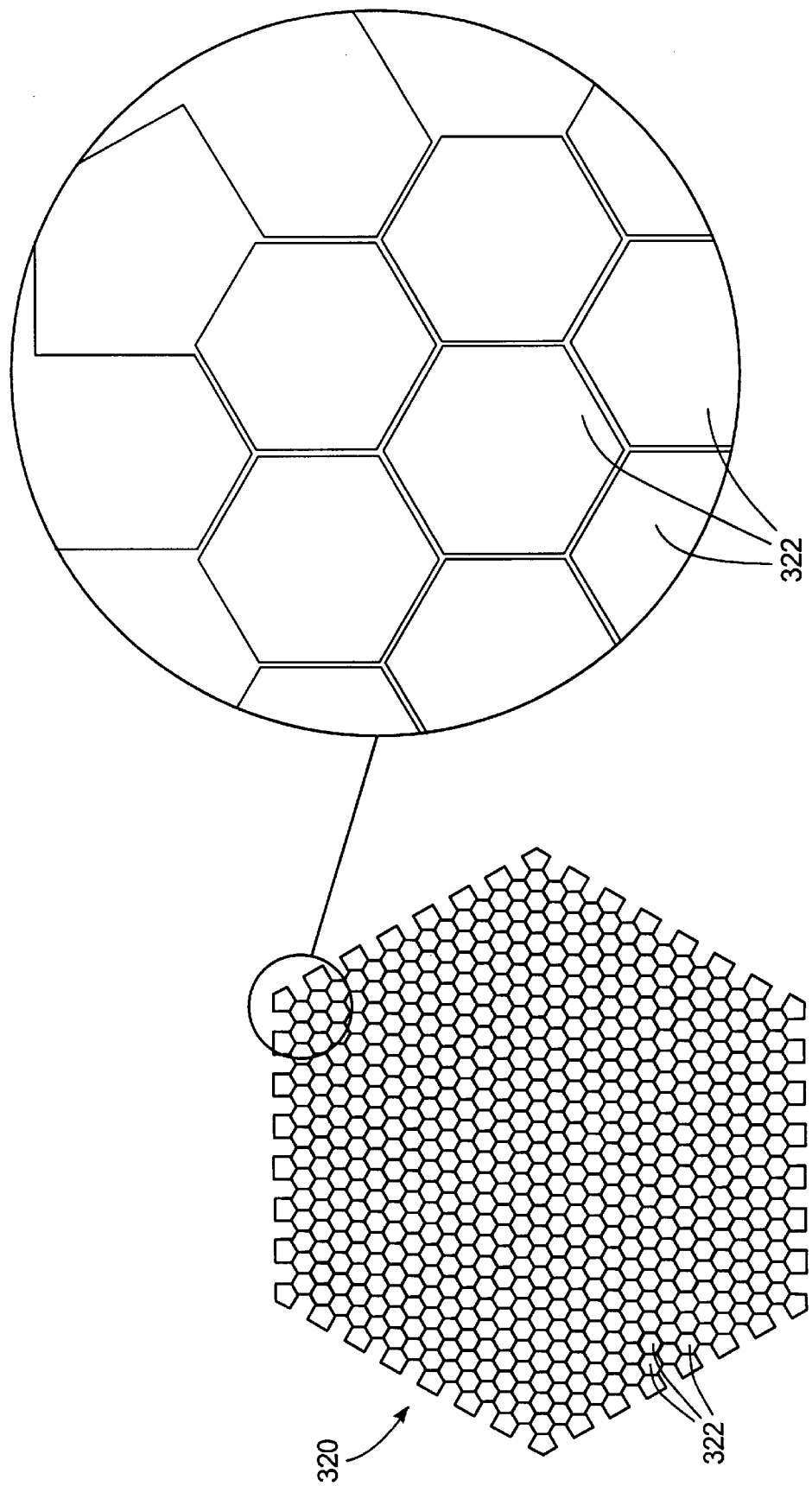
FIG. 3B shows an insulating spacer.
Figure 3C:
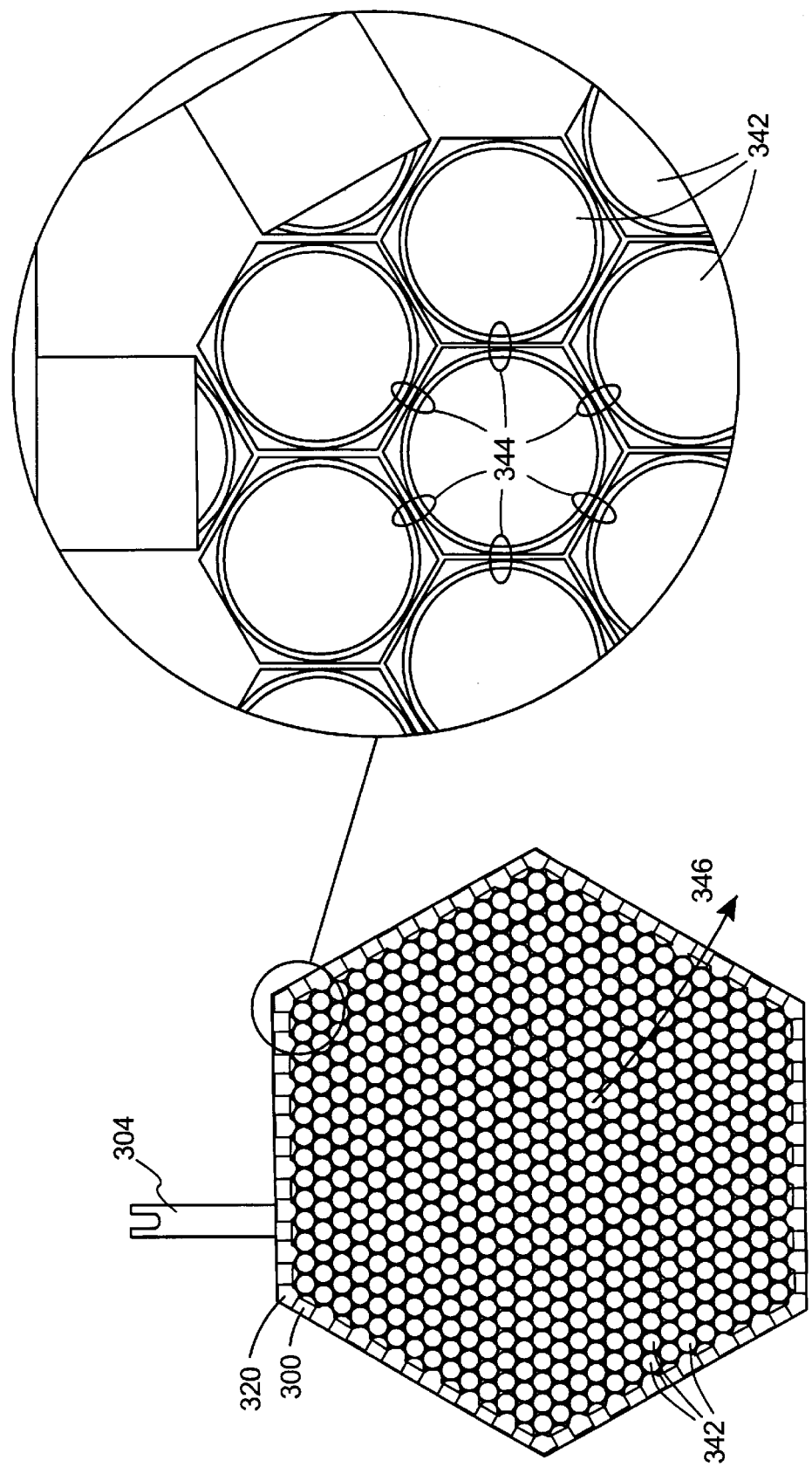
FIG. 3C shows an insulating spacer stacked on an electrode sheet.

FIGS. 3A–3C show a planar electrode sheet and an associated insulating spacer utilized in one embodiment of the present invention. FIG. 3A shows an electrode sheet 300 which may be composed of a stainless steel sheet 0.003" thick formed by chemical machining. The electrode sheet includes multiple circular openings 302. When electrode sheets are placed adjacent to one another, the circular openings align to form the walls of ion conducting channels. Electric voltages are applied to electrode sheet 300 through an extension 304. Varying Rf voltages among the electrode sheets may be utilized to create inhomogeneous Rf fields to manipulate ions in the ion conducting channels (e.g., translation or mass selection). The circular openings are shown in the hexagonal packing pattern.

FIG. 3B shows an insulating spacer that separates the electrode sheets. An insulating spacer 320 may be composed of Kapton and formed by chemical machining. The insulating spacer includes multiple hexagonal openings 322.

FIG. 3C shows an insulating spacer stacked on a planar electrode sheet. Insulating spacer 320 is stacked on electrode sheet 300. The openings in the electrode sheet and the insulating sheet are aligned to form openings 342. Each circular opening in the planar electrode sheet contacts the insulating spacer at six contact points 344. The insulating spacer is recessed away from the ion conducting channel by an aspect ratio (longest to shortest dimension) of unity to avoid charging of the insulating spacer. Charging of the insulating spacer disrupts the ion flux and may result in an uneven ion flow in one channel relative to another.

Ion conducting channels are formed by the stacking of alternating electrode sheets and insulating spacers. Because the circular openings in the electrode sheet contact the insulating spacer at only six points, the walls of the ion channels are substantially open. At the outer radial boundary, the insulating spacer is notched or checkered which also provides a substantially open radial boundary. As the ion channels are substantially open, neutrals or other undesirable particles may diffuse out of the ion channels in the radial direction. Alternately, an external reaction gas may diffuse into the ion processing unit for ion-molecule reactions with ions inside the ion conducting channels. Arrow 346 an example of radial diffusion of a neutral particle.

FIG. 4 shows another embodiment of an insulating spacer which is on a planar electrode sheet. Insulation is provided by individual insulating tabs or spacer elements 402. The insulating tabs may be composed of Kapton and attached to the planar electrode sheet at the appropriate places. Alternatively, sheets of Kapton clad stainless steel may be selectively etched together. Electrode sheet 300 is similar to the electrode sheet shown in FIG. 3A except for additional circular pieces that supports the insulating tabs. As shown, the insulating tabs allow the for substantially open diffusion of neutral or other undesirable particles out of the ion channels. In the case of charge transfer ionization, the substantially open structure allows for reaction gas external to the ion processing unit to diffuse through the device more efficiently than if each of the N fold channels were mechanically isolated from each other.

Materials for the conductive electrode sheets and insulating spacers are not limited to stainless steel and Kapton. For example, the conductive electrode sheets may be fabricated from other metals like titanium, metalized or conductive plastics, or carbon composites. Also, the insulating spacers may be fabricated from polycarbonate, Teflon, ceramics, and other materials which do not absorb in the Rf range and are compatible with the desired vacuum.

FIG. 5 shows an ion processing unit with stacked electrode sheets and insulting spacers. An ion processing unit 500 is composed of over a thousand electrode sheets is shown. Although electric voltages may be applied to each electrode sheet individually, in some applications it is satisfactory to apply the same electric voltage to every $i^{th}$ electrode sheet. In FIG. 5, the same electric voltage is applied to every $30^{th}$ electrode sheet (i.e., i=30). Conductive rods 502 are used to apply an electric voltage to the electrode sheets electrically connected to each rod. Base plates 504 are at each end of the ion processing unit.

Three bolts 506 maintain the ion processing unit by extending between the end plates. A ceramic spacer 508 insulates the conductive rods. Additionally, ceramic spacers 510 are placed between extensions 304 of every $30^{th}$ electrode sheet.

As shown in cross-section A—A, the ion conducting channels are packed in a hexagon pattern. Thirty conductive rods are place at the periphery of the ion conducting channels, five to each hexagon side. Although there are five conducting channels to a hexagon side, only three types of electrode sheets need be constructed because of the symmetry of the electrode sheets. For example, the electrode sheet shown in FIG. 3A has an extension 304. This same electrode sheet is placed at two different locations on the hexagon side by turning the electrode sheet over during construction of the ion processing unit. Therefore, only three unique electrode sheets need be constructed for connection to thirty conductive rods. Although thirty conductive rods are shown, the same techniques will reduce the number of unique electrode sheets for other numbers of conductive rods.

B. Curved Channels

When an ion processing unit is utilized to deposit thin films on a substrate, there are many possible sources of contamination. Line of sight neutrals from the ion source may be deposited on the substrate. Line of sight means the straight line through space between two points. These neutrals may be either in the ground electronic state or electronically excited. Another form of contamination is high energy scattered ions which may be ion species destabilized during mass selection or whose entry into the fields constituting the ion conducting channel is unfavorable. If the energy of the scattered ions is sufficiently high, neutralization does not occur upon collision with a conductive surface or the ion may be neutralized but the neutral retains substantial kinetic energy. Other sources of contamination include photons, electrons, and background gas in the deposition region (as opposed to line of sight neutrals).

Figure 6:
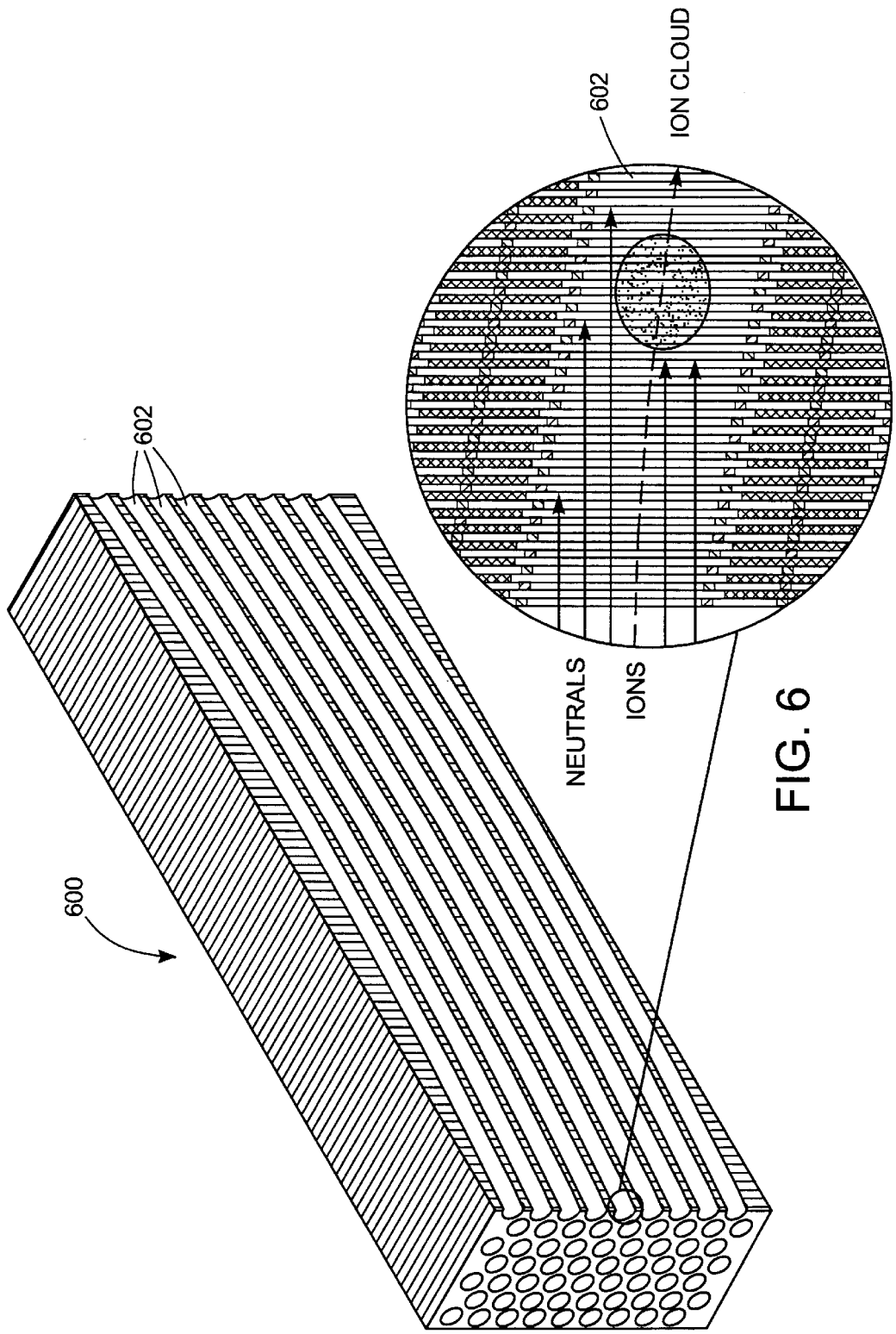
FIG. 6 shows an ion processing unit with curved ion conducting channels.

Line of sight neutrals are removed from the ion processing unit by utilizing curved ion conducting channels. FIG. 6 shows an ion processing unit with curved ion conducting channels. An ion processing unit 600 having ion conducting channels 602. The curved ion conducting channels are formed by stacking the electrode sheets and insulating spacers in an offset fashion. During operation of the ion processing unit, the fields created by the electrode sheets will move an ion cloud through the curved channel. Line of sight neutrals will follow a straight path and contact the side of the ion conducting channel. Neutrals which diffuse out of the ion processing unit are typically removed from the vacuum system by a pumping system (cryopumps, turbopumps, diffusion pumps). Neutrals may also be cryocondensed on the ion processing unit surface if the surface is sufficiently cold.

After a sufficient number of collisions, both photons and electrons are eliminated as a result of the curved channel structure. Ions striking the electrodes are eventually neutralized. High translational energy neutrals are eventually damped to thermal velocity. If the neutrals are sufficiently volatile they will diffuse out of the ion processing unit, or they may condense to form a solid on the ion processing unit structure.

C. Packing Patterns

Depending on the application, the ion processing unit may serve as an adapter between two regimes of dissimilar packing patterns. For example, the ion processing unit may provide the interface between a high density ion source and a quadrupole array for mass selection. In order to accomplish this transition, the ion conducting channels needs to make a transition from a hexagonal packing pattern to a rectangular packing pattern.

FIG. 7A shows an ion processing unit having graduated packing patterns. An ion processing unit 700 has ion conducting channels 702. The ion conducting channels are in a hexagonal packing pattern at one end and a rectangular packing pattern on the other end near a quadrupole array 710. The quadrupole array includes parallel electrodes 712. The hexagonal packing pattern may be near an ion source or a substrate for deposition. As shown, the outer overall diameter of the grid electrode increases as the packing pattern of the ion conducting channels becomes less efficient. By using sufficiently small changes between consecutive electrode sheets, the electronic perturbations to the ideal ion channel fields can be minimized.

FIG. 7B shows a cross-sectional view of the ion processing unit of FIG. 7A. Electrode sheets are shown at various increments along ion processing unit 700. The first grid is in a hexagonal packing pattern. Subsequent electrode sheets gradually spread to a rectangular packing pattern shown in the last electrode sheet. The conducting ion channels of the last electrode sheet proceed to pass between parallel electrodes 712 of the quadrupole array. Thus, consecutive electrode sheets may be varied to change the packing pattern, change the density of the ion conducting channels per unit area, or both as shown.

The electrical capacitance between successive electrode sheets is an important particle engineering consideration. Capacitance is minimized by ensuring that the electrode sheets are as substantially as open as possible. The six point suspension is maintained from the first electrode sheet to the last electrode sheet.

D. Gating and Lensing of Ion Conducting Channels

In some instances, it is desirable to have explicit control over specific ion conducting channels. In the electrode sheets described above, the ion conducting channels were not individually accessible. The present invention allows selective control over individual ion conduction channels and/or subgroups of the N fold channels.

FIG. 8. shows a planar electrode sheet having individually accessible ion conducting channels. An electrode sheet 800 includes multiple circular openings 802. The circular openings correspond to the ion conducting channels. The electrode sheet may be constructed of a multilayer printed circuit board that allows multiple electrical pads 804. In the preferred embodiment, the electrode sheet is fabricated using either single or double sided single layer board or a multilayer board, depending on the complexity. The electrical pads provide electric voltages to the circular openings and each electrical contact may be connected any number of circular openings.

Multiple subsets of channels may be driven via the electrical connections made with pads 804. The circular openings may be plated-through holes and receive electric voltages from one or more electrical pads 804. The cross-section A—A illustrates how electrode sheet 800 provides a gating function. Circular openings 806, 808, and 810 are shown. The electric fields generated at circular openings 806 and 810 allow the ions in their respective ion conducting channels to proceed. However, the electric field generated at circular opening 808 does not allow the ions to be translated across the gate. Thus, only selected ions (or ion conducting channels) are allowed to proceed and different ion conducting channels may be gated together.

Electrode sheet 800 may also provide lensing functions. Gating as described above can function as a binary gate with one electric voltage allowing ions to pass and another electric voltage blocking ions. However, electric voltages between these two extremes can serve as a lens to focus (or defocus) ions. Thus, circular openings of electrode sheet 800 may function as ion lenses depending on the applied electric voltage.

The electric voltages applied to the circular openings may be either a DC voltage, an Rf voltage, or both. Application of a DC voltage shall be referred to as "electrostatic" and application of an Rf voltage shall be referred to as "electrodynamic."

Electrostatic, electrodynamic or mixed electrostatic and electrodynamic gating may be utilized. The "mixing" of electrostatic and electrodynamic gating can mean several things. For example, electrostatic gates can be deployed for one subset of the N/i channels while electrodynamic over the other. Additionally, a single gate may have both electrostatic and electrodynamic components which are independent of an adjacent gate with none, electrostatic only, electrodynamic only, or electrostatic and electrodynamic.

E. Merging and Splitting of Channels

Figure 9:
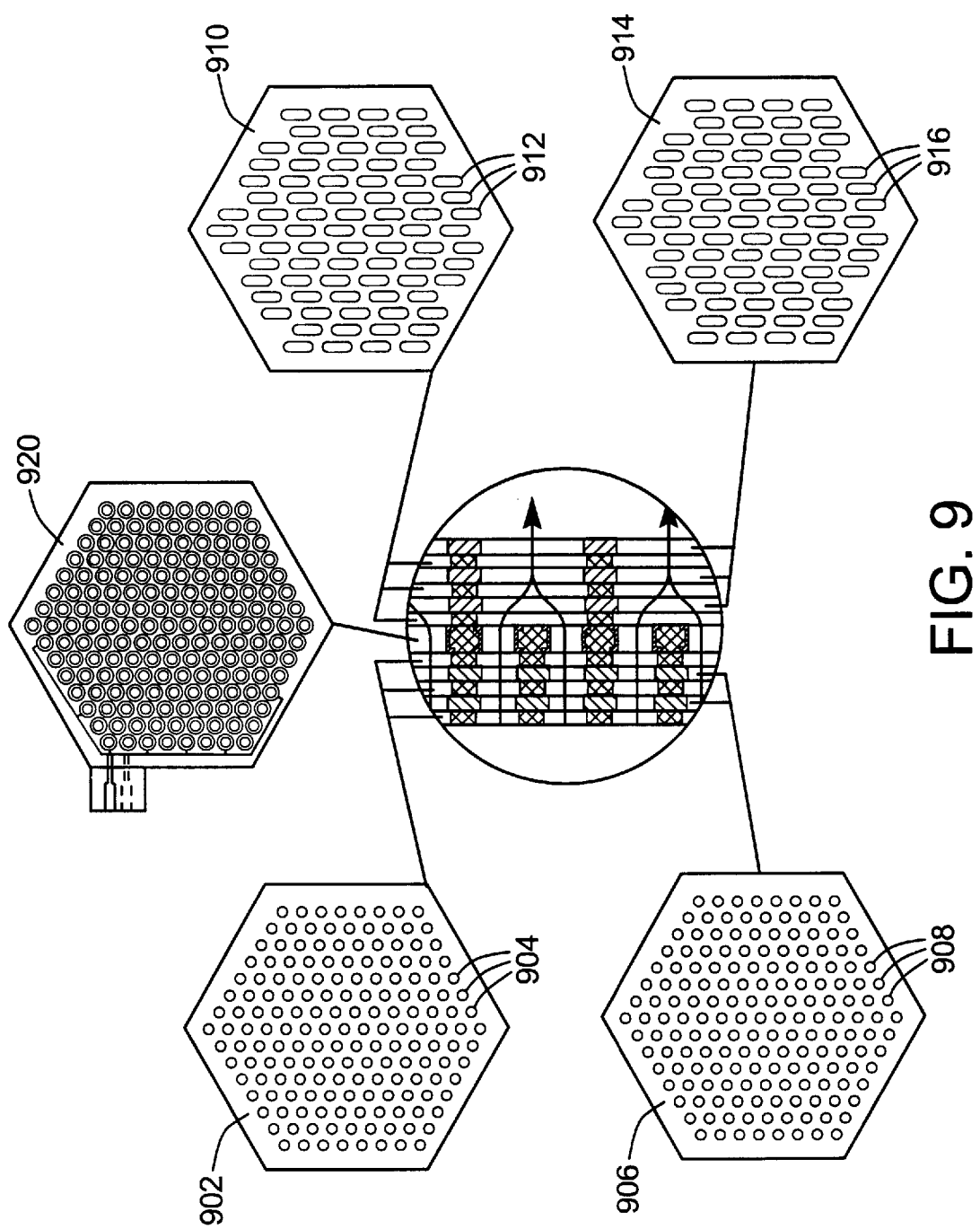
FIG. 9 shows an ion processing unit that merges two ion conducting channels.

The present invention provides the ability to merge multiple ion conducting channels or split an ion conducting channel into multiple channels. FIG. 9 shows an ion processing unit that merges two ion conducting channels. Insulator sheets 902 have circular openings 904 that correspond to the ion conducting channels. Electrode sheets 906 are placed between insulator sheets 902. The electrode sheets have circular openings 908 that form the ion conducting channels. Insulator sheets 910 have oval openings 912 that correspond to two ion conducting channels. Electrode sheets 914 are placed between insulator sheets 910. The electrode sheets have oval openings that form the ion conducting channels. Preferably, the diameter of the openings of the insulator sheets is larger than the diameter of the adjacent openings in the electrode sheets. This reduces the likelihood that the ions will come into contact with the insulator sheets causing insulator charging.

As shown, ions of two ion conducting channels merge into a single ion conducting channel. The same electrode sheets may be utilized to split the ion conducting channels formed by oval openings 916 into two ion conducting channels. Although 2:1 merges and splits are shown, other multiples may be produced.

Although ion conducting channel merging and splitting may be accomplished without any gating, the combination provides additional functionality. A gating electrode sheet 920 is shown which is similar to the electrode sheet in FIG. 8. By combining the merging channels, two distinct ion species may be injected into adjacent ion conducting channels. Electrode sheet 920 allows the selection of no ions, ions of either species, or various combinations of ions of both species.

F. Gas and Photon Optical Manifolds

In the above sections, it was shown that the spatial orientation of adjacent planar electrode sheets may be changed (i.e., curved ion channels), the spatial orientation of adjacent ion conducting channels may be changed (i.e., packing patterns), the electric fields applied to adjacent ion conducting channels may be changed (i.e., gating), and ion conducting channels may merge and split. These provide significant improvement to the ion optics. However, the processing of ions should also include the chemical reaction of ions with gas phase particles, interactions with photons, and interaction with solid surfaces.

Figure 10A:
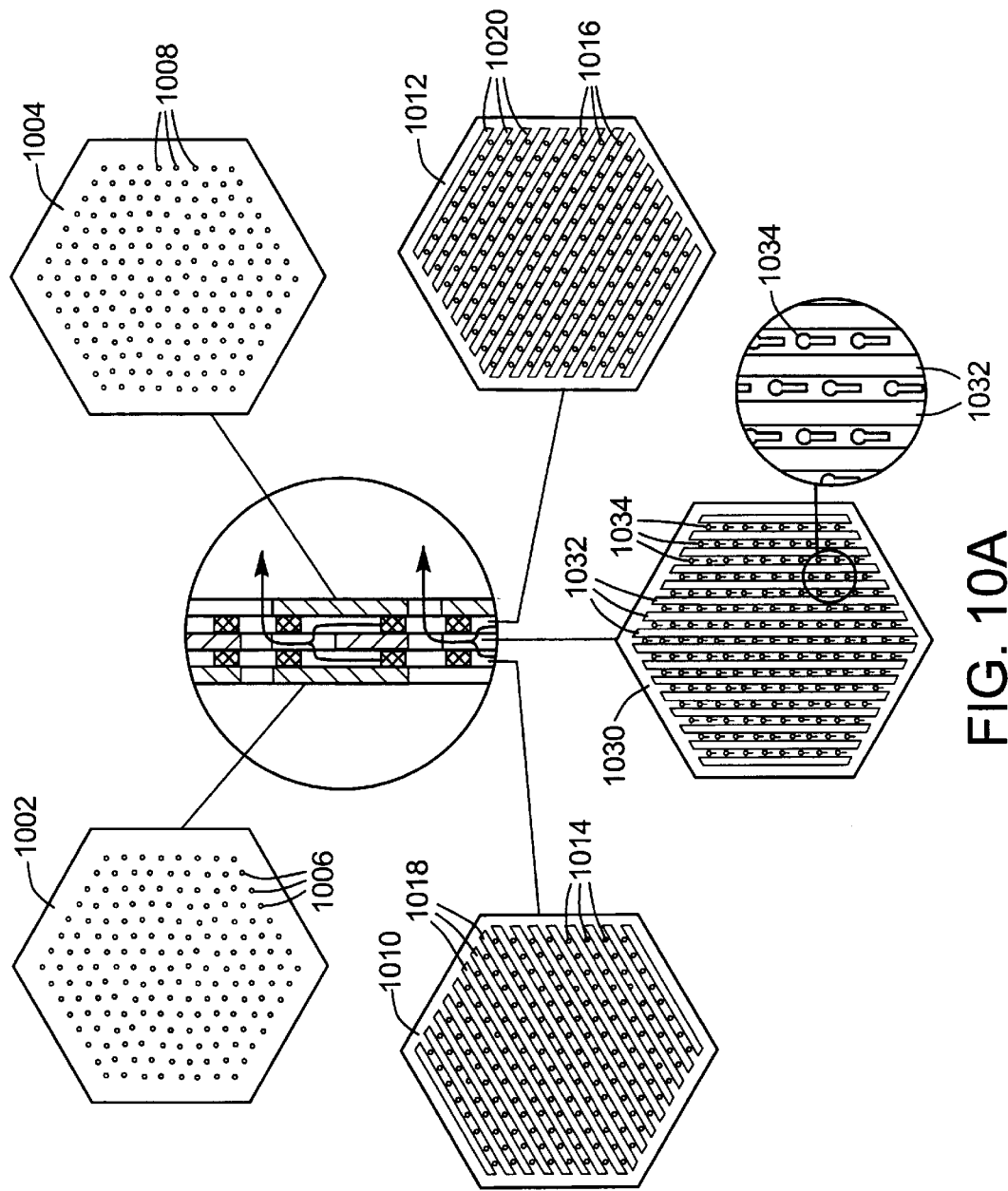
FIG. 10A shows a gas manifold for injecting gas into ion conducting channels and FIG. 10B shows another gas manifold for injecting gas into ion conducting channels.

In some instances, such as the generation of ions or the collision of ions with specific neutrals, it would be advantageous to direct a specified gas flow into each ion conducting channel. FIG. 10A shows a gas manifold for injecting gas into ion conducting channels.

End plates 1002 and 1004 form the outer walls for the gas manifold as well as defining the entrance and exit for the ion conducting channels. The end plates include circular openings 1006 and 1008, respectively. Adjacent to the end plates are gas conduction plates 1010 and 1012. The gas conduction plates have circular openings 1014 and 1016, respectively.

The ion conducting channels are defined by the circular openings. The gas conduction plates also include gas channels 1018 and 1020. The gas channels are openings in the gas conduction plates between the rows of circular openings. Although the construction of the gas conduction plates is the same, during construction of the gas manifold, the gas conduction plates are placed so that the gas channels are at 60° angles.

A gas injection plate 1030 is placed between the gas conduction plates. Like the gas conduction plates, the gas injection plate has gas channels 1032 between rows of circular openings. And like the gas conduction plates, gas channel 1032 is placed at a 60° to the other gas channels.

However, in the gas injection plate, circular openings 1034 have a notch that allows gas from a gas channel in an adjacent gas conduction plate to be metered into the ion conducting channel. The gas channels form a gas manifold which feeds the individual gas metering orifices without the deleterious effects of a significant pressure drop in manifold pressure between successive gas metering orifices.

Figure 10B:
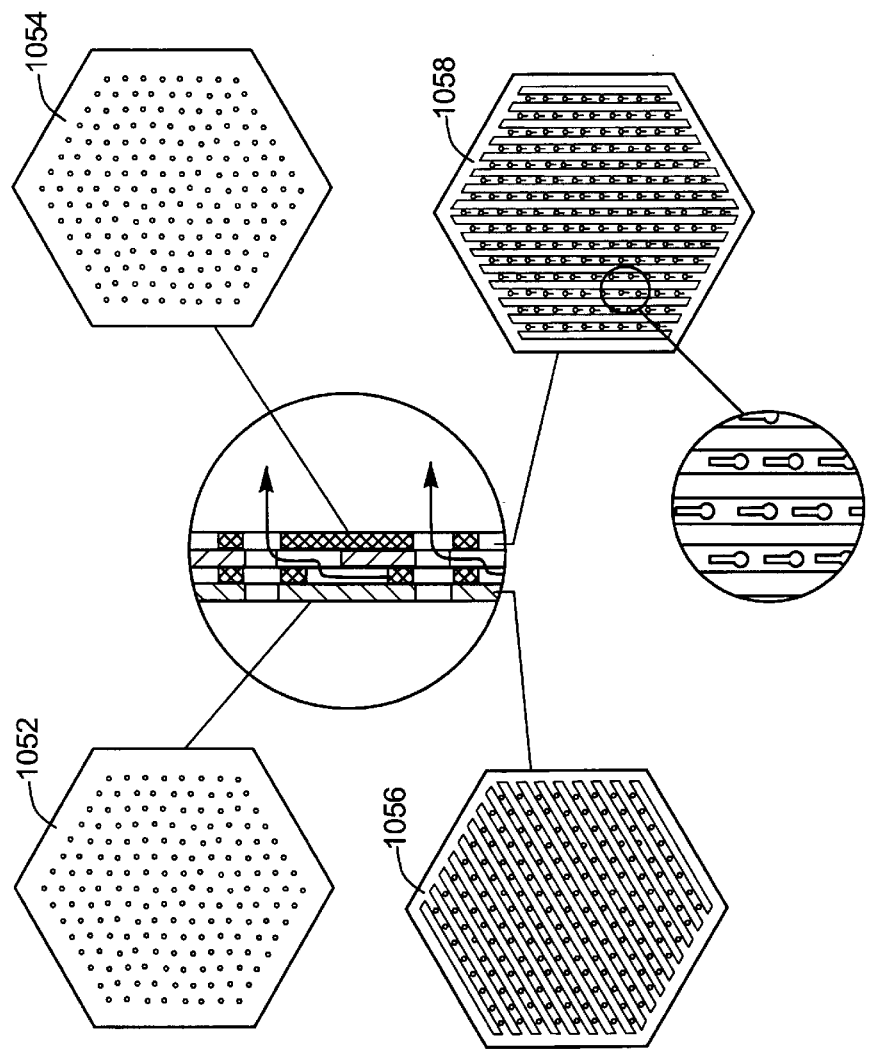

FIG. 10B shows another gas manifold for injecting gas into ion conducting channels. The gas manifold is the same as the one shown in FIG. 10A except that there is only one gas conduction plate instead of two.

End plates 1052 and 1054 form the outer walls for the gas manifold as well as defining the entrance and exit for the ion conducting channels. The end plates include circular openings that correspond to the ion conducting channels. Adjacent to the end plates is a gas conduction plate 1056 and a gas injection plate 1058. The gas conduction and injection plates also have openings that correspond to the ion conducting channels; however, the gas conduction plate has circular openings and the gas injection plate has circular openings that include a notch as shown.

The gas conduction and injection plates also have channels that run between the rows of openings. The channels are nonparallel (e.g., 60°) when the plates manifold is constructed so that gas is able to diffuse across the manifold. The notches in the circular openings in the gas injection plate allow gas to be metered into the ion conducting channel.

The plates may be chemically etched and may be conducting, insulating or mixed. To make the manifold gas tight, the inner surfaces of the manifold plates may be clad together either directly or utilizing an adhesive. Alternatively, sufficient mechanical pressure may be applied across the faces of the plates to preclude inter-plate gas leakage out of the gas manifold. In one embodiment, the gas injection plate is made from a porous (sintered) material. Gas metering into the individual ion conducting channels is thus achieved by diffusion through the sintered medium rather than through a precision forced aperture (e.g., the notch in circular openings 1034).

In one embodiment, the ion processing unit is the gas manifold. Thus, the gas manifold is composed of alternating conductive electrode and insulator sheets. Referring to FIG. 10A, end plates 1002 and 1004 may be metal electrode sheets. Gas conduction plates 1010 and 1012 may be insulator sheets (e.g., Kapton). Gas injection plate 1030 may then be a metal electrode sheet. The end plates 1002 and 1004 and gas injection plate 1030 may include electrical contact extensions as shown in FIG. 3A as extension 304.

Figure 11:
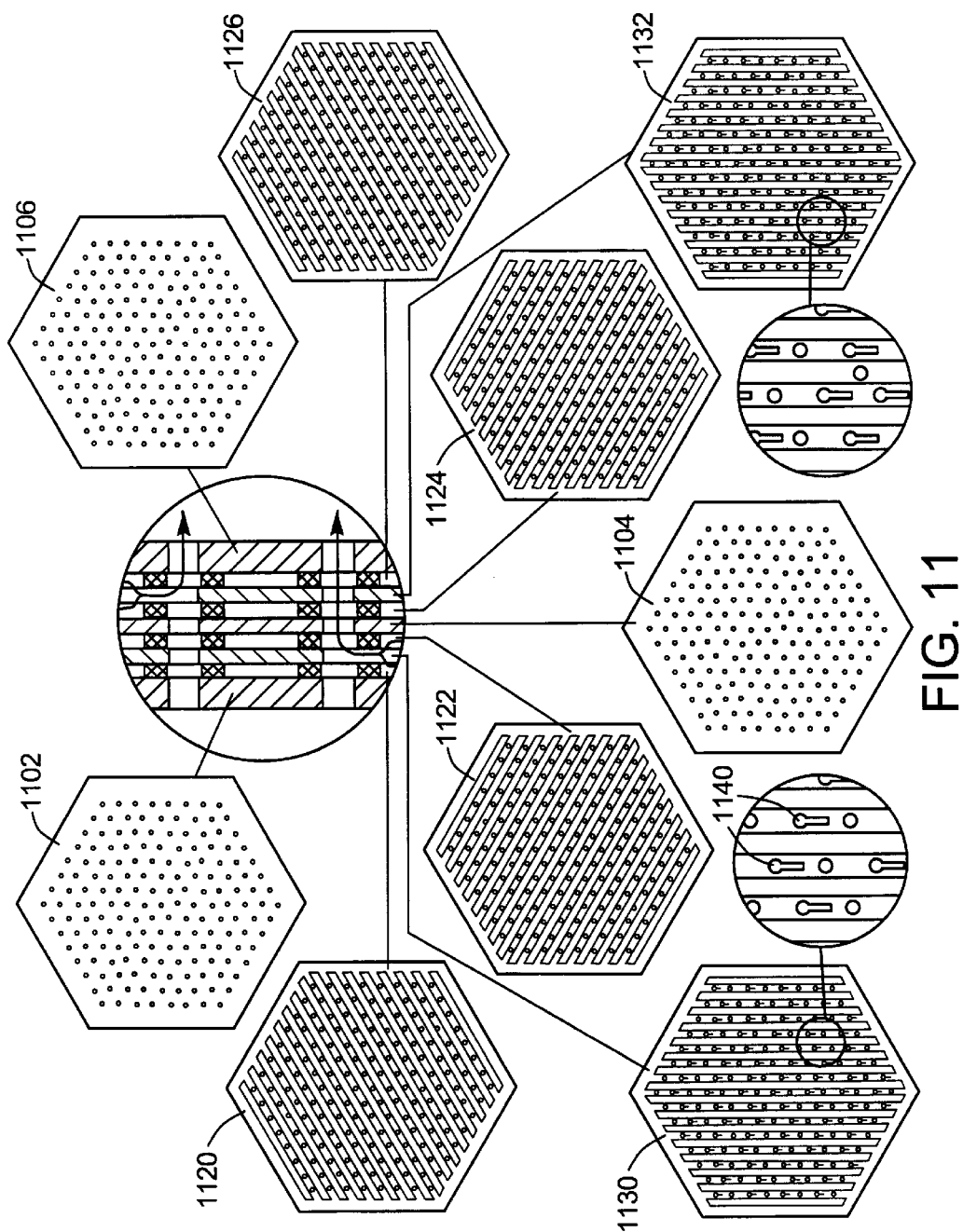
FIG. 11 shows gas manifolds for injecting two gases into ion conducting channels.

FIG. 11 shows gas manifolds for injecting two gases into different ion conducting channels. The gas manifolds include end plates 1102, 1104, and 1106 that are the same as the end plates of FIG. 10A. End plate 1104 separates the two gas manifolds. Similarly, the gas manifolds include gas conduction plates 1120, 1122, 1124, and 1126. Between pairs of gas conduction plates are gas injection plates 1130 and 1132. Gas injection plates include circular openings of which only half contain notches 1140 for injecting gas into the ion conducting channels. By staggering the circular openings with notches, one gas may be injected into half of the ion conducting channels and another gas may be injected into the other half. Although the notched circular openings are shown for half of the ion conducting channels, it should be readily apparent that any number of circular openings may be notched and that different gas manifolds may be configured to inject gas into the same ion conducting channel.

The gas manifolds provide a way to inject gas into ion conducting channels while maintaining a constant gas pressure at each ion conducting channel. Additionally, the gas manifolds deliver gas to the ion conducting channels at similar times and with a low dead volume.

FIG. 12 shows a top and cross-sectional views of a gas manifold. A gas manifold 1200 includes a gas injection port 1202. Gas is injected into the gas manifold through the gas injection port. Multiple gas injection ports may be utilized to inject multiple gases into a gas manifold. Once gases are injected into the ion conducting channels, electrons may be directed to impact on the gas to produce ions.

The gas manifolds described may be modified to produce photon optical manifolds. To produce a photon optical manifold, the gas conduction and injection plates are fabricated with optically transparent materials. In FIG. 10B, ion conduction plate 1056 and ion injection plate 1058 may be composed of glass or any other light conductive material. Then, photons emitted by ion species, for example as a result of laser stimulated emission, fluorescence, or phosphorescence exit the optical manifold plates and may be collected into a fiber optic cable. In this manner, photons from ions optically adjacent to or optically in the plane of the optical manifold plates are collected for all the ion conducting channels. More than one optical manifold may be deployed throughout the length of the ion processing unit allowing for optical photon collection from very large numbers of ions.

G. Quadrupole Array

Figure 13A:
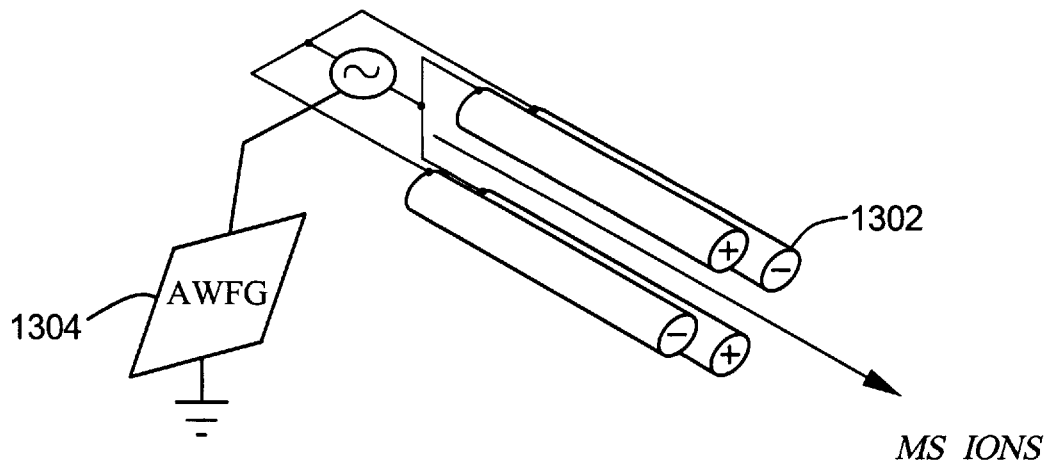
FIG. 13A shows a quadrupole for translating a single beam of ions.

FIG. 13A shows a quadrupole for translating a single beam of ions. Electrodes 1302 of a quadrupole are parallel to the ion channels unlike an ion processing unit which includes electrodes that are generally perpendicular to the ion channels. Mass selection may be accomplished utilizing a quadrupole array. For example, mass selection utilizing a quadrupole is disclosed in U.S. Pat. No. 2,939,952, issued Jun. 7, 1960 to Paul et al. which is hereby incorporated by reference for all purposes. In the present invention, an Arbitrary Wave Form Generator (AWFG) 1304 superimposes an excitation waveform on top of the applied Rf voltage. Mass selection using a superimposed excitation waveform will be discussed further in reference to FIGS. 18, 19 and 20.

Figure 13B:
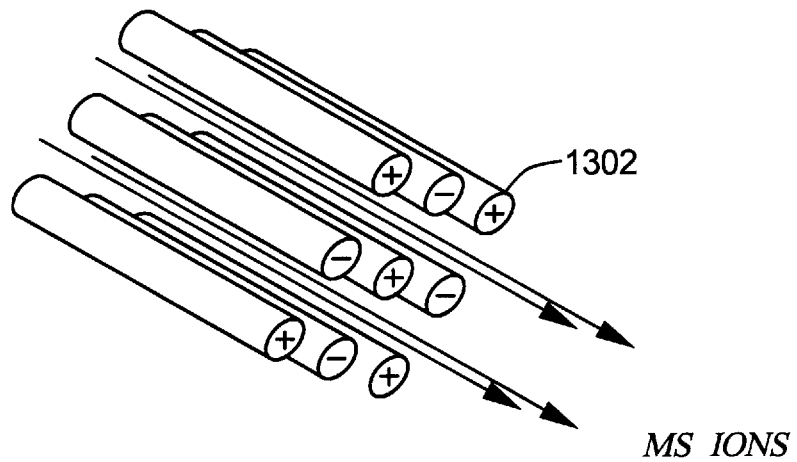
FIG. 13B shows a quadrupole array for translating multiple beams of ions.

FIG. 13B shows a quadrupole array for translating multiple beams of ions. The quadrupole array includes multiple electrodes 1310. Multi-pole trapping potential functions by arrays serve as ion storage, transport and mass selection. In the present invention, quadrupole arrays may be utilized in conjunction with an ion processing unit to achieve a high current throughput for the mass selection of one or more simultaneous ion mass species and/or to achieve mass cutoff, again at high ion current. High ion currents are generally necessary to achieve a high deposition rate of the thin film on the substrate. Although mass selection may be performed with a quadrupole array, mass selection may also be performed by an ion processing unit in a similar manner.

Figure 13C:
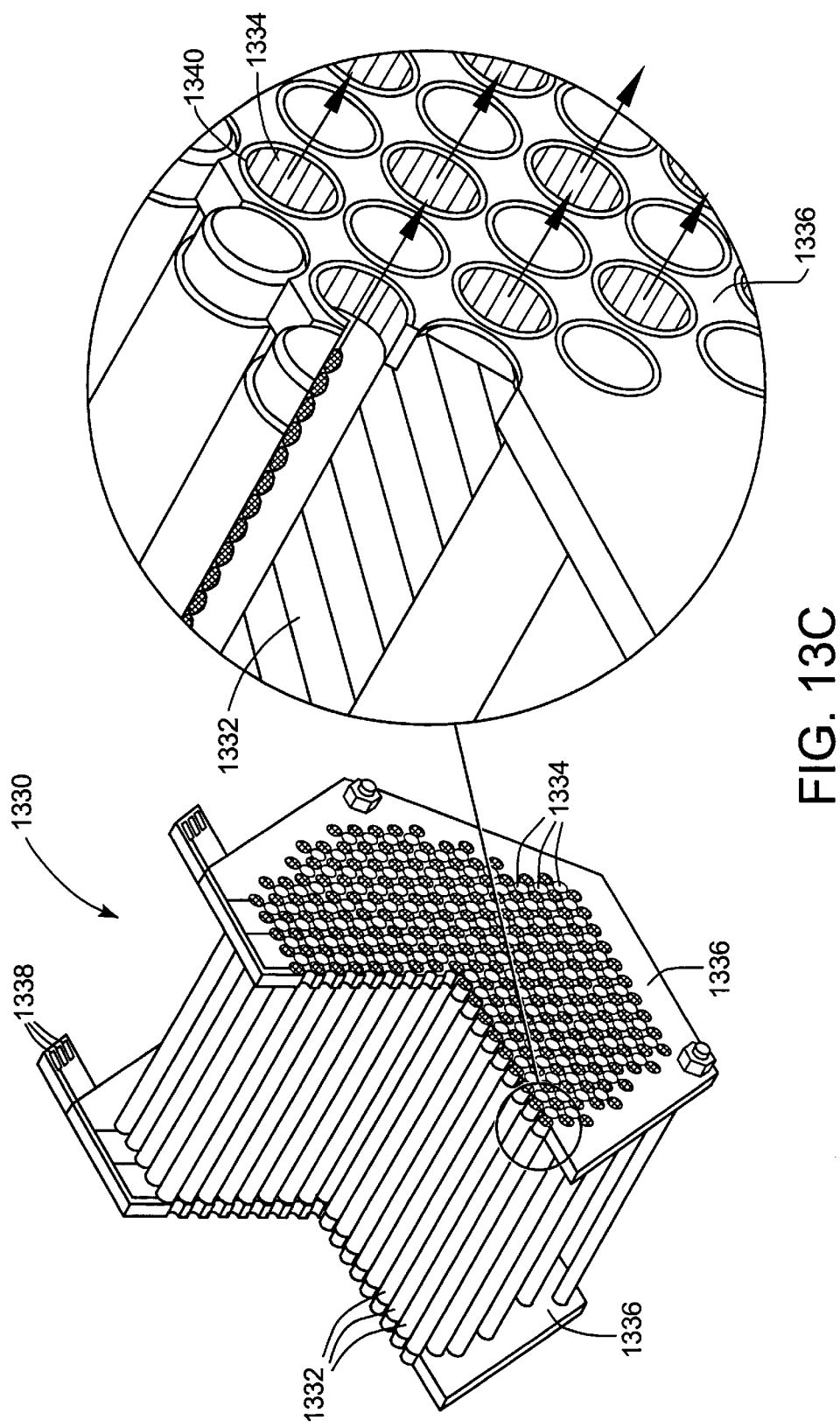
FIG. 13C shows a quadrupole array unit for translating multiple beams of ions.

FIG. 13C shows a quadrupole array unit for translating multiple beams of ions. A quadrupole array unit 1330 includes multiple electrodes 1332. Groups of four electrodes define the ion conducting channels 1334. The quadrupole array unit includes end plates 1336. The end plates hold the electrodes in place and may be made of a conductive material allowing electric voltages to be applied to the electrodes through the end plates. In one embodiment, the end plates are printed circuit boards which allow electric voltages to be applied to certain groups of electrodes through electrical pads 1338 in a manner similar to what is shown in FIG. 8. Additionally, electric voltages may be applied in a similar manner to the entrance and exit lenses of the ion conducting channels which are formed as plated through holes 1340.

Quadrupole array units may provide ion transport and processing in addition to the ion processing unit. However, quadrupole array units have an intrinsically less efficient packing pattern, the rectangular packing pattern, than ion processing units with hexagonal packing pattern. Therefore, an ion processing unit may be utilized as an interface between the two packing patterns as shown in FIGS. 7A and 7B.

H. Rf Electronic Drive Components

In a preferred embodiment, a computer system is utilized to generate the electric voltages that are applied to the electrodes in an ion processing unit or quadrupole array (see, e.g., FIG. 1). However, some embodiments may utilize a greatly simplified device. For example, in cases where the total ion throughput does not have to be maximized by the mechanism of dynamic ion capture and transport, a simplified electronic driving circuit may suffice.

Figure 14A:
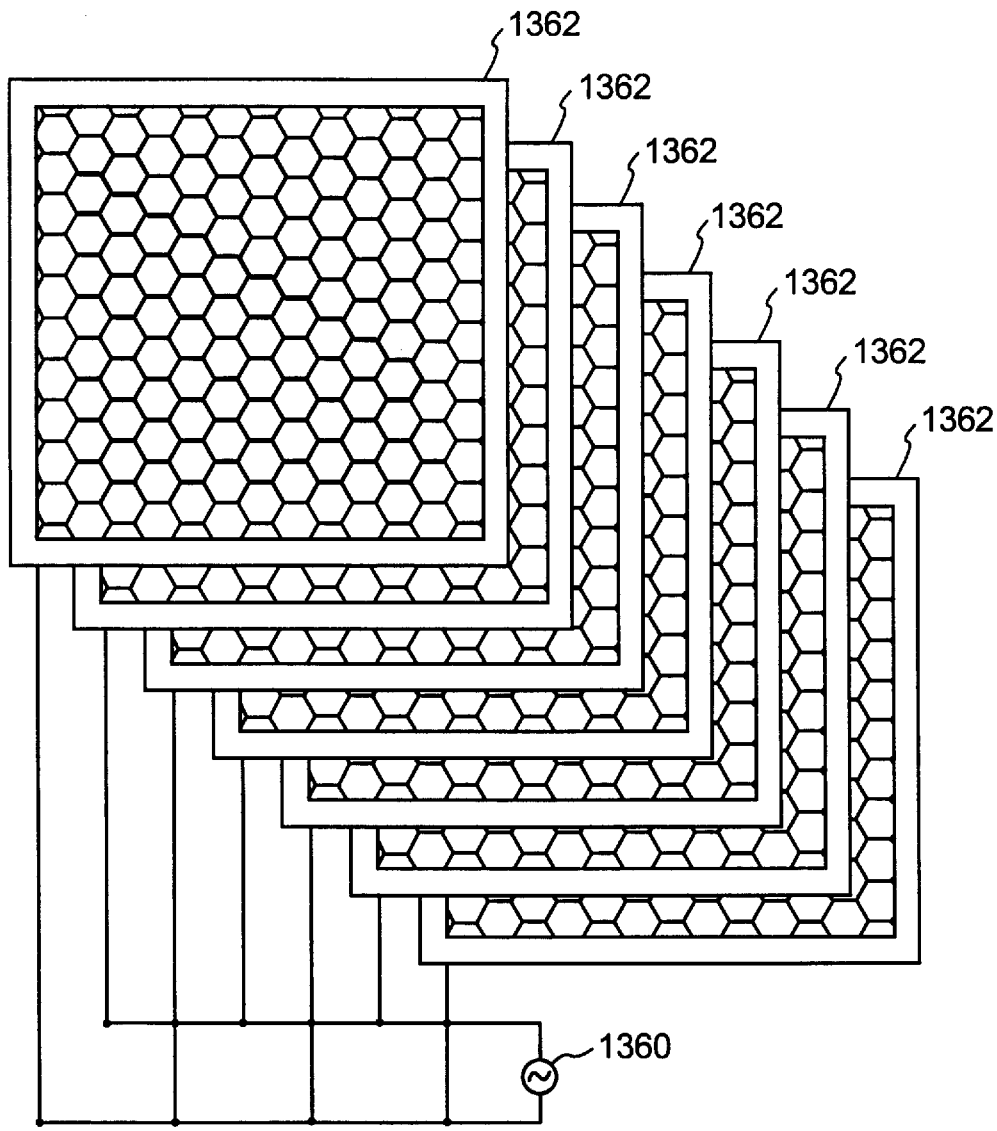
FIG. 14A and 14B show an ion processing unit configured as a storage vessel for ions.

FIG. 14A shows an ion processing unit functioning as a space filling storage vessel for ions. An oscillator 1360 applies alternating electric voltages to electrode sheets 1362. The alternating voltages will store ions in the ion conducting channels of the ion processing unit.

Figure 14B:
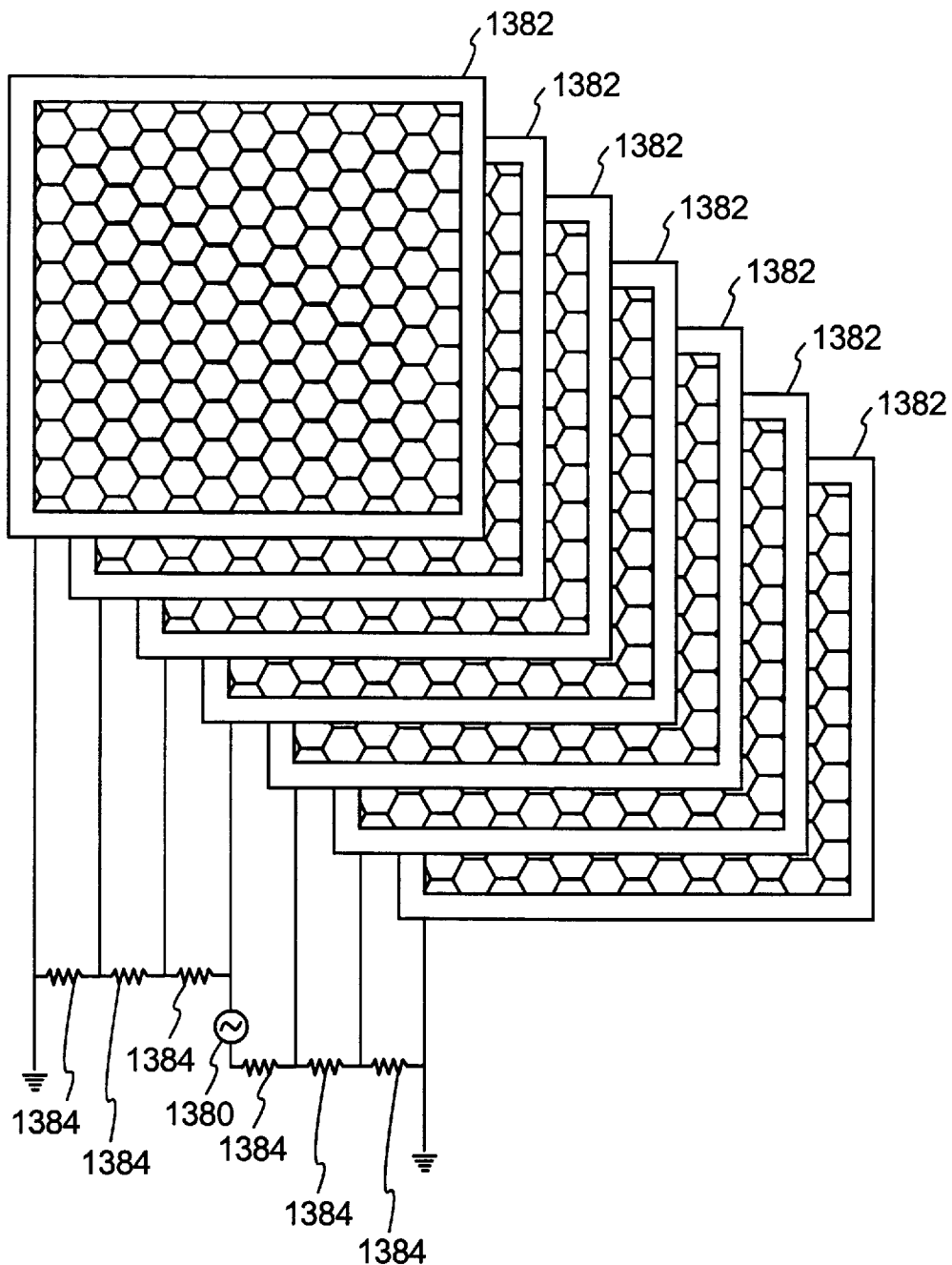

FIG. 14B shows another embodiment of a space filling storage vessel for ions. An oscillator 1380 produces alternating electric voltages that are applied to electrode sheets 1382. Between electrode sheets 1382 are dropping resistors 1384 that provide the electrodes with varying voltage voltages. The alternating voltages will store ions in the ion conducting channels of the ion processing unit. Thus, oscillators and other electronic devices may be utilized to generate the electric voltages that are applied to the electrode sheets.

III. Ion Sources

The sources of ions may utilize a wide range of techniques. Ion sources will be generally classified as being external to the ion conducting channels or integral with the ion conducting channels. An external ion source is common to a large cluster of ion conducting channels. In contrast, individual integral ion sources are specific to an ion conducting channel of the ion processing unit.

A. External Ion Sources

Figure 14C:
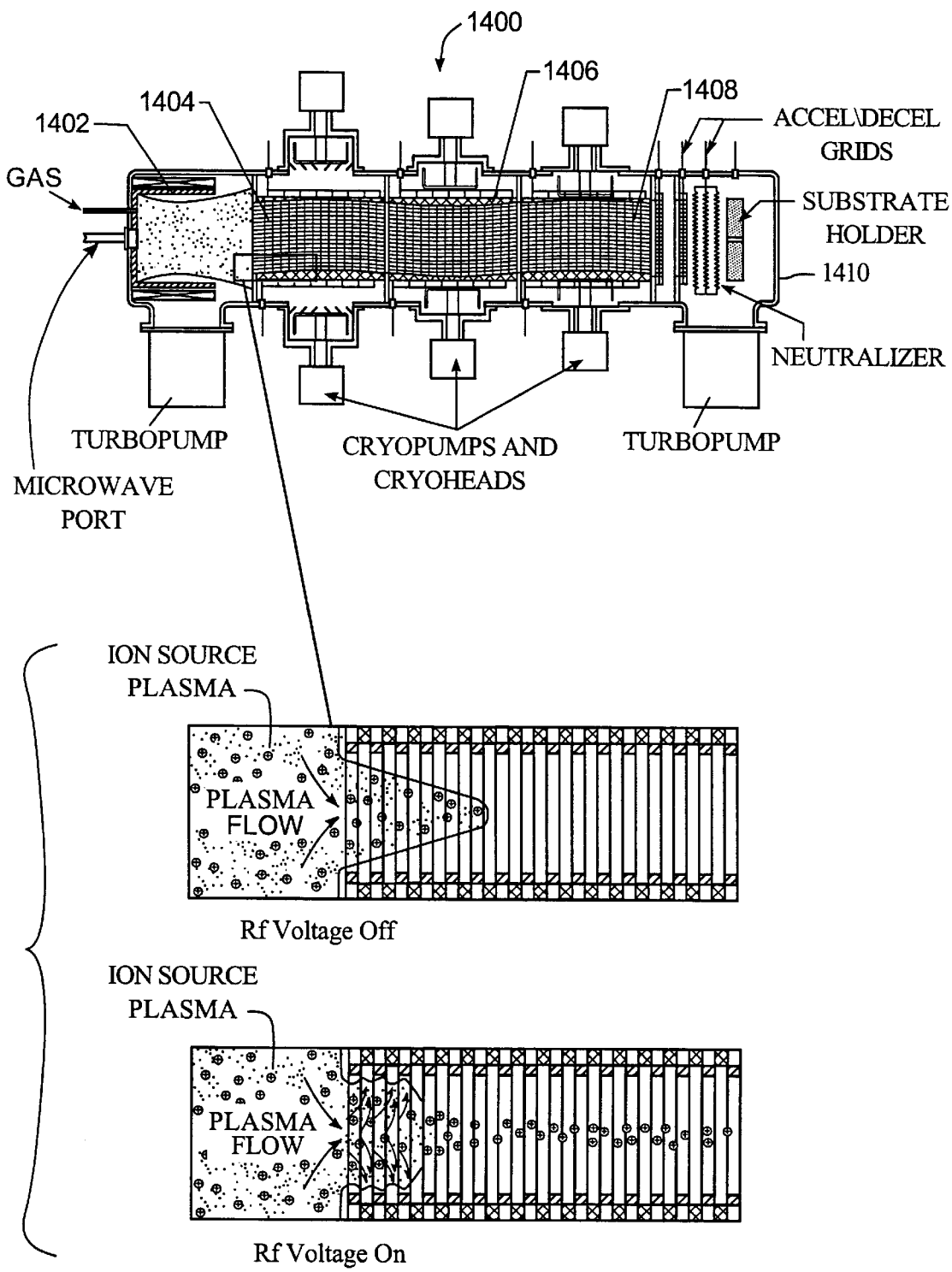
FIG. 14C illustrates a thin film deposition device including an external ion source.

FIG. 14C illustrates a thin film deposition device including an external ion source. A thin film deposition device 1400 includes an ion source 1402, ion processing units 1404, 1406, 1408, and deposition unit 1410. In a preferred embodiment, the ion source is a broad beam Electron Cyclotron Resonance (ECR) ion source. Such sources are described in J. Asmussen, J. Vac. Sci. Technol. A 7 883 (1989) and O. A. Popov et al., J. Vac. Sci. Technol. A 10 3055 (1992) which are both hereby incorporated by reference for all purposes. Charged species comprising the plasma exit the ion source with some characteristic ion velocity $V_i$ which is driven by the relative position of the magnets comprising the plasma confinement area. The plasma exits the ion source and strikes the front of the ion processing unit. Plasma penetration into the individual ion conducting channels may be controlled by the plasma exit velocity $V_i$ and/or by the relative potential between the source and ion processing unit.

In typical prior art systems, a large DC potential is required to extract the ions from the plasma. However, the resulting ion beam is at high energy which makes it not very well suited for low energy control. In the present invention, the front of the ion processing unit need not be held at a high voltage and can even be held at ground with the internal fields operating under conditions suitable for capture and transport of atomic and/or molecular ions.

Still referring to FIG. 14C, the top expanded view of the ion source and ion processing unit junction shows a plasma, consisting of positively and negatively charged components, flowing into a single ion conducting channel with the Rf electric drive off. Electrons comprise the primary negatively charged component of many plasmas. When the Rf electric drive is on, the electrons are selectively accelerated out of the plasma because electrons are unstable in the electrodynamic field. This process is shown in the bottom exploded view of the ion source and ion processing unit junction.

The remaining ion species (both positive and negative) may be stable and become entrained in the ion processing unit field and transported into the interior of the ion processing unit. Thus, the present invention eliminates the need for high DC extraction voltages for separation of ions from a plasma.

Ion processing unit 1404 may function as an ion buffer to collect ions and regulate the flow of ion out of the ion buffer. Ion processing unit 1406 may mass select ions in the ion conducting channels. Ion processing unit may function as an ion buffer for deposition on a substrate. The ion buffers typically have more ions available from the plasma than can be accommodated by the ion throughput of the device. In this manner, the ion buffers produce ion streams that have uniform densities. Therefore, even though the plasma density at the input is not uniform, the rate limiting throughput of the ion buffer produces a uniform output.

Figure 14D:
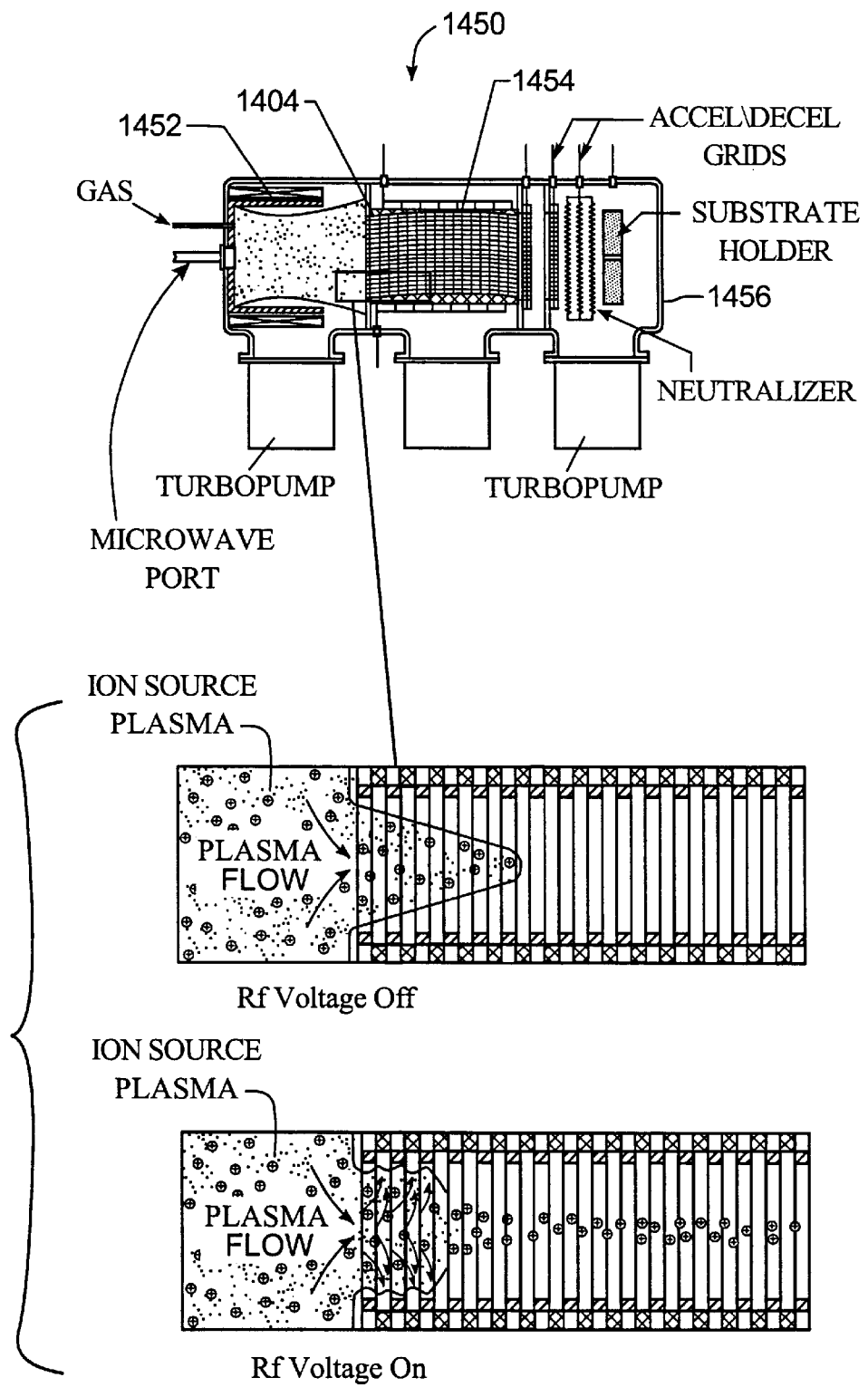
FIG. 14D illustrates an ion implantation device including an external ion source.

Although the plasma ion extraction is shown utilized in a device for thin film deposition, the plasma ion extraction may be utilized in other devices or as a standalone device. For example, FIG. 14D illustrates an ion implantation device including an external ion source. An ion implantation device 1450 includes an ion source 1452, an ion processing units 1454, and implantation unit 1456.

Device 1450 is similar to the device in FIG. 14C except that there is only on ion processing unit. The three ion processing units 1404, 1406 and 1408 in FIG. 14C may be utilized for thin film deposition in order to create a high vacuum (i.e., neutrals removed from the ion streams) in deposition unit 1410. For ion implantation, a high vacuum is not required so a device for ion implantation may be made with a single ion processing unit (e.g., ion processing unit 1454).

B. Integral Ion Sources

Individual integral ion sources provide gas density only near the region in space where ions will be successfully captured or entrained by an ion conducting channel. Integral ion sources may consist of ionizing gas plumes introduced into the ion conducting channels by gas manifolds shown in FIGS. 10A and 10B. By achieving ionization within the gas plume (which has not significantly expanded from gas manifold pressure to the vacuum) the ratio of ions to neutrals can be significantly increased over ionization in gas sustained by a similar flow rate in a large volume.

Figure 15A:
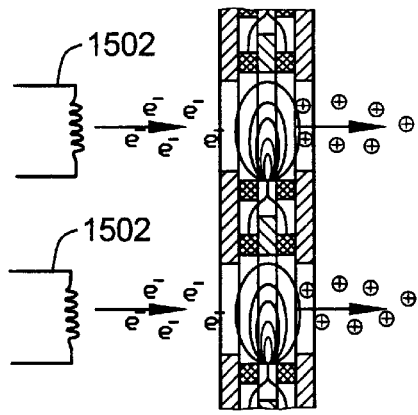
FIG. 15A–15D shows ionization of gas plumes for an integral ion source utilizing electron impact, laser ionization, DC discharge, and Rf discharge, respectively.

Direct ionization of gas within the plume may be achieved using a number of techniques shown in FIGS. 15A–15D. FIG. 15A shows ionization of the gas plume utilizing electron impact. Electrons travel through the ion conducting channels and impact on particles in the gas plume creating positively charged ion species. For example, aligned filaments 1502.

Figure 15B:
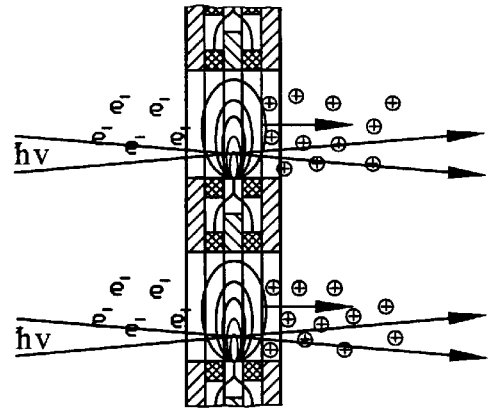

FIG. 15B shows ionization of the gas plume utilizing laser ionization. Laser light, including single, multiphoton, and REMPI (Resonance Enhanced Multi-photon Ionization), are direct to the gas plume to ionize neutral species in the ion conducting channels.

Figure 15C:
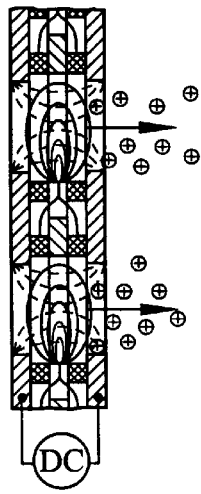

FIG. 15C shows ionization of the gas plume utilizing DC discharge. A DC discharge (glow) is produced by applying a DC voltage potential between the end plates of the gas manifold.

Figure 15D:
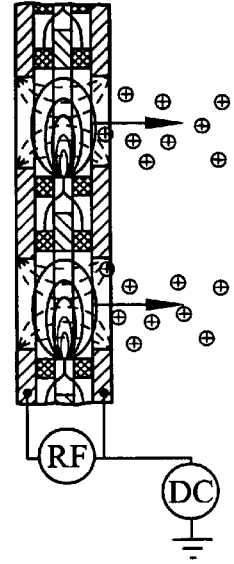

FIG. 15D shows ionization of the gas plume utilizing Rf discharge. An Rf field (e.g., microwave) is produced by across the end plates of the gas manifold to ionize the gas plume.

The previous techniques for ionizing a gas plume in an ion conducting channel may be applied to each channel. Under some conditions it may not be desirable or safe to have ionization in a gas mixture where the two or more gas species may chemically react. Different ionization species specific to a subset of ion conducting channels may be achieved using multiple manifolds as shown in FIG. 11. In other configurations, independent ion populations may be combined using channel merging techniques shown in FIG. 9. Thus, the integral ion sources may produce different ion species in the ion conducting channels of the ion processing unit.

The need for mass selection arises from the need to element unwanted ion species from the ion beam flux. In some cases, however, sufficient ion beam purity may be attained using specific chemical reactions, and in particular, charge transfer ion molecule reactions like the following:

| Reactions | | Percent | Temp |
|---|---|---|---|
| $He^+ + N_2$ --> | $N_2^+ + He$ | 0.40 | 300K |
| | $N^+ + N + He$ | 0.60 | |
| $He^+ + CO$ --> | $C^+ + O + He$ | 1.00 | 300K |
| $He^+ + NO$ --> | $N^+ + O + He$ | 1.00 | 300K |
| $Ne^+ + N_2$ --> | $N_2^+ + Ne$ | 1.00 | 300K |
| $Ne^+ + NO$ --> | $N^+ + O + Ne$ | 1.00 | 300K |
| $Ar^+ + N_2$ --> | $N_2^+ + Ar$ | 1.00 | 300K |

Charge transfer reactions also provide control over the internal energy of the ion product. Internal energy control may be an essential parameter in thin film deposition like thin film diamond deposition. Additionally, charge transfer reactions may reduce or eliminate the need to perform mass selection.

The reactant gas used in a charge transfer reaction may determine the internal energy of the resulting ions. This process may be seen in the following reactions:

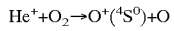

$He^+ + O_2 \rightarrow O^+(^4S^0) + O$

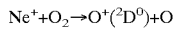

$Ne^+ + O_2 \rightarrow O^+(^2D^0) + O$

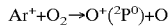

$Ar^+ + O_2 \rightarrow O^+(^2P^0) + O$

As shown, the reactant gas may determine the orbitals in the resulting oxygen ions. These reactions are discussed in X. Li et al., "State selection of $O^+(^4S^0, ^2D^0, ^2P^0)$ using resonance dissociative charge transfer of $He^+(Ne^+, Ar^+) + O_2$ and radio frequency multipole ion guide techniques," Rev. Sci. Instrum. 66 4 (1995).

Figure 16:
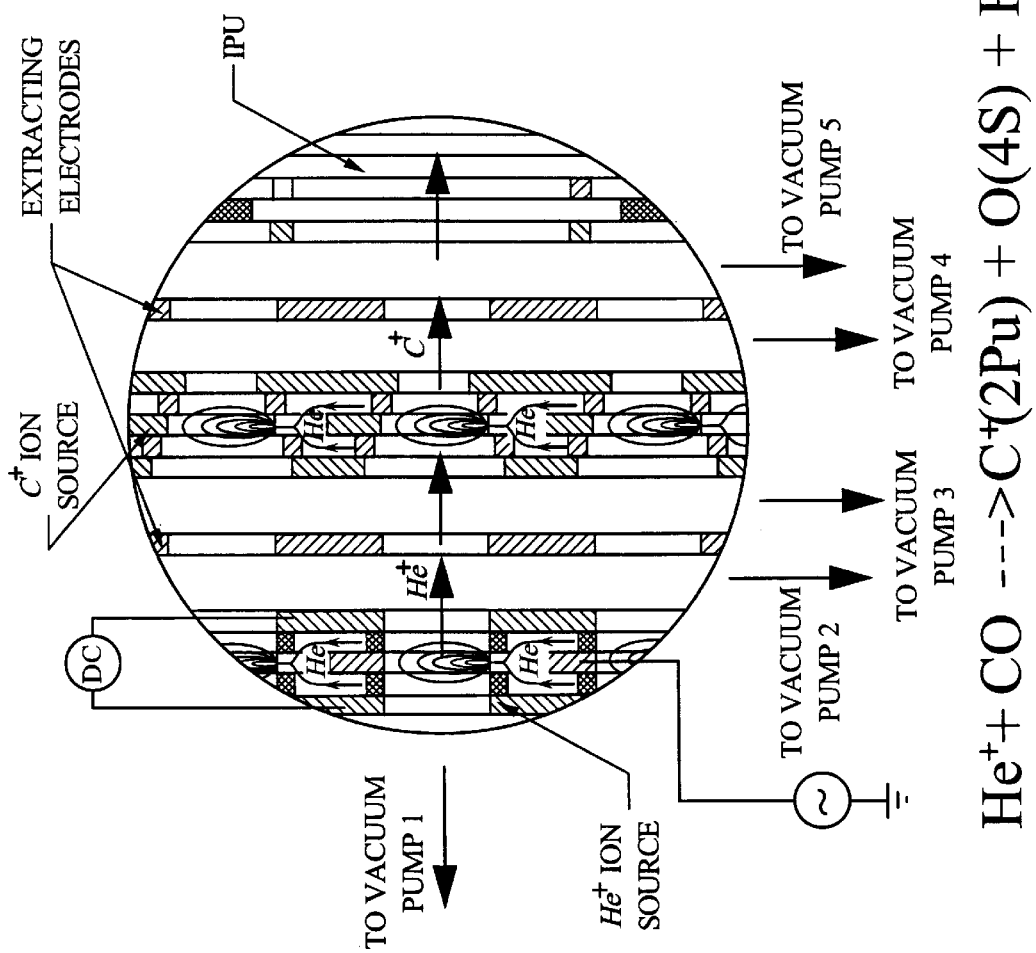
FIG. 16 shows a sequential charge transfer reaction.

FIG. 16 shows a sequential charge transfer reaction. In a first stage, helium gas in ionized with an Rf discharge. The positively charged helium species is injected into a plume of carbon monoxide gas in a second stage. The helium species reacts with the carbon monoxide gas to produce the following reaction:

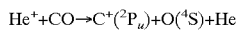

$He^+ + CO \rightarrow C^+(^2P_u) + O(^4S) + He$

The positively charged carbon species is essentially the only product which is extracted and injected into the aligned ion conducting channel. As is the case with $O^+$ above, this reaction is significant because precise control over the internal energy of the ion species is also attained. This reaction is further described in M. Rincon et al., Int. J. Mass. Spec. Ion Processes, 86 369 (1988).

The reaction in FIG. 16 may be generalized as involving a primary ion beam $A^+$ is flowing thorough the ion processing unit. Neutral B is injected into at least one of the ion conducting channels by a local gas manifold so that ions $A^+$ passing thorough the neutral gas plume are charge exchanged.

Several variations on the above procedures are possible. Another process involves the following:

1. The ion processing unit is filled with a primary ion species, for example $He^+$.
2. A pulsed valve injects neutral reactants, for example CO, into the inter region of the ion processing unit.
3. The reaction $A^+ + B \rightarrow A + B^+$ occurs within the trapping potential of the ion processing unit exchanging the original ion A for the new ion B. Neutralized A species and excess B are pumped from the system.
4. The ion $B^+$ is ejected from the ion processing unit.

IV. Ion Processing

The previous sections have described both ion processing units and quadrupole array units. These units may be combined to produce a very high level of functionality. More specifically, functions like the capturing and buffering of ions, mass selection, ion transport, deposition or ion implantation of mass selected species may be achieved.

Figure 17:
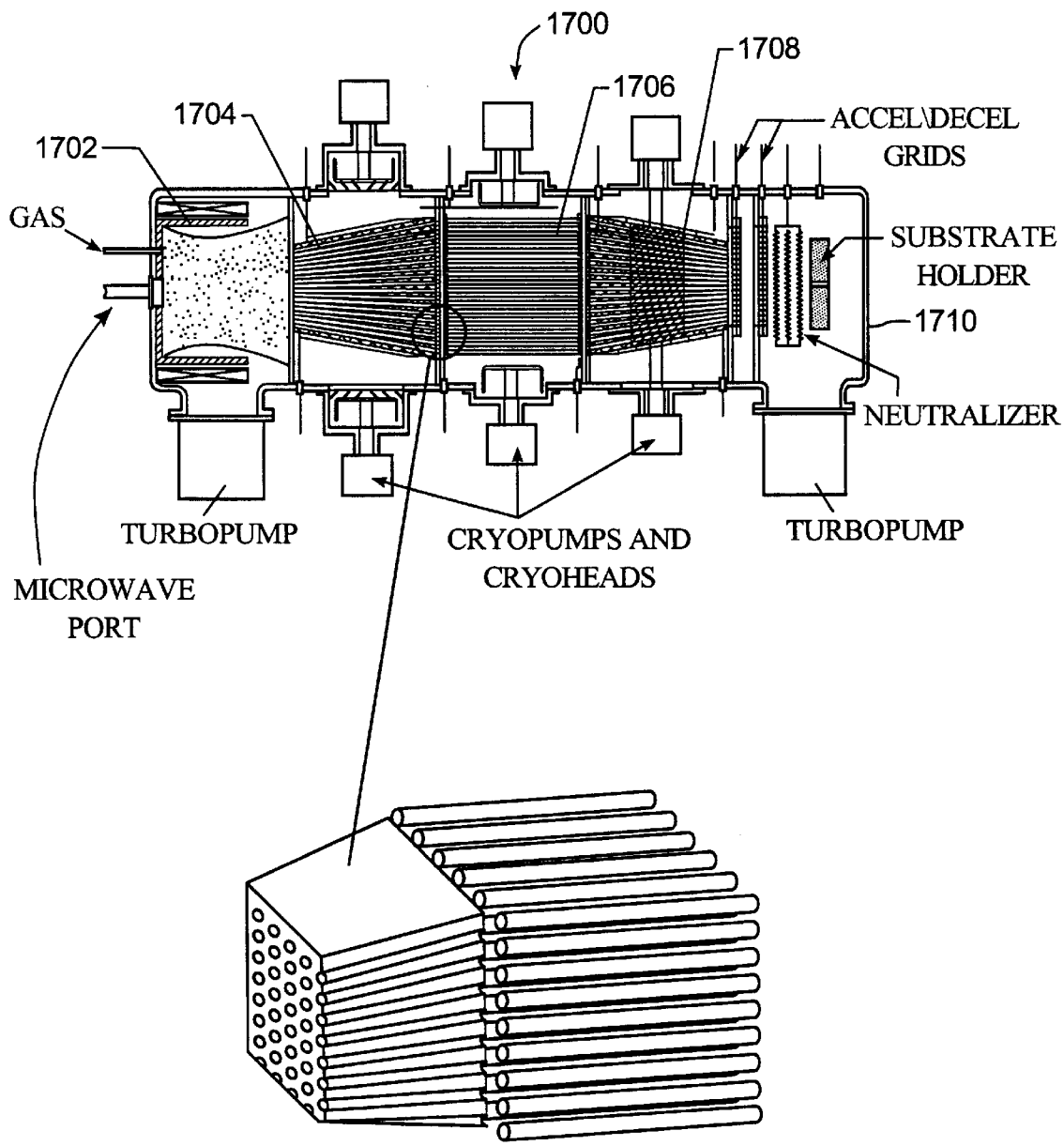
FIG. 17 shows a thin film deposition device including ion processing and quadrupole array units.

FIG. 17 shows a thin film deposition device including ion processing and quadrupole array units. A thin film deposition device 1700 includes an ion source 1702, an ion processing unit 1704, a quadrupole array 1706, an ion processing unit 1708, and deposition unit 1710. In a preferred embodiment, the ion source is a broad beam Electron Cyclotron Resonance (ECR) ion source. Ion processing unit 1704 acts as an interface between the ion source and the quadrupole array and serves to generate a uniform ion flux through all channels. This interface is described in more detail in reference to FIGS. 7A and 7B.

Ion processing units 1704 and 1708 act as ion buffers and quadrupole array 1706 performs the mass selection and transport of the ion species. Ion processing unit 1708 receives ion beams from the quadrupole array and generates ion beams with a denser packing pattern for thin film deposition.

An important process occurring in this operation is ion density equalization. Most broad beam ion sources do not provide a uniform distribution (ions or plasma) across the desired beam diameter. As long as the ion flux achievable at the buffer entrance is greater than at the exit, then each buffer channel will fill with a similar ion density distribution. The result is an equalization across the exit face of the buffer ion processing unit.

One form of mass selection has already been discussed in connection with the quadrupole array. In the present invention, a mode of mass selection to selectively eject ions of unwanted mass by the application of frequencies corresponding to the ion secular frequency in an Rf field is disclosed. This technique is applicable to linear trapping fields in both the quadrupole array and in the ion processing unit. For simplicity, these devices will now be referred to as mass selection units.

Figure 18:
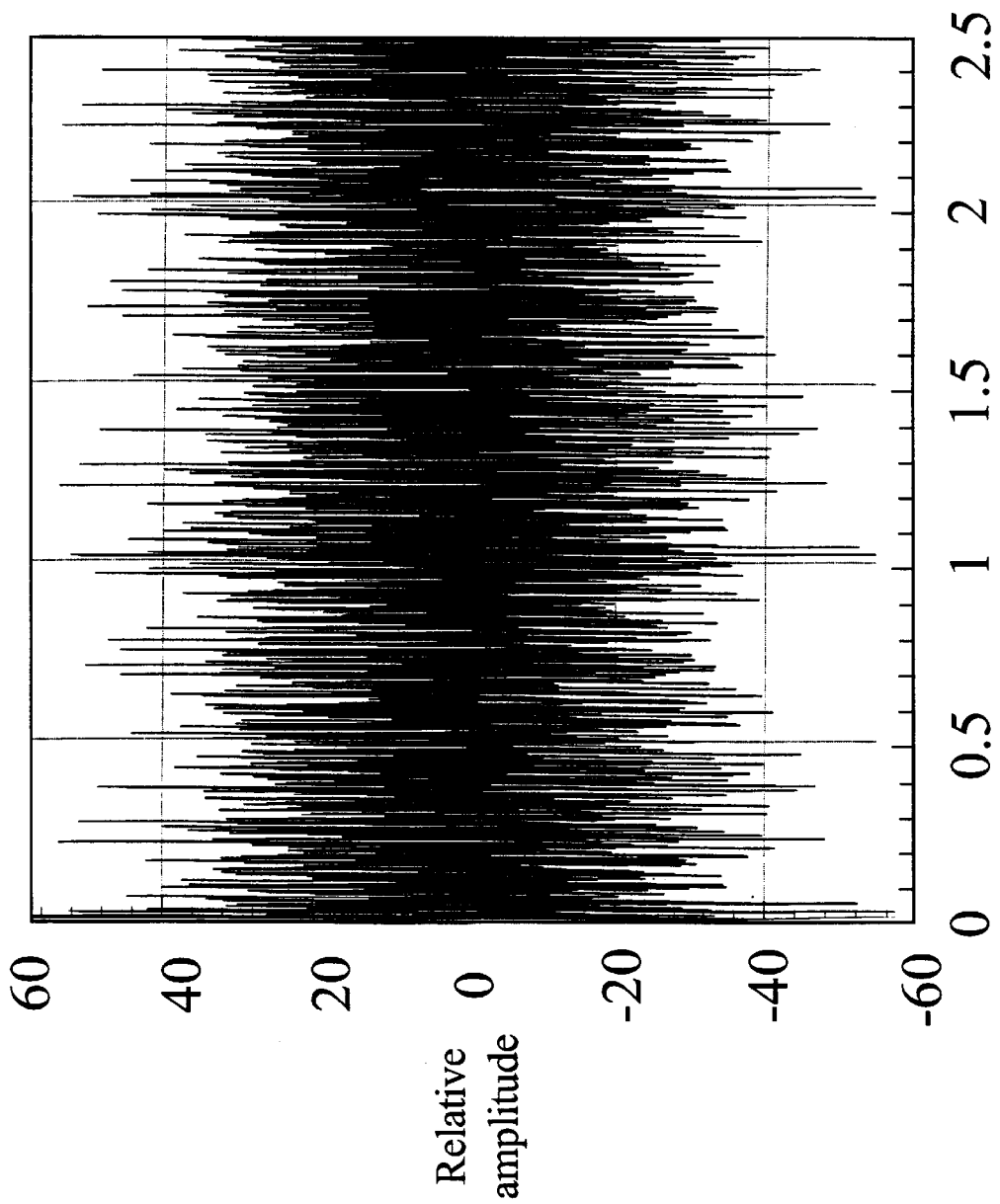
FIG. 18 shows an excitation waveform in the time domain.
Figure 19:
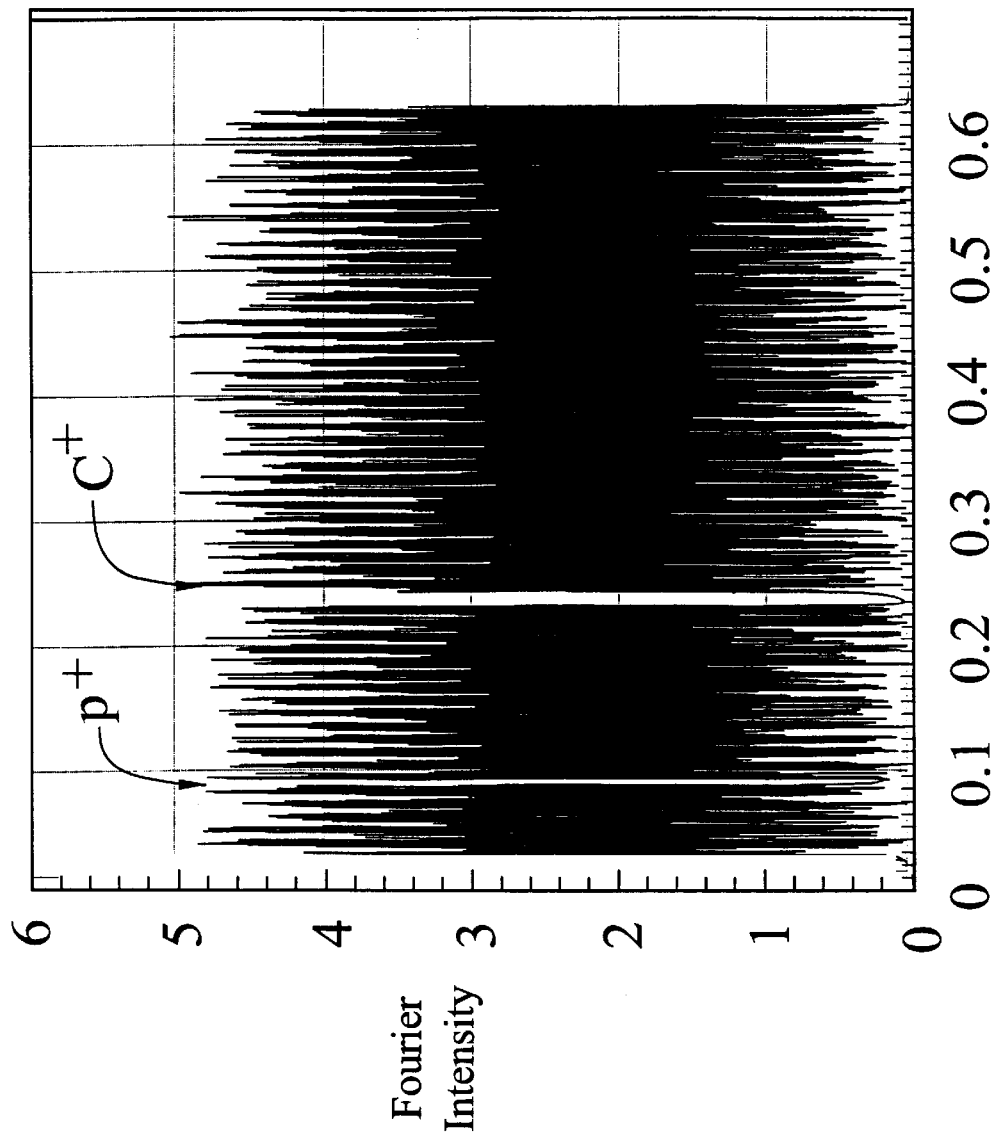
FIG. 19 shows an excitation waveform in the frequency domain.
Figure 20:
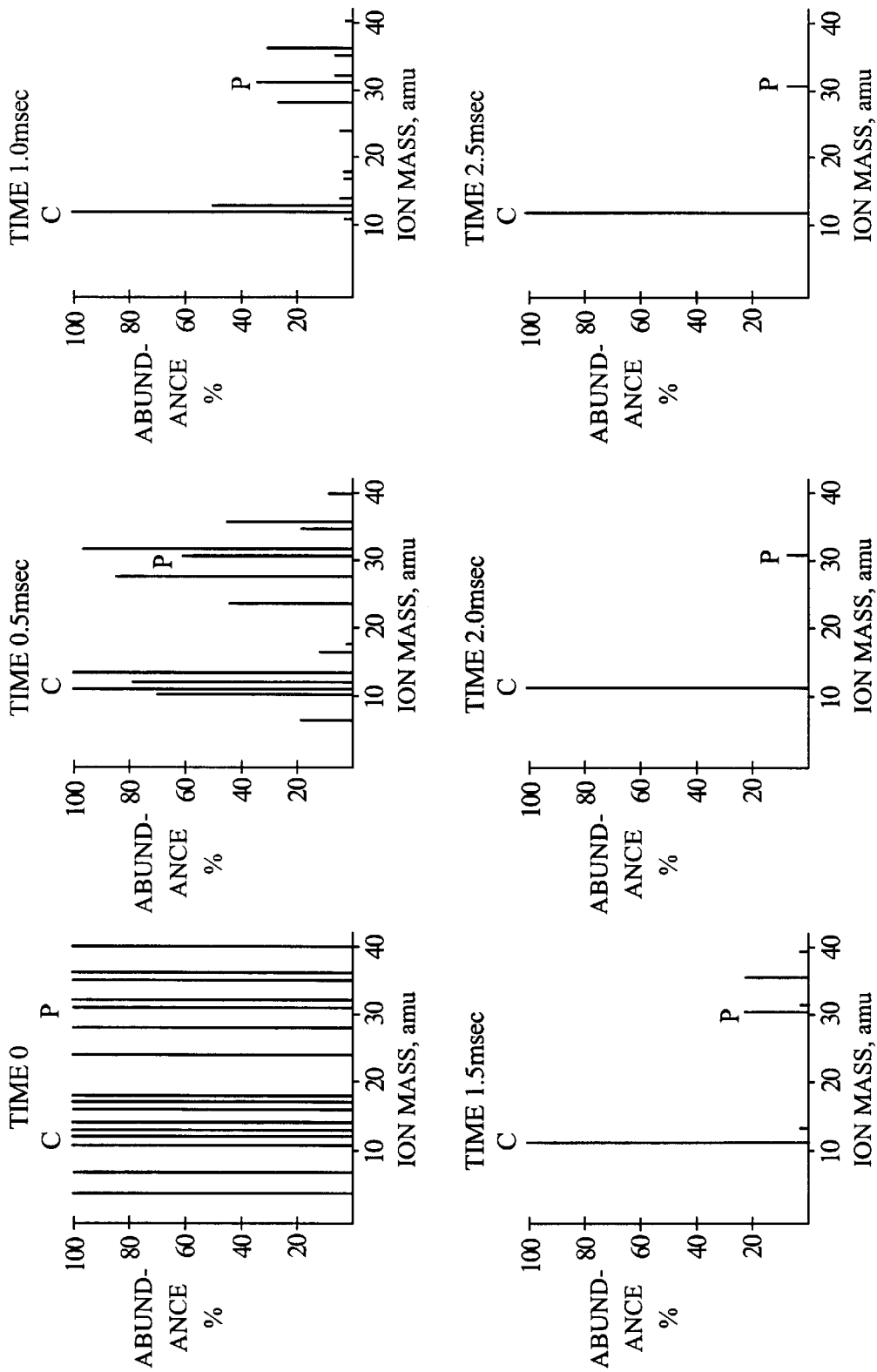
FIG. 20 is a mass spectrum sequence showing the relative distribution of masses in time after the application of the excitation waveform.

In the present invention, the mass selection unit are operated in Rf-only mode. To eject undesired ions, an excitation frequency is applied to the Rf (see FIG. 13A). FIGS. 18, 19 and 20 include theoretical calculations to demonstrate selected ejection of arbitrary ion masses from a quadrupole array. FIG. 18 shows an excitation waveform in the time domain. The Rf and superimposed excitation waveform are applied to the quadrupole array to perform mass selection. FIG. 19 shows the excitation waveform in the frequency domain. As shown, there is a $P^+$ and a $C^+$ notch in the frequencies. Ions that are stable when the excitation waveform is applied to the electrodes of the quadrupole array will be selected. Ions that are unstable will be removed from the quadrupole array (e.g., neutralized upon impact with an electrode). As shown, there are two notches in the waveform. These absent frequencies correspond to the secular frequencies of $C^+$ and $P^+$ ions. The absence of the frequencies means that $C^+$ and $P^+$ are not excited and are not ejected.

FIG. 20 shows a mass spectrum sequence illustrating the relative distribution of masses in time with the excitation waveform in FIGS. 18 and 19. The relative width of the notch in the frequency allows specific ratios of ions to be mass selected. In this example, some, but not all, of the $P^+$ ions are ejected because of the narrowness of the notch. The $C^+$ notch is broad and all $C^+$ ions pass unexcited. At time 0; particles of the indicated ion masses are injected from ion processing unit into quadrupole array (1704 and 1706 in FIG. 17, respectively). After the excitation waveform is applied, the abundance of non-selected ions quickly decreases. At time 2.5 msec, all of the carbon ions and some of the phosphorus ions remain. Thus, the width of the frequency notch allows specific ratios of ions to be mass selected. Although this technique has been discussed in reference to a numerical simulation of a 2D quadrupole field, the technique may be similarly applied to the 3D fields in the ion processing unit to perform mass selection.

Ion acceleration of the mass selected ions can be achieved though electrostatic acceleration at the exit of the final ion buffer. Ions may also be accelerated by moving transverse barriers within the ion processing unit. Ions of constant velocity or constant energy can thus be achieved. A significant advantage of ion acceleration by the ion processing unit is the absence of high DC voltage acceleration elements typical in conventional methods.

V. Neutral Gas Pumping and Trapping

In thin film deposition, the presence of background gas in the deposition region is not desired. As shown in FIGS. 14 and 17, vacuum pumps including diffusion, turbo, and cryo normal to the ion optic axis may be utilized to remove undesirable particles. However, because of the low aspect ratio between the ion source and substrate, the vacuum pumps may not sufficiently lower the pressure (pressures of $10^{-8}$ torr and lower are generally required). Therefore, the ion processing units themselves may provide additional functionally to remove undesirable particles.

A. Angular Momentum Assisted Diffusion

Figure 21A:
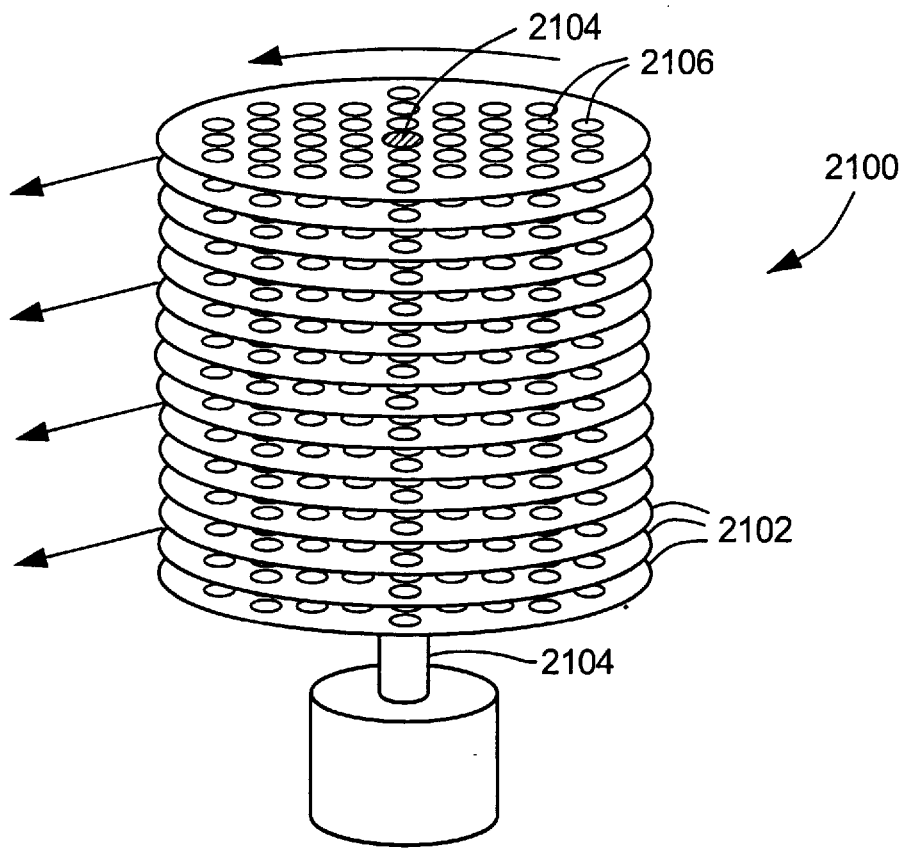
FIG. 21A shows a side view of an ion processing unit with angular momentum assisted diffusion and FIG. 21B shows a top view of the ion processing unit of FIG. 21A.

FIG. 21A shows a side view of an ion processing unit with angular momentum assisted diffusion. An ion processing unit 2100 includes planar electrode sheets 2102. The electrode sheets are stacked on a central shaft 2104 and define ion conducting channels 2106 as described earlier. Ions may be introduced into the ion processing unit from either an external or internal ion source.

Figure 21B:
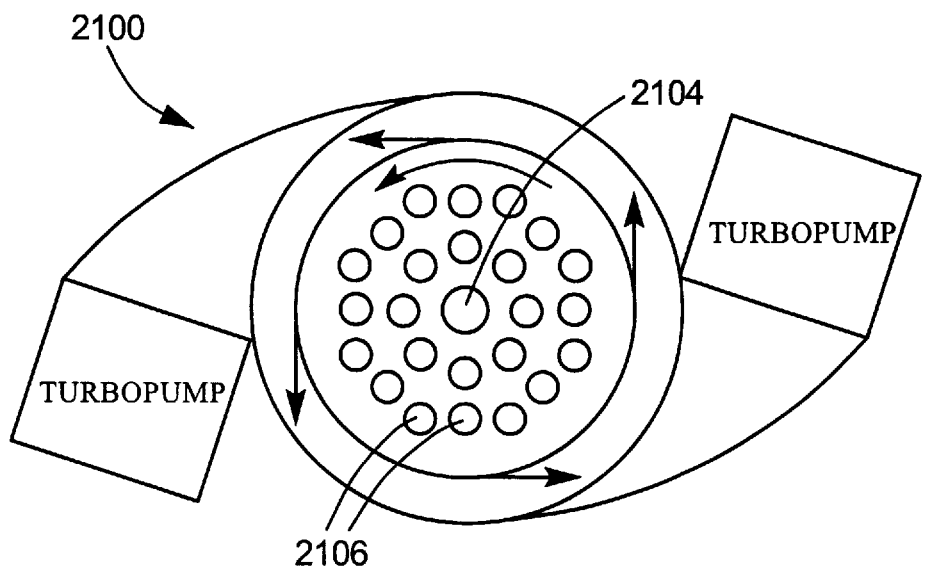

FIG. 21B shows a top view of the ion processing unit of FIG. 21A. The electrode sheets are rotated about the central shaft so that undesirable particles exit the ion conducting channels by successive tangential acceleration following collision with members of the rotating ion processing unit. As shown, undesirable particles are extracted by turbo pumps. Ion species will be retained in the ion conducting channels by the electric fields generated by electric voltages applied to the electrode sheets.

Angular momentum assisted diffusion allows for higher source pressures and hence more intense ion beams without deleterious effects of neutral gas contamination of the substrate. In addition, more intense beams formed by successive charge transfer reactions may be generated.

In a preferred embodiment, the electrode sheets are fabricated from Titanium for rotational strength. To supply the Rf drive voltages to the ion processing unit a special shaft design may be used. FIG. 22 illustrates a central shaft that supports the electrode sheets and allows application of electric voltages. A metal core shaft 2202 is shown coated with an insulating layer 2204. Strips of metal 2206 are deposited along the shaft on the isolating layer and covered with a top layer of isolation. Flat metal rings 2208 are deposited on the top insulating layer. Each metal ring is connected thorough the hole in the isolation to an end of a corresponding strip 2206. The other end of the each strip is connected through a hole in the isolation layer to at least one electrode sheet 2102.

Ball bearings 2210 are electrically connected to the metal rings. Electric voltages from a Rf amplifier or other electronic device are applied to the electrode sheets through the ball bearings, metal rings, and strips.

Some numerical parameters for rotational speeds of 100, 000 RPM and a radius of 15 cm are given for mass 28 in the following table:

| Radius cm | Velocity m/sec | Energy eV | Tangential/ Thermal Velocity |
|---|---|---|---|
| 1 | 104 | 0.002 | 0.06 |
| 2 | 209 | 0.006 | 0.20 |
| 3 | 314 | 0.014 | 0.47 |
| 4 | 418 | 0.025 | 0.77 |
| 5 | 523 | 0.039 | 1.3 |
| 6 | 628 | 0.057 | 1.9 |
| 7 | 733 | 0.078 | 2.6 |
| 8 | 837 | 0.102 | 3.4 |
| 9 | 943 | 0.129 | 4.3 |
| 10 | 1046 | 0.158 | 5.3 |
| 11 | 1151 | 0.193 | 6.4 |
| 12 | 1256 | 0.229 | 7.6 |
| 13 | 1361 | 0.268 | 8.9 |
| 14 | 1465 | 0.310 | 10.3 |
| 15 | 1570 | 0.357 | 11.9 |

The table shows the rotational parameters as a function of the radius. For example, relative to a neutral molecule of 28 AMU at thermal velocity (300 K), the tangential velocity a radius of 5 cm is slightly greater than the most probable thermal velocity (523 m/sec which is equivalent to 361 K). At the outer radial edge of 15 cm, the tangential velocity is 1,570 m/sec, which is an order of magnitude greater than thermal velocity. Neutrals which strike the revolving surfaces will leave the surface with a random velocity component equivalent to the thermal temperature of the surface and a tangential component $V = \omega \cdot r$ where $\omega$ is the angular velocity in radians per second and r is the radius at that point.

Neutrals which are external to the rotating ion processing unit cannot reenter without a substantial gain in velocity tangential to the revolving system. Thus, once neutrals leave the structure they generally do not reenter. Neutrals inside the structure are continually statistically re-partitioned over the available surface area. This area is skewed towards higher angular velocity. Beyond a boundary defined by the molecular weight and the rotational velocity, the tangential velocity will be greater than the thermal velocity. The neutrals are thus actively depleted by transfer of angular momentum to linear momentum tangential to the rotating system.

Figure 23:
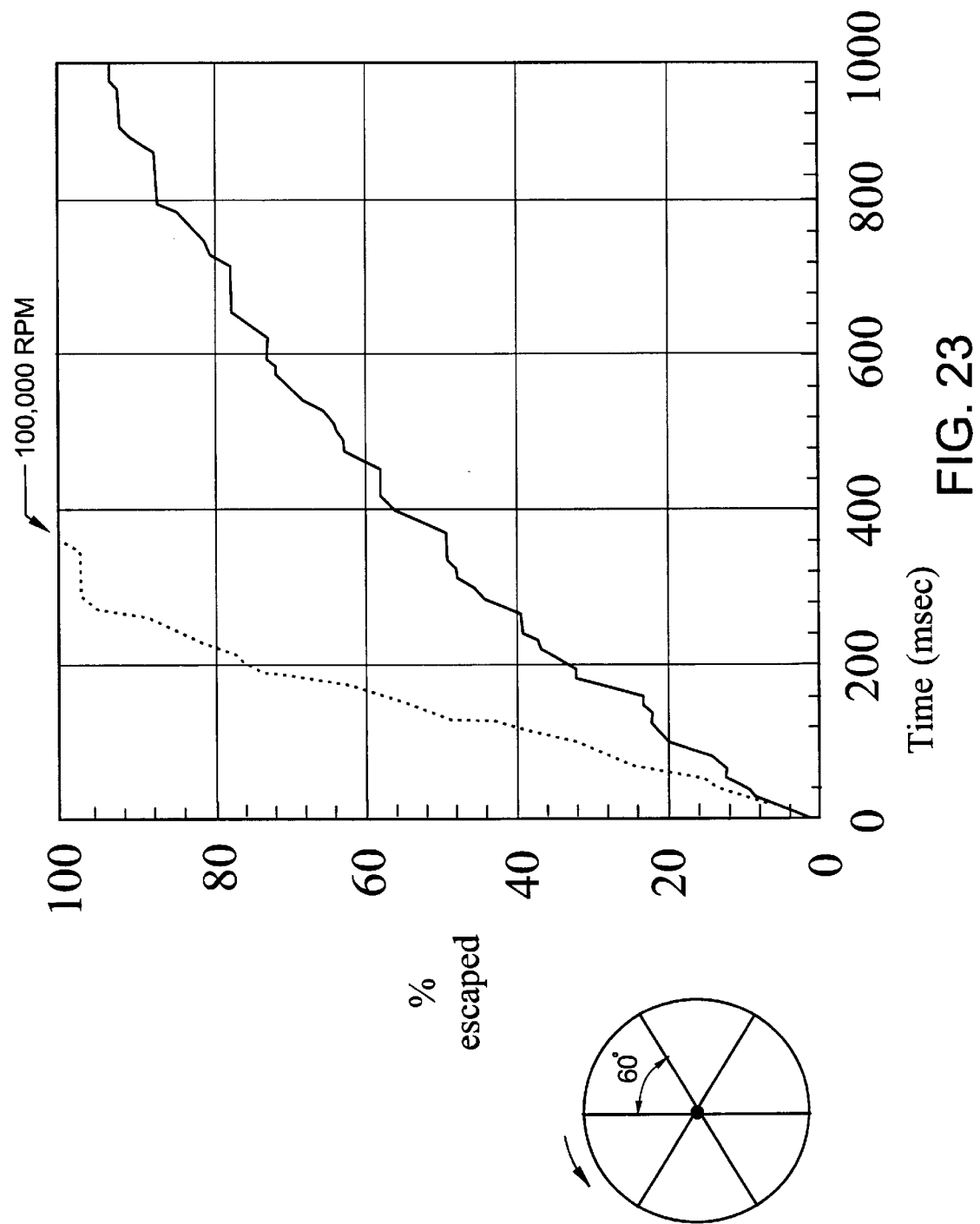
FIG. 23 shows a graph of the time dependent depletion of angular momentum assisted diffusion with radial spacers deployed at 6°.

Within a boundary, the neutrals are depleted by thermal diffusion. For example, the diffusion controlled region is 50 cm² compared to the angular momentum depleted region of 656 cm². FIG. 23 shows a graph of the time dependent depletion. The graph contrasts angular momentum assisted diffusion with similar curves at 0 revolutions per minute (rpms). The graph shows that a rotation speed of 100,000 rpms significantly increases the speed at which a high percentage of neutrals are removed from the ion processing unit.

The graph of FIG. 23 was developed by molecular dynamics simulations taking into account collisions with rotating surfaces. The rotating surfaces were considered as planes that are in parallel to Z-axis of rotation. After collision particle gain a random thermal velocity vector which is directed from the surface and has fixed absolute value in rotational frame. The magnitude of the random component of V is defined from the conditions $0.5 \, mv^2 = 2/3E$ where m is the mass of the particle and E is thermal energy (i.e., the surface temperature of the rotating ion processing unit). In the simulation m is equal to 28 amu, E is near thermal (0.03 eV) and only a two-dimensional picture in the x-y plane is analyzed. The latter explains the coefficient 2/3 in the above plane.

Initially, 1000 particles are distributed randomly with uniform velocity density in area with maximal radius r=150 mm. A particle is considered as escaped when its radius, as a result of evolution, becomes larger that r. In the simulation, the area included barrier lines through the axis of rotation at 60° angles. FIG. 23 shows results of calculations with solid line for planes at rest and dotted lines for an angular frequency of 100,000 rpms. As shown, the rotation significantly increases the rate of escape.

Figure 24:
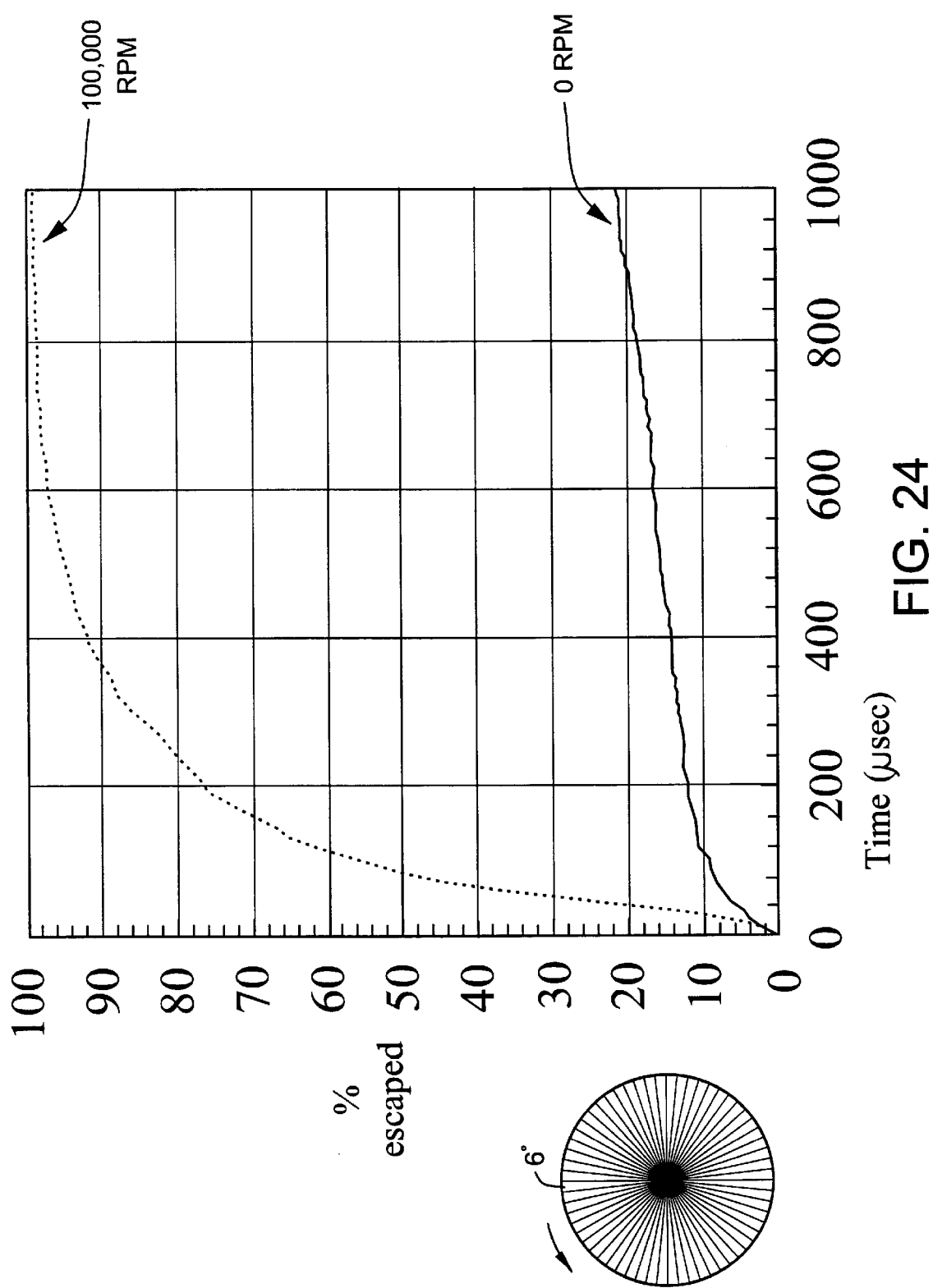
FIG. 24 shows a graph of the time dependent depletion of angular momentum assisted diffusion with radial spacers deployed at 60°.

FIG. 24 shows a graph of the time dependent depletion of neutrals from the ion processing unit by angular momentum assisted diffusion. In this simulation, the area included barrier lines through the axis of rotation at 6° angles. More surface area is available in the 6° case than in the 60° case. FIG. 24 illustrates that the neutral is statistically partitioned over a greater surface area and hence will remain in the ion processing unit a longer amount of time.

Figures 25A, 25C:
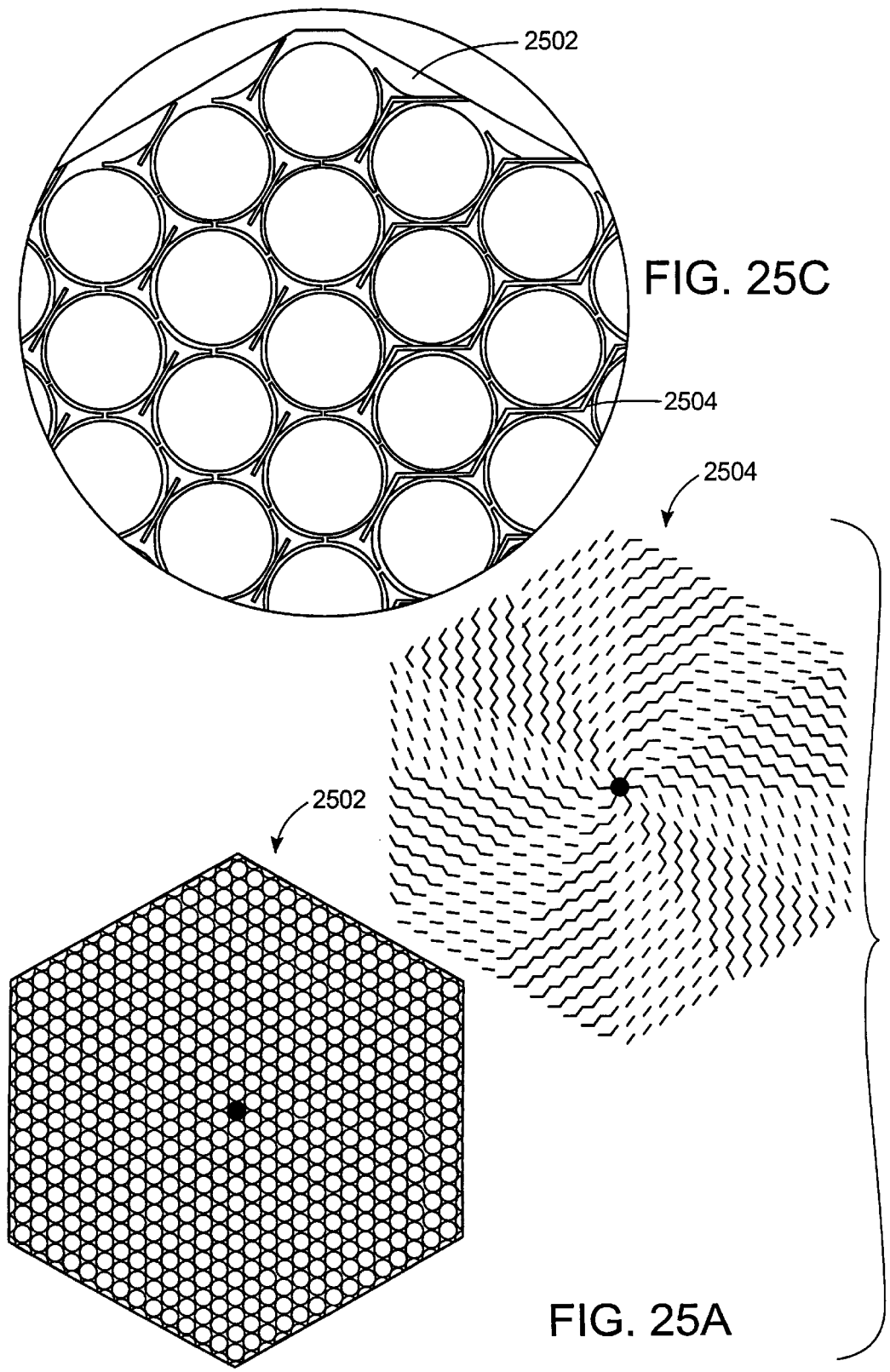

FIG. 25A shows electrode sheets in another configuration to aid particle escape during rotation. An electrode sheet 2502 includes insulating spacers 2504 which deflect neutral particles out of the ion processing unit. Gas located near the central axis at the bottom of the device are stepwise accelerated by successive collisions with the insulating spacers that substantially aid the tangential removal of neutral particles.

FIG. 25B shows the trajectory of a particle as it exits the ion processing unit. Only insulating spacers 2510 are shown for simplicity. A neutral particle trajectory is shown to demonstrate that the particle elimination will increase as the particles near the periphery of the ion processing unit.

B. Cryocondensation

For film deposition devices where the pressure in the last ion processing unit is sufficiently low, the last ion processing unit may be operated at sufficiently low temperatures such that appropriate neutrals can be directly cryocondensed on the electrode elements providing a substantial pressure drop prior to the ion deposition region. FIG. 17 shows the last ion processing unit 1708 in conjunction with a cryocondensation device.

FIG. 26 shows a cryocondensation device utilized with an ion processing unit. A two stage cryopump is utilized to remove the heat. The first stage chills a region 2602 outside the ion processing unit to near liquid nitrogen temperature. The second stage cools the ion processing unit even more. In a preferred embodiment, a gold plated copper lens element is thermally bonded to the second stage with a temperature of less than 20 K. Spacers for the grids are preferably formed from type MT Kapton (DuPont) with efficient heat transfer properties.

VI. Thin Film Ion Deposition

Figure 27:
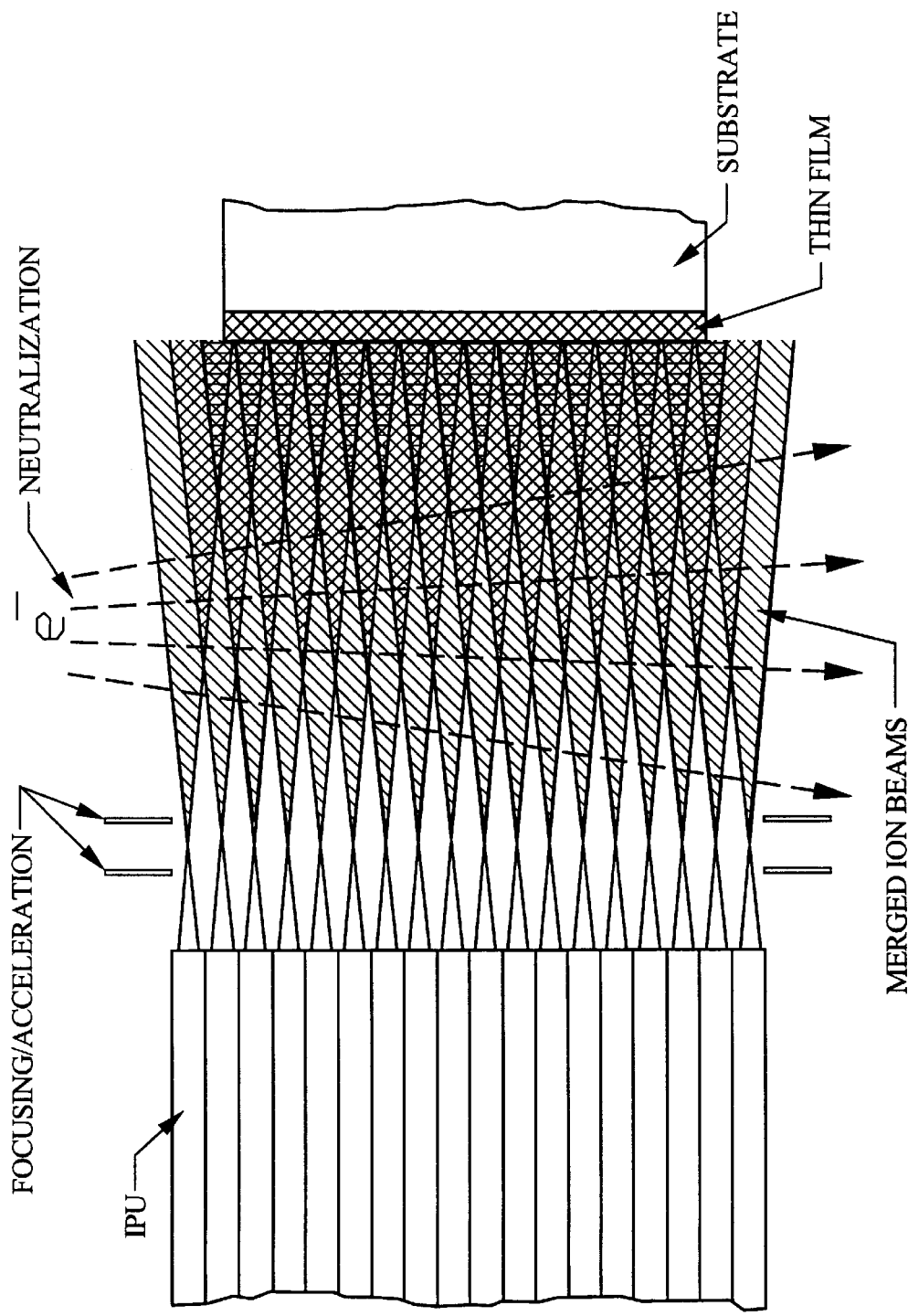
FIG. 27 illustrates a process of deposition of ions exiting an ion processing unit.
Figure 28:
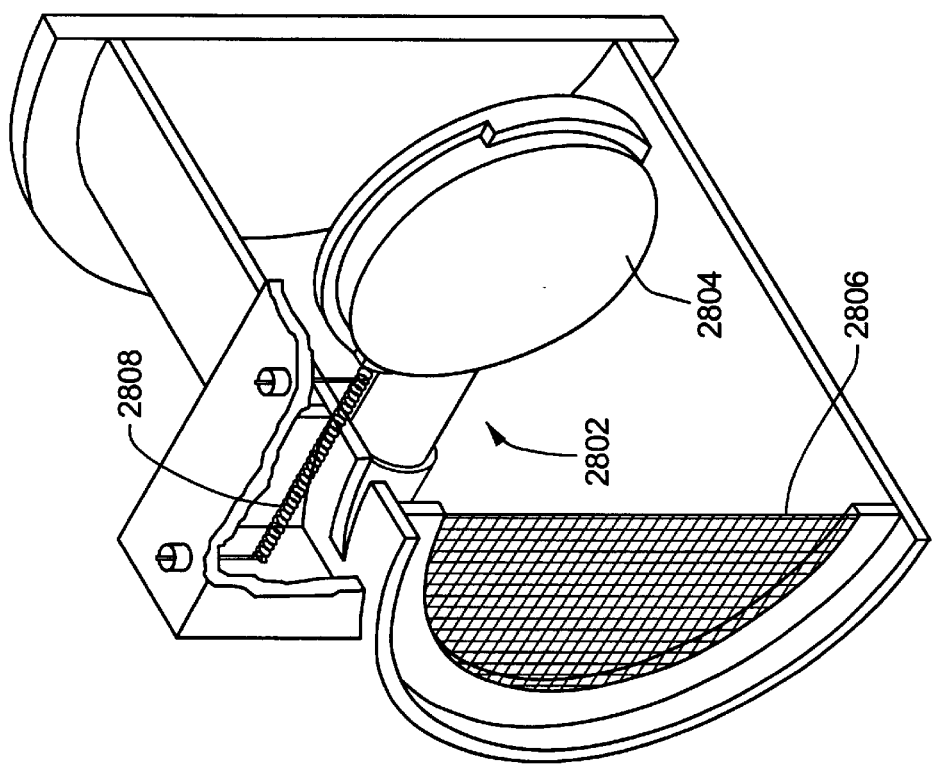
FIG. 28 shows a substrate holder.

The present invention may be utilized to produce ion streams for thin film deposition that cannot be produced by conventional systems. FIG. 27 illustrates a process of deposition of ions exiting an ion processing unit. Ions exiting the ion processing unit may optionally be focused and/or accelerated as shown. Electron beams may also be utilized to neutralize the ions before they are deposited as a thin film on a substrate. FIG. 28 shows a substrate holder 2802 holding a substrate 2804. Acceleration/deceleration grid 2806 is utilized to control the velocity of the ions after they exit an ion processing unit. A filament 2808 produces electrons to neutralize the ions before they are deposited on or implanted into a substrate. The filament is located in a separate chamber to reduce contamination.

Figure 29:
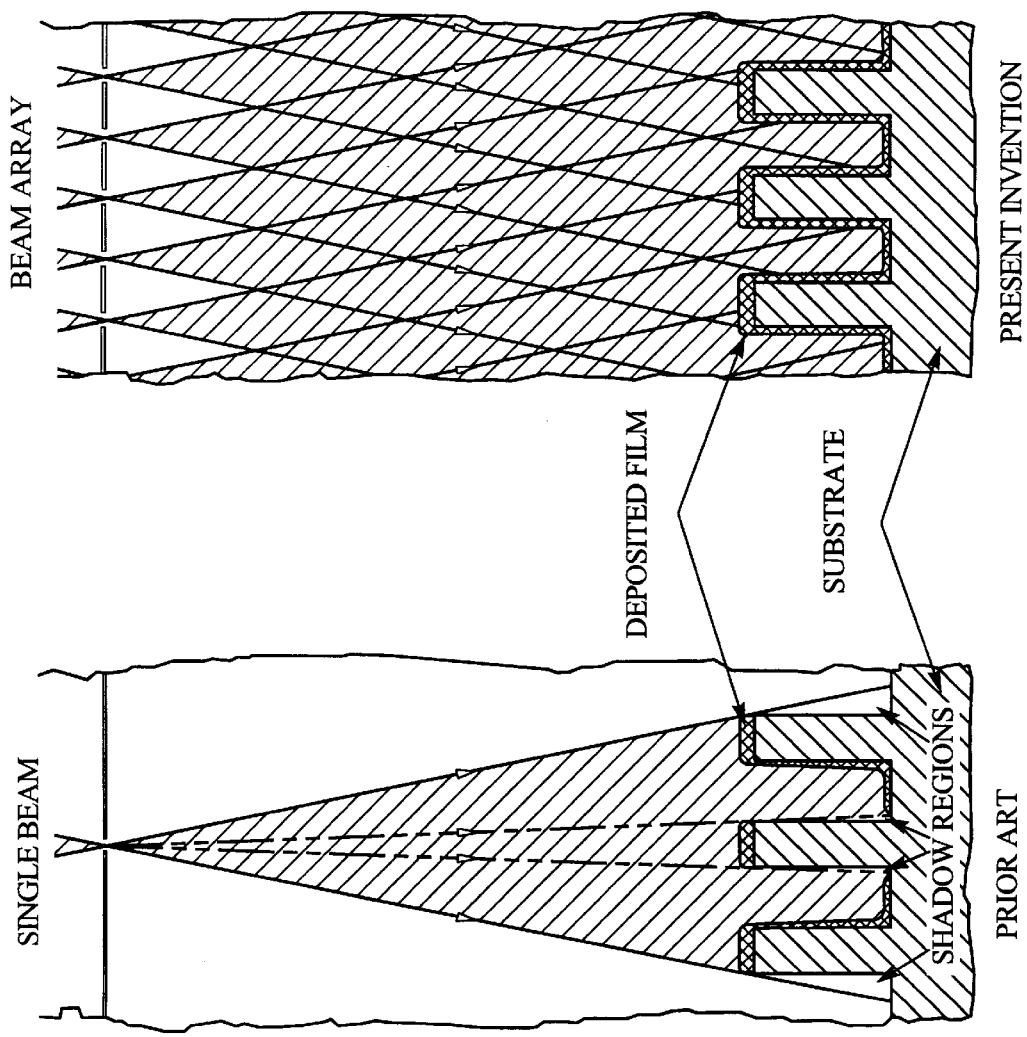
FIG. 29 shows the advantages of multiple ion beam deposition.

FIG. 29 shows the advantages of multiple ion beam deposition. As shown, a single ion beam does not provide the conformal coating that the multiple ion beams of the present invention provide.

All published documents including articles and patents cited in this application are hereby incorporated by reference for all purposes.

The various embodiments described above may now be combined in various ways to construct any number of application specific systems. Applications for thin film deposition and ion implantation as well as mass spectrometry, analytical and others, are included. While the above is a complete description of the preferred embodiments of the invention, various alternatives, modifications and equivalents may be used. It should be evident that the present invention is equally applicable by making appropriate modifications to the embodiments described above. Therefore, the above description should not be taken as limiting the scope of the invention which is defined by the metes and bounds of the appended claims.

What is claimed is:

1. An apparatus for irradiating a substrate with ions, comprising:

an ion source;

a plurality of first electrode sheets having openings, said electrode sheets aligned substantially parallel such that said openings in said electrode sheets define a plurality of ion channels, each ion channel being defined by an opening in each of said plurality of electrode sheets;

a plurality of spacers coupled between adjacent electrode sheets;

a substrate support that supports said substrate;

a vacuum enclosure enclosing said ion source, said electrode sheets, said spacers, and said substrate support; and an electronic device coupled to said electrode sheets, said electronic device selectively applying voltages to said electrode sheets in order to translate ions in said ion channels;

wherein ions from said ion source are translated through said ion channels to irradiate said substrate.

2. The apparatus of claim 1, wherein said ions are deposited as a thin film on said substrate.

3. The apparatus of claim 1, wherein said ions are implanted into said substrate.

4. The apparatus of claim 1, wherein said spacers are insulating sheets having openings and said spacers are positioned between adjacent ion channels.

5. The apparatus of claim 1, wherein said spacers include individual spacer elements between adjacent electrode sheets and said spacers are positioned between adjacent ion channels.

6. The apparatus of claim 1, wherein said ion channels are curved.

7. The apparatus of claim 1, wherein said ion channels have a first packing pattern at one end and a second packing pattern at another end.

8. The apparatus of claim 1, further comprising at least one electrode sheet having a plurality of electrical connections, each electrical connection being electrically coupled to conductive material of said at least one electrode sheet bounding a subset of said openings.

9. The apparatus of claim 8, wherein said at least one electrode sheet is a multilayer board having plated through holes bounding said openings.

10. The apparatus of claim 1, wherein a plurality of openings in an electrode sheet correspond with an opening in an adjacent electrode sheet, whereby a plurality of ion channels become a single ion channel.

11. The apparatus of claim 1, further comprising a gas manifold that has openings into selected ion channels, whereby gas is injected into said selected ion channels through said openings.

12. The apparatus of claim 11, wherein said gas manifold comprises:
    a first layer having openings corresponding to said ion channels and rows of gas channels between rows of said openings in said first layer; and
    a second layer having openings corresponding to said ion channels and rows of gas channels between rows of said openings in said first layer, said rows of said second layer being nonparallel to said rows of said first layer, and at least one of said openings in said second layer extending to a row of said first layer.

13. The apparatus of claim 1, further comprising an array of electrodes, said electrodes of said array being substantially parallel to said ion channels and said ion channels extend between said electrodes of said array.

14. The apparatus of claim 13, further comprising a plurality of second electrode sheets having openings, said second electrode sheets aligned substantially parallel such that said ion channels from said array of electrodes extend into said openings in said second electrode sheets.

15. The apparatus of claim 1, wherein said ion channels formed by said second electrode sheets have a first packing pattern at one end and a second packing pattern at another end near said array of electrodes.

16. The apparatus of claim 1, wherein said ion channels are more densely packed at one end than another end.

17. The apparatus of claim 1, further comprising a plurality of ion sources.

18. The apparatus of claim 17, wherein there is a 1:1 correspondence of said ion sources to said ion channels, wherein each ion source provides ions to a respective ion channel.

19. The apparatus of claim 1, further comprising:
    a shaft, said plurality of first electrode sheets being coupled to said shaft; and
    a motor that rotates said shaft.

20. The apparatus of claim 1, further comprising a cryocondensation device to lower the temperature of said plurality of first electrode sheets.

21. An apparatus for manipulating ions, comprising:
    a plurality of electrode sheets having openings, said electrode sheets aligned substantially parallel such that said openings in said electrode sheets define a plurality of ion channels, each ion channel being defined by an opening in each of said plurality of electrode sheets;
    a plurality of spacers coupled between adjacent electrode sheets, said spacers positioned between adjacent ion channels; and
    an electronic device coupled to said electrode sheets, said electronic device selectively applying voltages to said electrode sheets in order to manipulate ions in said ion channels.

22. The apparatus of claim 21, wherein said spacers are insulating sheets having openings.

23. The apparatus of claim 21, wherein said spacers include individual spacer elements between adjacent electrode sheets.

24. The apparatus of claim 21, wherein said spacers include Kapton.

25. An apparatus for manipulating ions, comprising:
    a plurality of electrode sheets having openings, said electrode sheets aligned substantially parallel such that said openings in said electrode sheets define a plurality of curved ion channels, each curved ion channel being defined by an opening in each of said plurality of electrode sheets; and
    an electronic device coupled to said electrode sheets, said electronic device selectively applying voltages to said electrode sheets in order to manipulate ions in said curved ion channels.

26. The apparatus of claim 25, further comprising a plurality of insulating sheets having openings and positioned between adjacent curved ion channels.

27. The apparatus of claim 25, further comprising individual spacer elements between adjacent electrode sheets and positioned between adjacent curved ion channels.

28. An apparatus for manipulating ions, comprising:
    a plurality of electrode sheets having openings, said electrode sheets aligned substantially parallel such that said openings in said electrode sheets define a plurality of ion channels, each ion channel being defined by an opening in each of said plurality of electrode sheets;
    said ion channels having a first packing pattern at one end and a second packing pattern at another end; and
    an electronic device coupled to said electrode sheets, said electronic device selectively applying voltages to said electrode sheets in order to manipulate ions in said ion channels.

29. The apparatus of claim 28, wherein said ion channels are more densely packed at said one end than said another end.

30. The apparatus of claim 28, wherein said second packing pattern allows said ion channels to extend into an array of electrodes, said electrodes of said array being substantially parallel to said ion channels.

31. An apparatus for manipulating ions, comprising:
    a plurality of electrode sheets having openings, said electrode sheets aligned substantially parallel such that said openings in said electrode sheets define a plurality of ion channels, each ion channel being defined by an opening in each of said plurality of electrode sheets;
    said ion channels being more densely packed at one end than another end; and
    an electronic device coupled to said electrode sheets, said electronic device selectively applying voltages to said electrode sheets in order to manipulate ions in said ion channels.

32. The apparatus of claim 31, wherein said ion channels have a first packing pattern at said one end and a second packing pattern at said another end.

33. The apparatus of claim 31, wherein said second packing pattern allows said ion channels to extend into an array of electrodes, said electrodes of said array being substantially parallel to said ion channels.

34. An apparatus for manipulating ions, comprising:
a plurality of electrode sheets having openings, said electrode sheets aligned substantially parallel such that said openings in said electrode sheets define a plurality of ion channels, each ion channel being defined by an opening in each of said plurality of electrode sheets;
at least one electrode sheet having a plurality of electrical connections, each electrical connection being electrically coupled to conductive material of said at least one electrode sheet bounding a subset of openings; and
an electronic device coupled to said electrode sheets, said electronic device selectively applying voltages to said electrode sheets in order to manipulate ions in said ion channels.

35. The apparatus of claim 34, wherein said at least one electrode sheet is a multilayer board having plated through holes defining openings.

36. An apparatus for manipulating ions, comprising:
a plurality of electrode sheets having openings, said electrode sheets aligned substantially parallel such that said openings in said electrode sheets define a plurality of ion channels, each ion channel being defined by an opening in each of said plurality of electrode sheets;
a plurality of openings in an electrode sheet correspond with an opening in an adjacent electrode sheet, whereby a plurality of ion channels become a single ion channel; and
an electronic device coupled to said electrode sheets, said electronic device selectively applying voltages to said electrode sheets in order to manipulate ions in said ion channels.

37. The apparatus of claim 36, further comprising at least one electrode sheet having a plurality of electrical connections, each electrical connection being electrically coupled to conductive material of said at least one electrode sheet bounding a subset of openings.

38. The apparatus of claim 37, wherein said at least one electrode sheet is a multilayer board having plated through holes defining openings.

39. An apparatus for manipulating ions, comprising:
a plurality of electrode sheets having openings, said electrode sheets aligned substantially parallel such that said openings in said electrode sheets define a plurality of ion channels, each ion channel being defined by an opening in each of said plurality of electrode sheets;
a gas manifold having openings into selected ion channels, whereby gas is injected into said selected ion channels through said openings; and
an electronic device coupled to said electrode sheets, said electronic device selectively applying voltages to said electrode sheets in order to manipulate ions in said ion channels.

40. The apparatus of claim 39, wherein said gas manifold comprises:
a first layer having openings corresponding to said ion channels and rows of gas channels between rows of said openings in said first layer;
a second layer having openings corresponding to said ion channels and rows of gas channels between rows of said openings in said first layer, said rows of said second layer being nonparallel to said rows of said first layer, and at least one of said openings in said second layer extending to a row of said first layer.

41. An apparatus for manipulating ions, comprising:
a plurality of first electrode sheets having openings, said electrode sheets aligned substantially parallel such that said openings in said electrode sheets define a plurality of ion channels, each ion channel being defined by an opening in each of said plurality of electrode sheets;
an array of electrodes, said electrodes of said array being substantially parallel to said ion channels and said ion channels extend between said electrodes of said array; and
an electronic device coupled to said electrode sheets and said electrodes of said array, said electronic device selectively applying voltages to said electrode sheets and said electrodes in order to manipulate ions in said ion channels.

42. The apparatus of claim 41, wherein said ion channels formed by said electrode sheets have a first packing pattern at one end and a second packing pattern at another end near said array of electrodes.

43. The apparatus of claim 41, wherein said ion channels are more densely packed at one end than another end.

44. The apparatus of claim 41, further comprising a plurality of second electrode sheets having openings, said second electrode sheets aligned substantially parallel such that said ion channels from said array of electrodes extend into said openings in said second electrode sheets.

45. The apparatus of claim 44, wherein said ion channels formed by said second electrode sheets have a first packing pattern at one end and a second packing pattern at another end near said array of electrodes.

46. The apparatus of claim 44, wherein said ion channels are more densely packed at one end of said second electrode sheets than another end of said second electrode sheets.

47. An apparatus for manipulating ions, comprising:
a plurality of electrode sheets having openings, said electrode sheets aligned substantially parallel such that said openings in said electrode sheets define a plurality of ion channels, each ion channel being defined by an opening in each of said plurality of electrode sheets;
a rotatable shaft, said electrode sheets being coupled to said shaft such that said ion channels are substantially parallel to said shaft;
a motor coupled to said shaft to rotate said shaft; and
an electronic device coupled to said electrode sheets, said electronic device applying voltages to said electrode sheets to retain selected ions in said ion channels when said ion channels are rotated by said motor.

48. The apparatus of claim 47, further comprising a plurality of spacers coupled between adjacent electrode sheets, said spacers being in a pattern that facilitates the removal of particles other than said selected ions from said ion channels.

49. An apparatus for manipulating ions, comprising:
a plurality of electrode sheets having openings, said electrode sheets aligned substantially parallel such that said openings in said electrode sheets define a plurality of ion channels, each ion channel being defined by an opening in each of said plurality of electrode sheets;
a vacuum enclosure enclosing said electrode sheets;
a cryocondensation device to lower the temperature of said plurality of electrode sheets; and an electronic device coupled to said electrode sheets, said electronic device selectively applying voltages to said electrode sheets in order to manipulate ions in said ion channels.

50. A method of irradiating a substrate with an apparatus having an ion source, a plurality of electrode sheets each of which has a plurality of openings aligned parallel with openings in adjacent sheets defining a plurality of ion channels, with at least one spacer coupled between adjacent electrode sheets, a substrate support, a vacuum enclosure enclosing said ion source, said plurality of electrode sheets, said at least one spacer, and said substrate support, and an electronic device coupled to said electrode sheets, said electronic device adapted to selectively apply voltages to said plurality of electrode sheets in order to translate ions in said at least one ion channel, said method comprising the steps of:

moving ions through at least one ion channel; and directing said ions to irradiate said substrate.

51. The method of claim 50 further comprising the steps of:

selectively applying Rf voltages along said ion channels to generate inhomogeneous Rf fields; and said Rf fields translating ions from an ion source to said substrate through said ion channels in order to irradiate said substrate with ions.

52. The method of claim 51, wherein the ion channels are defined by a plurality of electrode sheets perpendicular to said ion channels.

53. The method of claim 51, wherein the step of translating includes the step of translating said ions along a curved path.

54. The method of claim 51, further comprising the step of selectively creating an electric field around an ion channel.

55. The method of claim 51, further comprising the step of merging said plurality of ion channels into one ion channel.

56. The method of claim 51, further comprising the step of splitting one of said plurality of ion channels into multiple ion channels.

57. The method of claim 51, further comprising the step of injecting gas into said plurality of ion channels.

58. The method of claim 51, further comprising the step of rotating said at least one of said plurality of ion channels about an axis.

59. The method of claim 51, wherein a substrate is positioned upon said substrate holder and further including a step of impacting ions from said ion source onto a relatively large area of said substrate.

60. A method of plasma ion extraction of ions from an ion source onto a substrate, comprising the steps of:

introducing a plasma into a plurality of ion channels;

selectively applying Rf voltages along said ion channels to generate inhomogeneous Rf fields; and said Rf fields extracting ions from said plasma.

61. The method of claim 60, wherein the ion channels are defined by a plurality of electrode sheets perpendicular to said ion channels.

62. The method of claim 61, wherein said ion channels are defined by openings in said electrode sheets.

63. The method of claim 60, wherein electrons are excited out of said plasma by said Rf fields.

64. The method of claim 60, further comprising the step of utilizing a vacuum to remove neutrals from said plasma in said ion channels.

* * * * *

UNITED STATES PATENT AND TRADEMARK OFFICE
CERTIFICATE OF CORRECTION

PATENT NO. : 5,811,820
DATED : September 22, 1998
INVENTOR(S) : Nicholas J. Kirchner, Felix G. Gutman, Oleg V. Alexandrov and Efim Dynin It is certified that error appears in the above-indentified patent and that said Letters Patent is hereby corrected as shown below:

Column 5, line 17, delete "4" and insert --4A--.

Figures 4A, 4B:
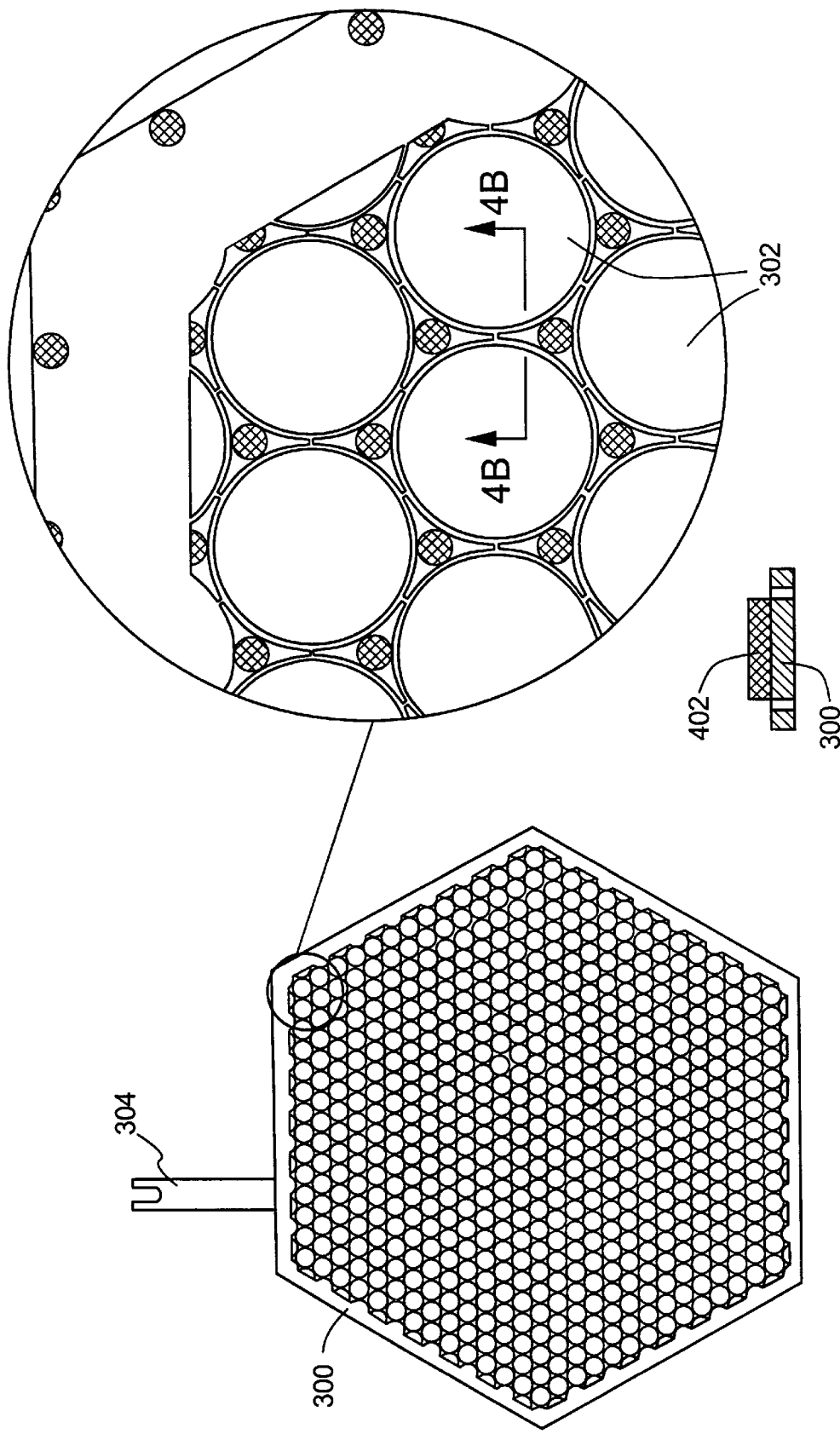
FIG. 4 shows another embodiment of an insulating spacer which is on a planar electrode sheet.

Column 5, line 19, insert the following new paragraph --FIG. 4B is a cross-sectional view of FIG. 4A taken along lines 4B-4B--.

Column 5, line 20, delete "5" and insert --5A--.

Column 5, line 22, insert the following new paragraph --FIG. 5B is a cross-sectional view of FIG. 5A taken along lines 5B-5B--.

Column 5, line 27, delete "8" and insert --8A--.

Figures 8A, 8B:
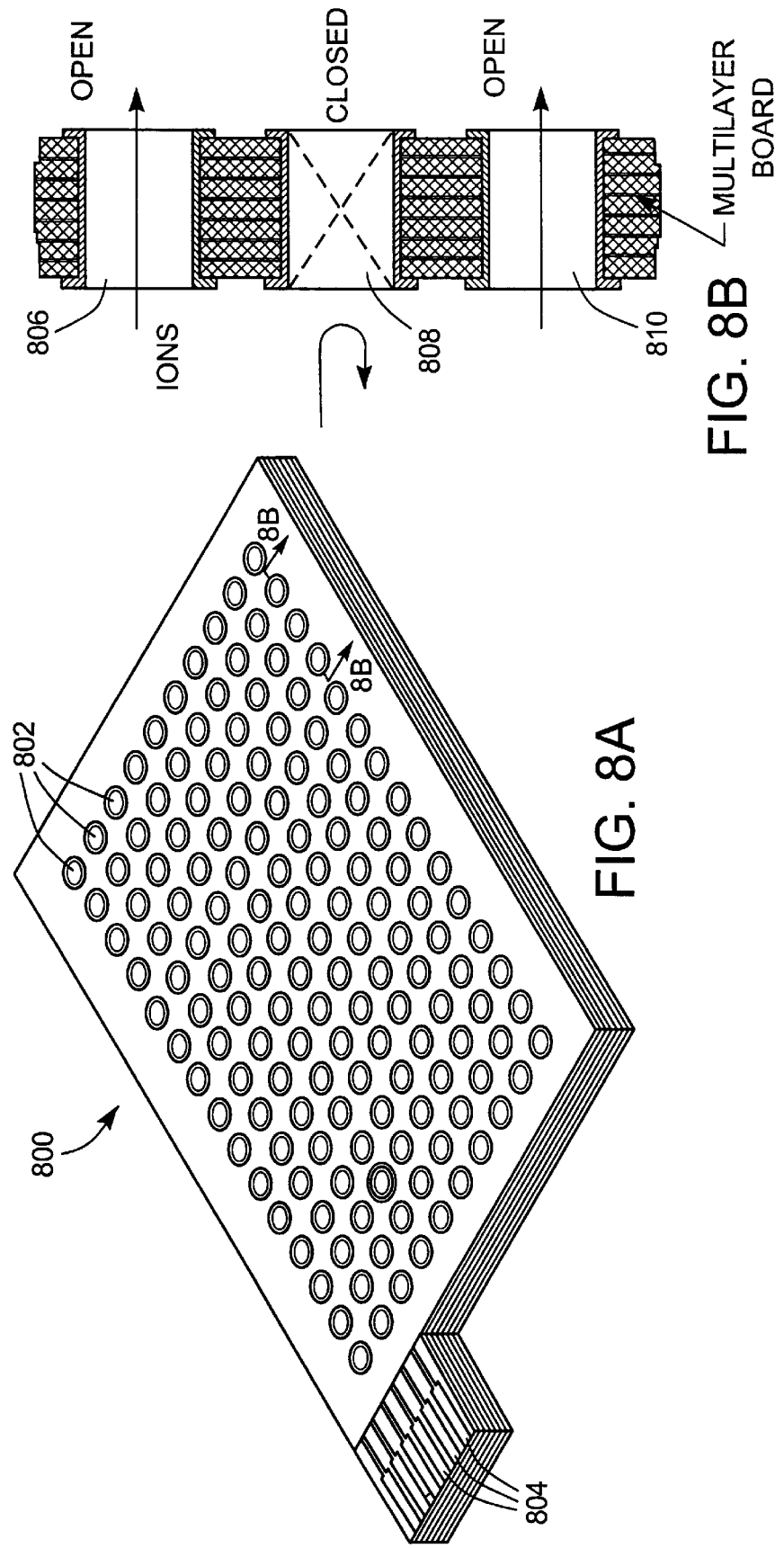
FIG. 8. shows an electrode sheet having individually accessible ion conducting channels.

Column 5, line 29, insert the following new paragraph --FIG. 8B is a cross-sectional view of FIG. 8A taken along lines 8B-8B--.

Column 5, line 36, delete "12" and insert --12A--.

Figure 12B:
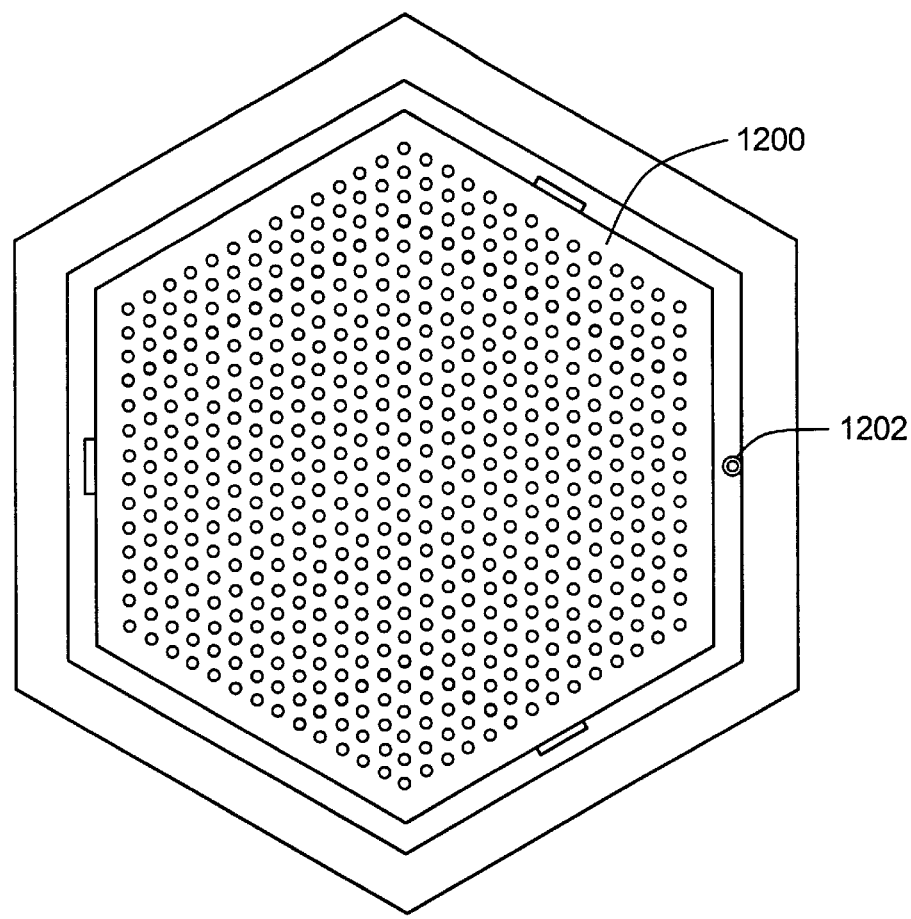
FIG. 12 shows a top and cross-sectional view of a gas manifold.
Figure 12A:
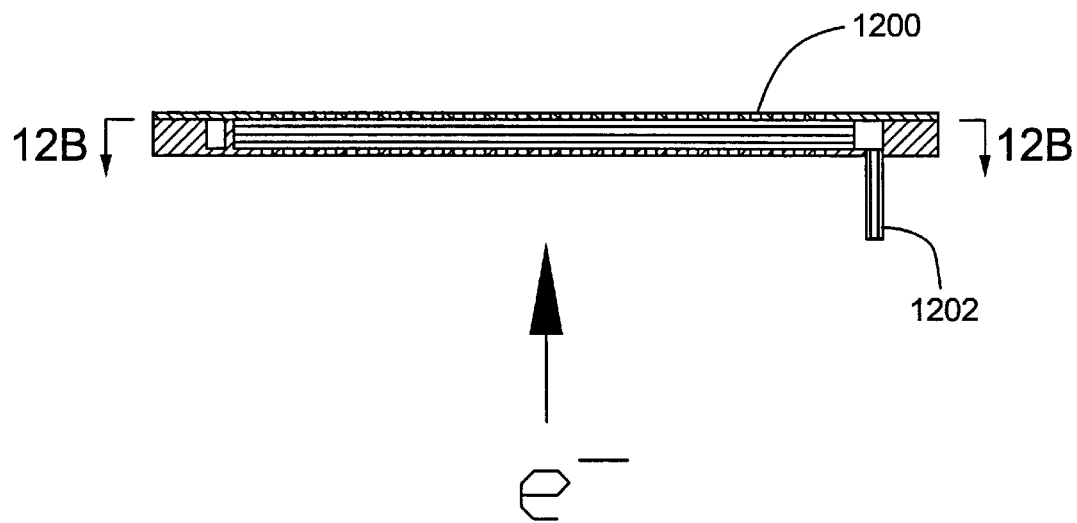

Column 5, line 38, insert the following new paragraph --FIG. 12B is a cross-sectional view of FIG. 12A taken along lines 12B-12B.

Column 5, line 65, delete 22 and insert --22A--.

Column 6, line 1, before FIG. 23, insert the following new paragraph --FIG. 22B is a cross-sectional view of FIG. 22A taken along lines 22B-22B--.

Column 6, line 8, following "an" please insert the following --exploded view of two segments of an--.

UNITED STATES PATENT AND TRADEMARK OFFICE
CERTIFICATE OF CORRECTION

PATENT NO. : 5,811,820
DATED : September 22, 1998
INVENTOR(S) : Nicholas J. Kirchner, Felix G. Gutman, Oleg V. Alexandrov and Efim Dynin It is certified that error appears in the above-indentified patent and that said Letters Patent is hereby corrected as shown below:

Column 6, line 10, insert the following new paragraph --FIG. 25C shows the two segments of the electrode sheet, shown in FIG. 25A, being superimposed.--

Column 6, line 11, delete "26" and insert --26A--.

Figure 26B:
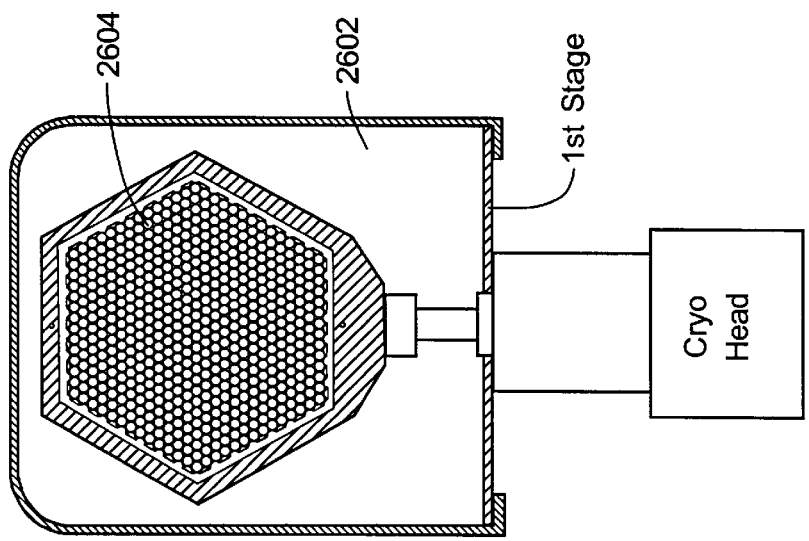
FIG. 26 shows a cryocondensation device utilized with an ion processing unit.
Figure 26A:
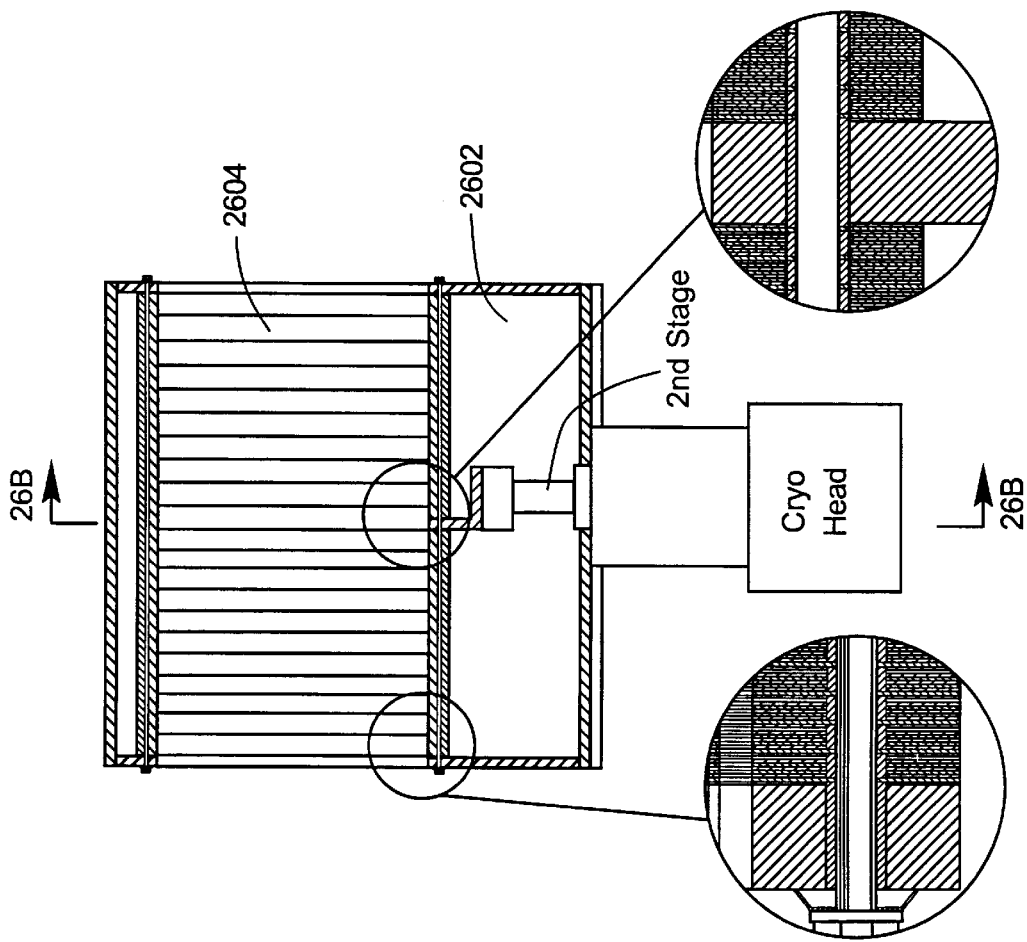

Column 6, line 12, insert the following new paragraph --FIG. 26B is a cross-sectional view of FIG. 26A taken along lines 26B-26B.

Column 21, line 42, delete "FIG. 25A shows" and insert FIGS. 25A and 25C show--.

Signed and Sealed this

Twenty-eighth Day of September, 1999

Attest:

Q. TODD DICKINSON

*Attesting Officer*  *Acting Commissioner of Patents and Trademarks*